United States Patent [19]
Shibata et al.

[11] Patent Number: 5,949,703
[45] Date of Patent: Sep. 7, 1999

[54] SEMICONDUCTOR MEMORY DEVICE IN WHICH DATA IN PROGRAMMABLE ROM CAN BE APPARENTLY REWRITTEN

[75] Inventors: Noboru Shibata, Yokohama; Hideo Kato; Taira Iwase, both of Kawasaki; Kenji Yano, Yokohama, all of Japan

[73] Assignee: Kabushiki Kaisha Toshiba, Tokyo, Japan

[21] Appl. No.: 08/996,752

[22] Filed: Dec. 23, 1997

[30] Foreign Application Priority Data

Dec. 26, 1996 [JP] Japan .................................. 8-349055
Apr. 30, 1997 [JP] Japan .................................. 9-112774

[51] Int. Cl.$^6$ ...................................................... G11C 7/00
[52] U.S. Cl. .............................. 365/103; 365/94; 365/63; 365/200
[58] Field of Search ..................... 365/103, 200, 365/52, 63, 105, 94

[56] References Cited

U.S. PATENT DOCUMENTS 4,376,300  3/1983  Tsang ........................................ 365/200
5,179,536  1/1993  Kasa et al. ............................... 365/200

FOREIGN PATENT DOCUMENTS 5151798  6/1993  Japan ............................. G11C 29/00
7320182  6/1997  Japan .

Primary Examiner—Vu A. Le
Attorney, Agent, or Firm—Loeb & Loeb LLP

[57] ABSTRACT

An address storing PROM cell array formed of a PROM having one polysilicon layer stores an address of a defective cell contained in a mask ROM used as a main memory cell array. A data storing PROM cell array formed of a PROM having one polysilicon layer stores data to be written into the defective cell. When an input address hits the address stored in the address storing PROM cell array, an address detecting circuit reads out data stored in the data storing PROM cell array instead of data of the mask ROM. When data in an address corresponding to the defective cell of the mask ROM is rewritten twice or more, a priority setting circuit permits newest data to be preferentially read out.

23 Claims, 40 Drawing Sheets

| X | Y | Z |
|---|---|---|
| /A2 | /A3 | φ1 |
| A2 | /A3 | φ2 |
| /A2 | A3 | φ3 |
| A2 | A3 | φ4 |

| X | Y | Z |
|---|---|---|
| /A4 | /A5 | R1 |
| A4 | /A5 | R2 |
| /A4 | A5 | R3 |
| A4 | A5 | R4 |

|  | $\overline{A7}$ | A7 | $\overline{A6}$ | A6 |
|---|---|---|---|---|
| WL1 | H | L | H | L |
| WL2 | H | L | L | H |
| WL3 | L | H | H | L |
| WL4 | L | H | L | H |

| WWL1 | H | L | L | L |
|------|---|---|---|---|
| WWL2 | L | H | L | L |
| WWL3 | L | L | H | L |
| WWL4 | L | L | L | H |
| A6   | L | H | L | H |
| A7   | L | L | H | H |

| WSG1 | H | L | L | L |
|------|---|---|---|---|
| WSG2 | L | H | L | L |
| WSG3 | L | L | H | L |
| WSG4 | L | L | L | H |
| A8   | L | H | L | H |
| A9   | L | L | H | H |

| WPR1 | H | L | L | L |
|------|---|---|---|---|
| WPR2 | L | H | L | L |
| WPR3 | L | L | H | L |
| WPR4 | L | L | L | H |
| A10  | L | H | L | H |
| A11  | L | L | H | H |

FIG. 21

| MODE \ PIN | A11 | A10 | A9 | A8 | A7 | A6 | A5 | A4 | A3 | A2 | A1 | A0 | BYTE H/L | D0~3 | TEST VPP |
|---|---|---|---|---|---|---|---|---|---|---|---|---|---|---|---|
| READOUT TIME | ADDRESS DESIGNATION | | | | | | | | | | | | | OUTPUT | VDD |
| R/D ADDRESS WRITING | ADDRESS DESIGNATION | | | | | | | | SPECIFY EIGHT LINES OF R/D | | | | H | HiZ | VPP H |
| R/D ADDRESS VERIFY | ADDRESS DESIGNATION | | | | | | | | | | | | H | OUTPUT | VDD |
| R/D DATA WRITING | | | | | SPECIFY FOUR LINES OF R/D | | | ADDRESS DESIGNATION | | | | | L | DATA INPUT | VPP H |
| R/D DATA VERIFY | | | | | SPECIFY FOUR LINES OF R/D | | | ADDRESS DESIGNATION | | | | | L | OUTPUT | VDD |
| OTP ADDRESS WRITING | ADDRESS DESIGNATION | | | | | | HH | | | | SPECIFY OTP | | H | HiZ | VPP |
| OTP ADDRESS VERIFY | ADDRESS DESIGNATION | | | | | | HH | | | | | | H | OUTPUT | VDD |
| OTP DATA WRITING | HH | | | | SPECIFY FOUR LINES OF OTP | | | ADDRESS DESIGNATION | | | | | L | DATA INPUT | VPP |
| OTP DATA VERIFY | HH | | | | SPECIFY FOUR LINES OF OTP | | | ADDRESS DESIGNATION | | | | | L | OUTPUT | VDD |

FIG. 30

| WWL1 | H | L | L | L |
|------|---|---|---|---|
| WWL2 | L | H | L | L |
| WWL3 | L | L | H | L |
| WWL4 | L | L | L | H |
| A6   | L | H | L | H |
| A7   | L | L | H | H |

| WSG1 | H | L | L | L |
|------|---|---|---|---|
| WSG2 | L | H | L | L |
| WSG3 | L | L | H | L |
| WSG4 | L | L | L | H |
| A8   | L | H | L | H |
| A9   | L | L | H | H |

| WPR1 | H | L | L | L |
|------|---|---|---|---|
| WPR2 | L | H | L | L |
| WPR3 | L | L | H | L |
| WPR4 | L | L | L | H |
| A10  | L | H | L | H |
| A11  | L | L | H | H |

| WX1 | H | L | L | L |
|-----|---|---|---|---|
| WX2 | L | H | L | L |
| WX3 | L | L | H | L |
| WX4 | L | L | L | H |
| A1  | L | H | L | H |
| A2  | L | L | H | H |

| WCB1 | H | L | L | L |
|------|---|---|---|---|
| WCB2 | L | H | L | L |
| WCB3 | L | L | H | L |
| WCB4 | L | L | L | H |
| A3   | L | H | L | H |
| A4   | L | L | H | H |

| MODE \ PIN | A11 | A10 | A9 | A8 | A7 | A6 | A5 | A4 | A3 | A2 | A1 | A0 | BYTE H/L | D0~3 | VPP | TEST |
|---|---|---|---|---|---|---|---|---|---|---|---|---|---|---|---|---|
| READOUT TIME | ADDRESS DESIGNATION | | | | | | | | | | | | H/L | OUTPUT | VDD | |
| ROW R/D ADDRESS WRITING | ADDRESS DESIGNATION | | | | | | H | | | SPECIFY EIGHT LINES OF R/D | | | H | HiZ | VPP | H |
| ROW R/D ADDRESS VERIFY | ADDRESS DESIGNATION | | | | | | H | | | | | | H | OUTPUT | VDD | H |
| ROW R/D DATA WRITING | | | | | SPECIFY FOUR LINES OF R/D | | ADDRESS DESIGNATION | | | | | | L | DATA INPUT | VPP | H |
| ROW R/D DATA VERIFY | | | | | SPECIFY FOUR LINES OF R/D | | ADDRESS DESIGNATION | | | | | | L | OUTPUT | VDD | H |
| BLOCK R/D ADDRESS WRITING | ADDRESS DESIGNATION | | | SPECIFY EIGHT LINES OF R/D | | | L | | ADDRESS DESIGNATION | | | | H | HiZ | VPP | H |
| BLOCK R/D ADDRESS VERIFY | ADDRESS DESIGNATION | | | | | | L | | ADDRESS DESIGNATION | | | | H | OUTPUT | VDD | H |
| BLOCK R/D DATA WRITING | | | | | SPECIFY FOUR LINES OF R/D | | ADDRESS DESIGNATION | | | | | | L | DATA INPUT | VPP | H |
| BLOCK R/D DATA VERIFY | | | | | SPECIFY FOUR LINES OF R/D | | ADDRESS DESIGNATION | | | | | | L | OUTPUT | VDD | H |
| OTP ADDRESS WRITING | | | ADDRESS DESIGNATION | | | | HH | | | | SPECIFY OTP | | H | HiZ | VPP | H |
| OTP ADDRESS VERIFY | | | ADDRESS DESIGNATION | | | | HH | | | | | | H | OUTPUT | VDD | H |
| OTP DATA WRITING | HH | | | | SPECIFY FOUR LINES OF OTP | | ADDRESS DESIGNATION | | | | | | L | DATA INPUT | VPP | H |
| OTP DATA VERIFY | HH | | | | SPECIFY FOUR LINES OF OTP | | ADDRESS DESIGNATION | | | | | | L | OUTPUT | VDD | H |

SEMICONDUCTOR MEMORY DEVICE IN WHICH DATA IN PROGRAMMABLE ROM CAN BE APPARENTLY REWRITTEN

BACKGROUND OF THE INVENTION

This invention relates to a semiconductor memory device having a mask ROM and rewritable PROM and more particularly to a semiconductor memory device in which data stored in a PROM can be apparently erased and rewritten.

In a conventional mask ROM, data is written in the process of manufacturing the mask ROM and it is impossible for the user to rewrite data after it was manufactured.

In the conventional mask ROM, if a data error due to bugs or the like in the program on the user side is found after the user bought the mask ROM, the mask ROM must be discarded.

However, the data error includes only approximately several bits in many cases, and if the error data of several bits can be corrected, it becomes possible to use the mask ROM without discarding the same.

Therefore, as is disclosed in Japanese Patent Application No. 7-320182, conventionally, it is considered to form memory cells in which the user can write data in addition to the mask ROM on a chip so as to compensate for bugs of several bits in the mask ROM.

In this case, it is sometimes necessary to rewrite data in the same address after corrected data is written into the memory cell. Therefore, it is desired that the compensation memory cell is formed of an erasable memory cell such as an EEPROM.

However, the manufacturing process of the erasable memory cell is more complicated than that of the mask ROM and the manufacturing cost is raised.

BRIEF SUMMARY OF THE INVENTION

An object of this invention is to provide a semiconductor memory device in which data of the same address can be rewritten twice or more by use of a memory cell which can be formed in the same manufacturing process as that for the mask ROM.

The above object can be attained by the following devices.

A semiconductor memory device of this invention comprises a mask ROM cell array; a first PROM cell array for storing part of an address corresponding to error data in the mask ROM cell array; a second PROM cell array for storing at least one data group (bank) corresponding to part of the address stored in the first PROM cell array; and data readout means for determining whether or not an address signal input from the exterior coincides with the address stored in the first PROM cell array and reading out at least one corresponding data group from the second PROM cell array when the coincidence between the addresses is detected; wherein at least one corresponding data group is selected and read out when two or more addresses which cause the address coincidence are stored in the first PROM cell array.

Also, a semiconductor memory device of this invention comprises a mask ROM cell array; first readout means for reading out data stored in the mask ROM cell array; a first PROM cell array for storing part of an address corresponding to error data in the mask ROM cell array; a second PROM cell array for storing part of an address corresponding to a defective cell in the mask ROM cell array; a third PROM cell array for storing at least one data group corresponding to part of the address stored in the first PROM cell array; a fourth PROM cell array for storing at least one data group corresponding to part of the address stored in the second PROM cell array; first address detecting means for determining whether or not an address signal input from the exterior coincides with the address stored in the first PROM cell array; second address detecting means for determining whether or not an address signal input from the exterior coincides with the address stored in the second PROM cell array; selecting means for outputting a signal used for selecting the fourth PROM cell array according to a detected address when the second address detecting means has detected an address corresponding to the fourth PROM cell array; priority setting means for outputting a signal used for selecting the third PROM cell array according to a detected address and setting the selecting means into a non-selection state when the first address detecting means has detected an address corresponding to the third PROM cell array; and second data readout means for reading out at least one corresponding data group from the third PROM cell array.

According to this invention, since new data is written into a new PROM cell when data in the same address of the mask ROM is rewritten twice or more and it becomes impossible to read out data from a PROM cell which holds previous data, it becomes possible to apparently erase and rewrite data and simulatively operate the mask ROM in the same manner as in the case of an EEPROM.

Further, since the PROM cell is a single-layer PROM having one polysilicon layer, it can be manufactured in the same manufacturing process as that for the mask ROM and the manufacturing cost will not substantially be raised.

Since an automatic bank specifying circuit automatically sets the priority level of the bank of data higher as the data is written at a later timing, it is not necessary for the user to remember the banks used, thereby making it more convenience to the user.

Further, since the PROM cell array for redundancy is provided, a defective cell occurring in the manufacturing process can be compensated for by use of the cell array.

When the address of the compensated defective cell coincides with an address which the user writes, higher priority is assigned to a cell in which the user writes data at a later timing. Thus, an advantage that higher priority can be assigned to data of the user can be obtained.

Further, according to this invention, since a defective cell occurring in the manufacturing process can be compensated for and data can be rewritten by the user, the bug of a user program can be corrected. Therefore, the manufacturing yield of the semiconductor memory device can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 21 is a diagram for illustrating the operation of the circuit of FIG. 20;

FIG. 30 is a diagram showing the relation between various pins and various operation modes;

FIG. 47 is a diagram for illustrating the operation of OTP, R/D pre-decoder of FIG. 39; and FIG. 48 is a diagram showing the relation between various pins and various operation modes.

DETAILED DESCRIPTION OF THE INVENTION

There will now be described embodiments of this invention with reference to the accompanying drawings.

Figure 2:
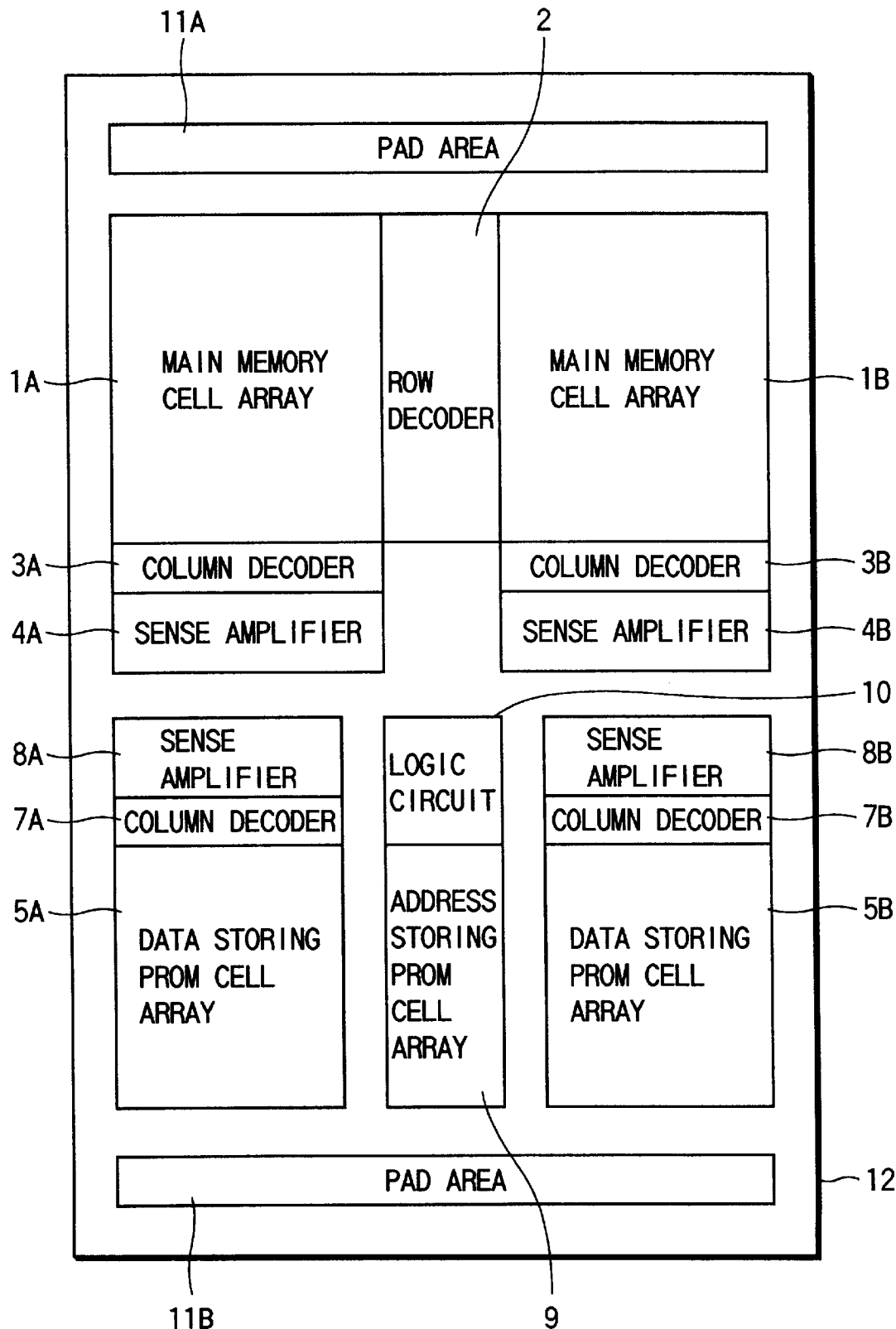
FIG. 2 is a plan view showing the floor plan of the first embodiment of this invention.

FIG. 2 shows the layout of a first embodiment of this invention. In the following description, the same constituents are denoted by the same reference numerals and the repetitive explanation therefor is omitted.

As shown in FIG. 2, main memory cell arrays 1A, 1B formed of mask ROMs are formed on a semiconductor chip 12. A row decoder 2 is disposed between the main memory cell arrays 1A and 1B and commonly used by the two main memory cell arrays. Column decoders 3A, 3B are arranged adjacent to the main memory cell arrays 1A, 1B, respectively. Main sense amplifiers 4A, 4B are arranged adjacent to the column decoders 3A, 3B, respectively.

Further, data storing PROM cell arrays 5A, 5B constructed by PROMs capable of electrically rewriting data are formed on the semiconductor chip 12. Column decoders 7A, 7B are arranged adjacent to the PROM cell arrays 5A, 5B, respectively. Sense amplifiers 8A, 8B are connected to the column decoders 7A, 7B, respectively. Data is written into the PROM cell arrays 5A, 5B by the user.

An address storing PROM cell array 9 is disposed between the PROM cell arrays 5A and 5B. A logic circuit 10 is disposed adjacent to the PROM cell array 9.

Further, pad areas 11A, 11B in which a plurality of pads (not shown) are formed are arranged on two opposite end portions of the semiconductor chip 12.

Figure 3:
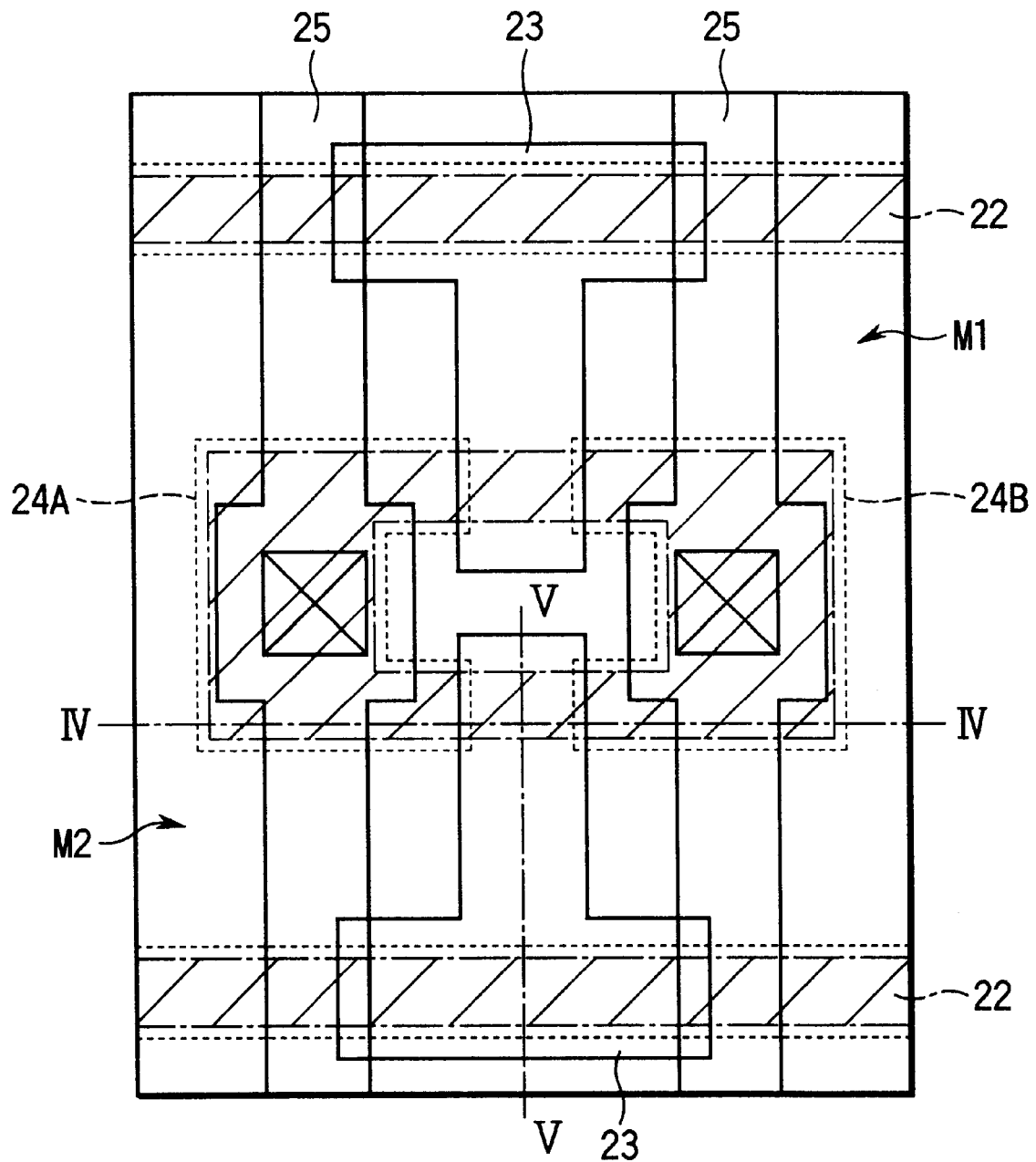
FIG. 3 is a plan view showing a single-layer PROM of this invention.
Figure 4:
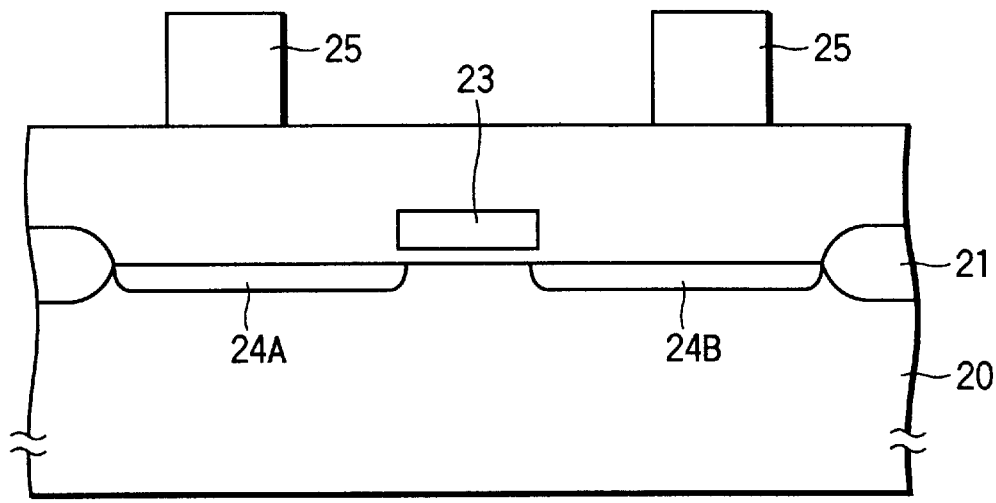
FIG. 4 is a cross sectional view taken along the IV—IV line of FIG. 3.
Figure 5:
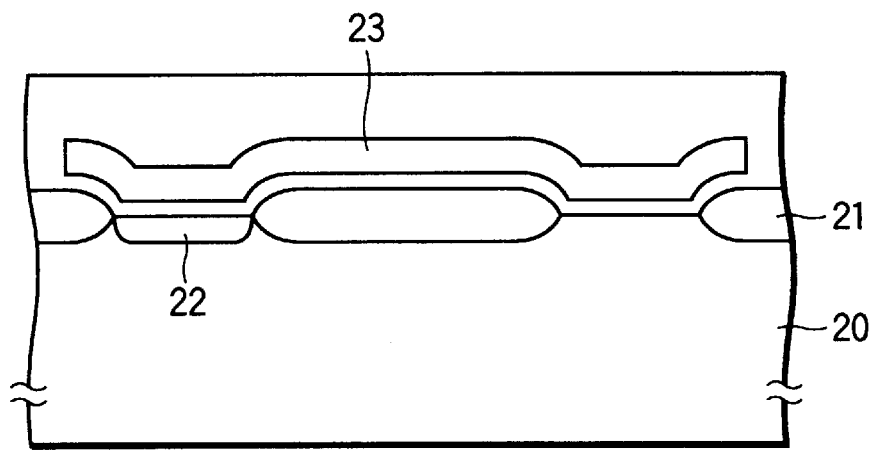
FIG. 5 is a cross sectional view taken along the V—V line of FIG. 3.
Figure 6:
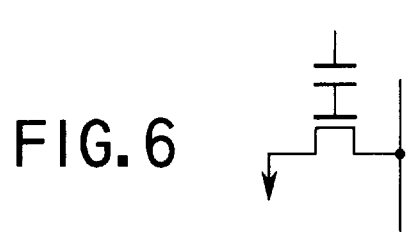
FIG. 6 is a diagram showing the equivalent circuit of the single-layer PROM of FIG. 3.

FIG. 3 is a plan view showing a PROM (which is hereinafter referred to as a single-layer PROM) having one polysilicon layer used in the first embodiment shown in FIG. 2. FIG. 4 is a cross sectional view taken along the IV—IV line of FIG. 3, and FIG. 5 is a cross sectional view taken along the V—V line of FIG. 3. FIG. 6 shows the equivalent circuit of the single-layer PROM.

In FIG. 3, hatched portions are generally called SDG (source, drain, gate) regions and source/drain regions and gate electrode are formed in the above regions.

A field oxide film 21 is formed on a semiconductor substrate 20. Word lines (control gates) 22 are formed in the semiconductor substrate 20. The word line is formed of a diffusion layer.

A plurality of floating gates 23 are arranged above the word lines 22. The floating gate 23 is formed of WSi, for example.

The channel region of a transistor is formed in part of the semiconductor substrate 20 which lies directly under part of the floating gate 23. Source/drain regions 24A and 24B are formed in the semiconductor substrate 20 on both sides of the channel region. The source/drain regions 24A, 24B are formed of diffusion layers.

The source/drain regions 24A, 24B are connected to bit lines 25.

Two adjacent single-layer PROMs M1, M2 commonly use the source/drain regions 24A, 24B.

When the single-layer PROM is attached to a mask ROM, the word lines and source/drain regions of the single-layer PROM can be formed at the same time as the source/drain regions of the mask ROM are formed and the floating gates of the single-layer PROM and the gates of the mask ROM can be formed at the same time. Therefore, the number of manufacturing steps is not increased and the manufacturing cost is not raised.

Next, the operation of writing data into the single-layer PROM cell is explained.

First, a high potential VPP is supplied to the control gate of a cell into which data is to be written. Since the high potential is applied to the control gate, the potential of the floating gate of the cell is also raised.

Then, the source of the cell is grounded and a high potential VPP is applied to the drain. As a result, hot electrons are generated between the source and drain of the cell and electrons are injected into the floating gate. Therefore, the threshold voltage of the transistor is raised.

If the high potential VPP is not applied to the drain, hot electrons are not generated. Therefore, in this case, no electrons are injected into the floating gate and the threshold voltage of the transistor is unchanged.

Next, the operation for reading out data from the PROM cell is explained.

First, a normal power source potential VDD is supplied to the control gate of a cell from which data is to be read out and a voltage of, for example, 1V is applied to the source of the cell. Since the threshold voltage of the transistor is high in a case where electrons are injected in the floating gate of the cell, no current flows between the source and drain of the cell. On the other hand, since the threshold voltage of the transistor is low in a case where no electrons are injected in the floating gate of the cell, a current flows between the source and drain of the cell. Thus, data stored in the cell can be detected by checking whether the current flows or not.

Figure 1:
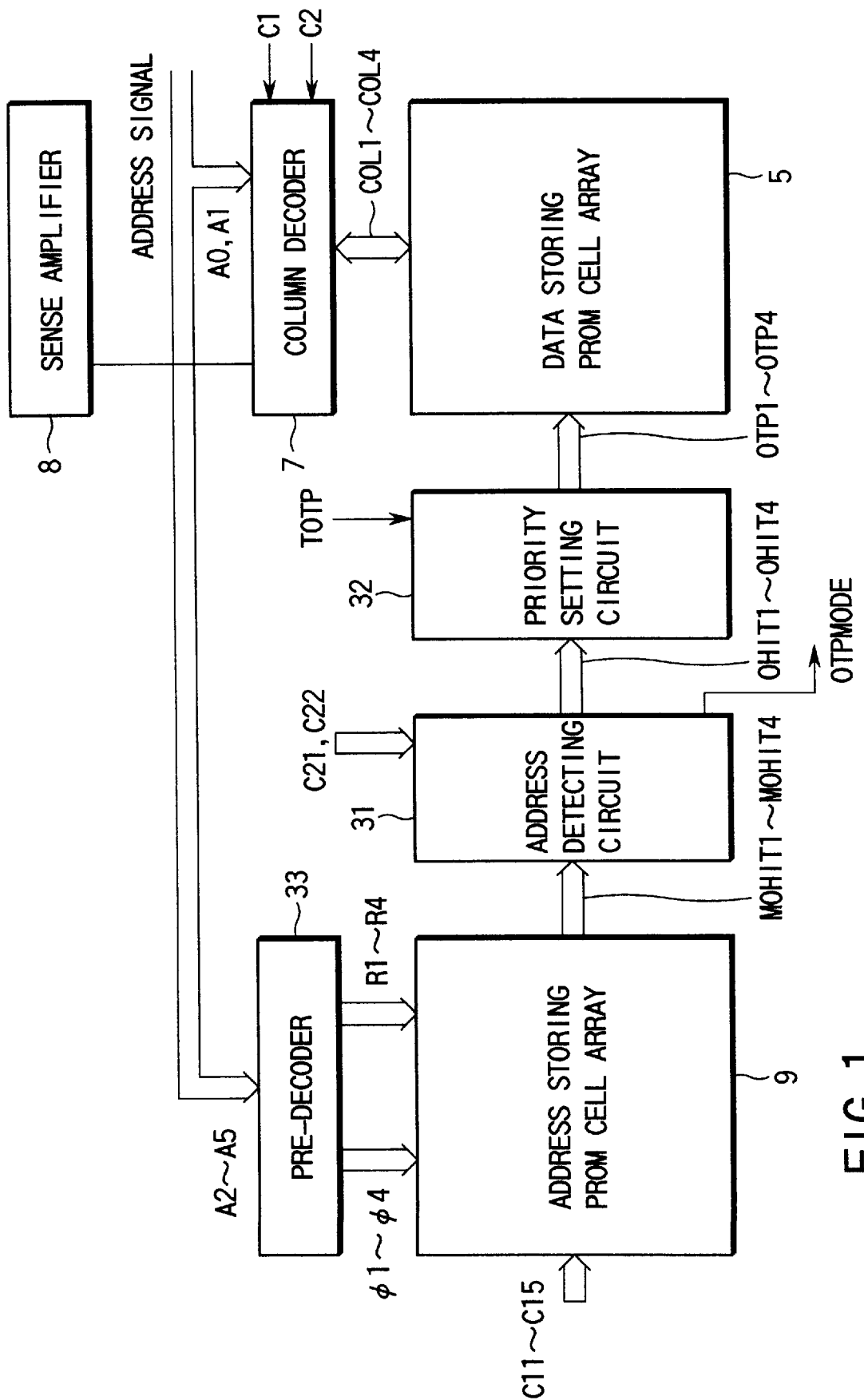
FIG. 1 is a construction diagram showing part of a first embodiment of this invention.

FIG. 1 is a block diagram showing the first embodiment of this invention. The block diagram more concretely shows the data storing PROM cell array 5, address storing PROM cell array 9, column decoder 7, sense amplifier 8 and logic circuit 10 in the floor plan of the semiconductor memory device shown in FIG. 2. An address detecting circuit 31, priority setting circuit 32 and pre-decoder 33 shown in FIG. 1 are provided in the logic circuit 10 in the floor plan shown in FIG. 2.

An address signal supplied from the exterior via a pad is supplied to the column decoder 7, pre-decoder 33, and the row decoder 2 and column decoders 3A, 3B for the main memory cell array shown in FIG. 2.

The pre-decoder 33 creates signals $\phi 1$ to $\phi 4$ and R1 to R4 according to an input address signal and supplies the signals to the address storing PROM cell array 9.

The address storing PROM cell array 9 stores at least part of an address of error data in the main memory cell array.

The address detecting circuit 31 checks whether or not the input address signal coincides with the address stored in the address storing PROM cell array 9 and outputs signals OHIT1 to OHIT4 and signal OTPMODE (OTP: One Time Program). For example, an output circuit (not shown) of the semiconductor memory device outputs data stored in the main memory cell array or data stored in the data storing PROM cell array 5 according to the signal OTPMODE.

The priority setting circuit 32 selects one signal of the highest priority from the signals OHIT1 to OHIT4 and supplies signals OTP1 to OTP4 to the data storing PROM cell array 5.

The data storing PROM cell array 5 stores data obtained by correcting error data present in the main memory cell array.

The column decoder 7 selects one of column lines of the data storing PROM cell array according to an address signal, reads out data and outputs the readout data to the sense amplifier 8.

The sense amplifier 8 outputs the readout data to the exterior via an output circuit (not shown).

Figure 7:
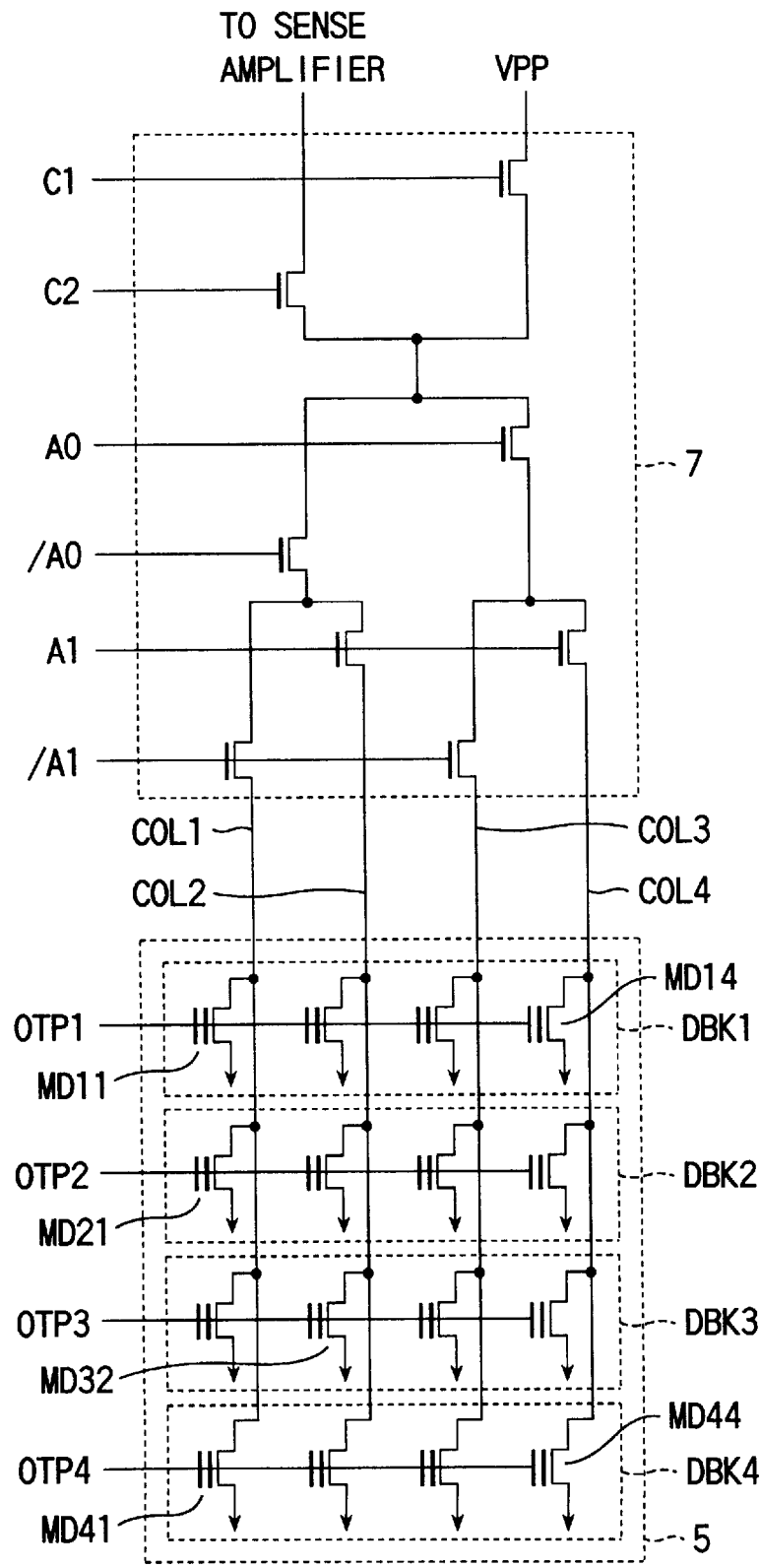
FIG. 7 is a circuit diagram showing a data storing PROM cell array and column decoder shown in FIG. 1.

FIG. 7 shows an example of the circuit construction of the data storing PROM cell array 5 and column decoder 7 used in the embodiment shown in FIG. 1.

In this embodiment, two bits A0, A1 of the address signal are treated as one unit and data of the main memory cell array is replaced for each unit.

The address signals A0, A1, control signals C1, C2 are supplied to the respective input terminals of the column decoder 7. Four output terminals of the column decoder are connected to column lines COL1 to COL4 of the data storing PROM cell array 5. Further, the column decoder has a terminal supplied with a high potential VPP and a terminal connected to the input terminal of the sense amplifier.

The column decoder 7 selects one of the column lines COL1 to COL4 according to the address signals A0, A1, connects the selected column line to the terminal applied with the high potential VPP at the time of data writing, and connects the selected column line to the input terminal of the sense amplifier at the time of data readout.

The data storing PROM cell array 5 has four banks DBK1 to DBK4 each formed of, for example, four single-layer PROM cells. In each of the banks, the drains of first to fourth single-layer PROMs are connected to the respective column lines COL1 to COL4 and the sources thereof are grounded. For example, the bank DBK1 is formed of single-layer PROM cells MD11 to MD14 and the drains of the PROM cells MD11 to MD14 are connected to the respective column lines COL1 to COL4. Further, the control gates of the single-layer PROM cells of the same bank are commonly connected to the same word line. The common word lines of the respective banks DBK1 to DBK4 are respectively supplied with signals OTP1 to OTP4.

Figures 8A, 8B, 9:
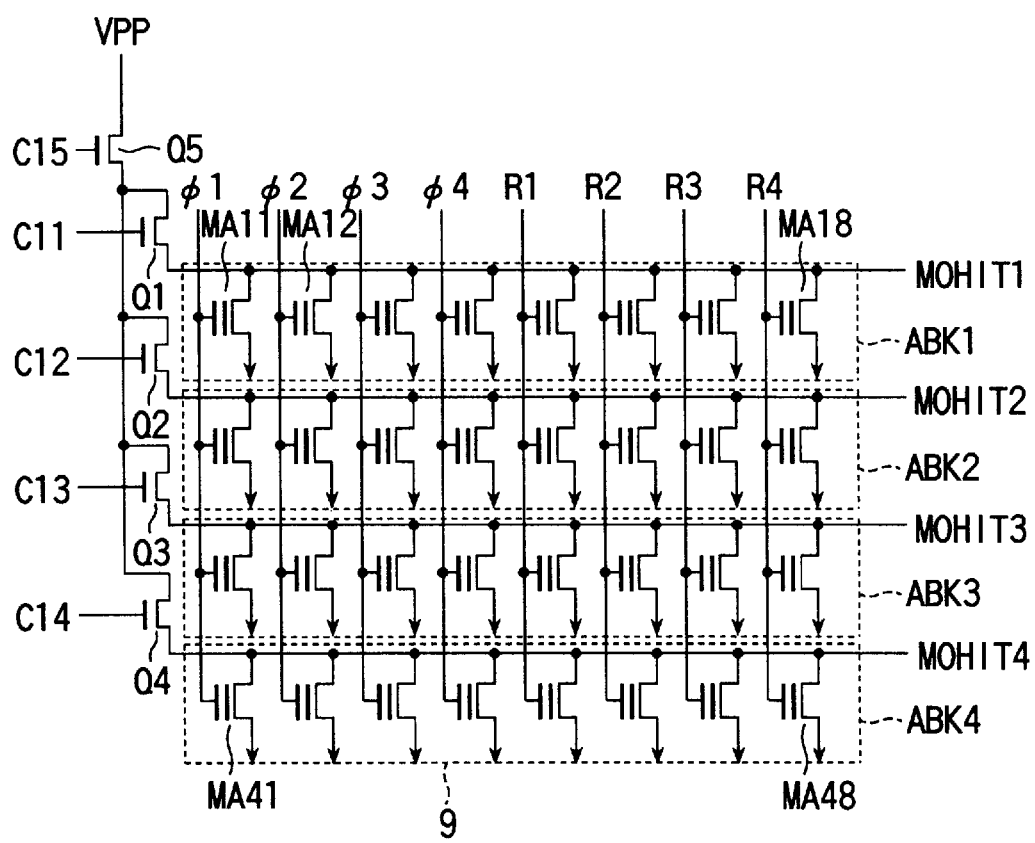
FIGS. 8A and 8B are diagrams for illustrating the operation of a pre-decoder shown in FIG. 1.
FIG. 9 is a circuit diagram showing an address storing PROM cell array shown in FIG. 1.

FIGS. 8A and 8B are diagrams for illustrating the operation of the pre-decoder 33 used in the embodiment shown in FIG. 1.

For example, bits A2, A3, A4, A5 of the address signal are supplied to the respective input terminals of the pre-decoder 33. The pre-decoder 33 outputs eight bit signals $\phi1$ to $\phi4$ and R1 to R4 according to the address signals A2 to A5.

FIGS. 8A and 8B show the relation between the signals $\phi1$ to $\phi4$ and R1 to R4 and the signals A2 to A5. A signal Z is the logical OR of signals X and Y. For example, the signal $\phi1$ is the logical OR of /A2 and /A3. In this case, / indicates an inverted signal.

As is clearly understood from FIGS. 8A, 8B, only one of the output signals $\phi1$ to $\phi4$ of the pre-decoder 33 is always set at the high level and the other signals among them are set at the low level, and only one of the output signals R1 to R4 is always set at the high level and the other signals among them are set at the low level. For example, when the signals A2 to A5 are all set at the low level, the signals $\phi1$ and R1 are set to the high level and the signals $\phi2$ to $\phi4$ and R2 to R4 are set to the low level.

The logic of the operation of the pre-decoder is not limited to the logic shown in FIGS. 8A, 8B.

FIG. 9 shows an example of the circuit construction of the address storing PROM cell array 9 used in the embodiment shown in FIG. 1.

The address storing PROM cell array 9 is formed of banks of a number equal to the number of banks of the data storing PROM cell array 5. Each of the banks is formed of single-layer PROM cells of a number equal to the number of output signals of the pre-decoder 33. If the address storing PROM cell array 9 is used in the above example, the address storing PROM cell array 9 is constructed to have four banks ABK1 to ABK4 each formed of eight single-layer PROM cells.

In each of the banks, the control gates of the eight single-layer PROM cells are respectively supplied with the signals $\phi1$ to $\phi4$ and R1 to R4 and the sources thereof are grounded.

For example, the bank ABK1 is formed of eight single-layer PROM cells MA11 to MA18 and the control gates of the single-layer PROM cells MA11 to MA18 are respectively supplied with the signals $\phi1$ to $\phi4$ and R1 to R4. Further, the drains of the eight single-layer PROM cells of each bank are connected to a common drain line. The commonly connected drain lines of the banks ABK1 to ABK4 are respectively referred to as MOHIT1 to MOHIT4.

The commonly connected drain lines MOHIT1 to MOHIT4 are respectively connected to the sources of transistors Q1 to Q4. The gates of the transistors Q1 to Q4 are respectively supplied with control signals C11 to C14. The drains of the transistors Q1 to Q4 are connected to the source of a transistor Q5. The drain of the transistor Q5 is applied with the high potential VPP at the time of address writing and the gate of the transistor Q5 is supplied with a control signal C15.

Further, n is used as a natural number ranging from "1" to "4", and the bank DBKn of the data storing PROM cell array 5 and the bank ABKn of the address storing PROM cell array 9 are referred to as a bank n.

Figure 10:
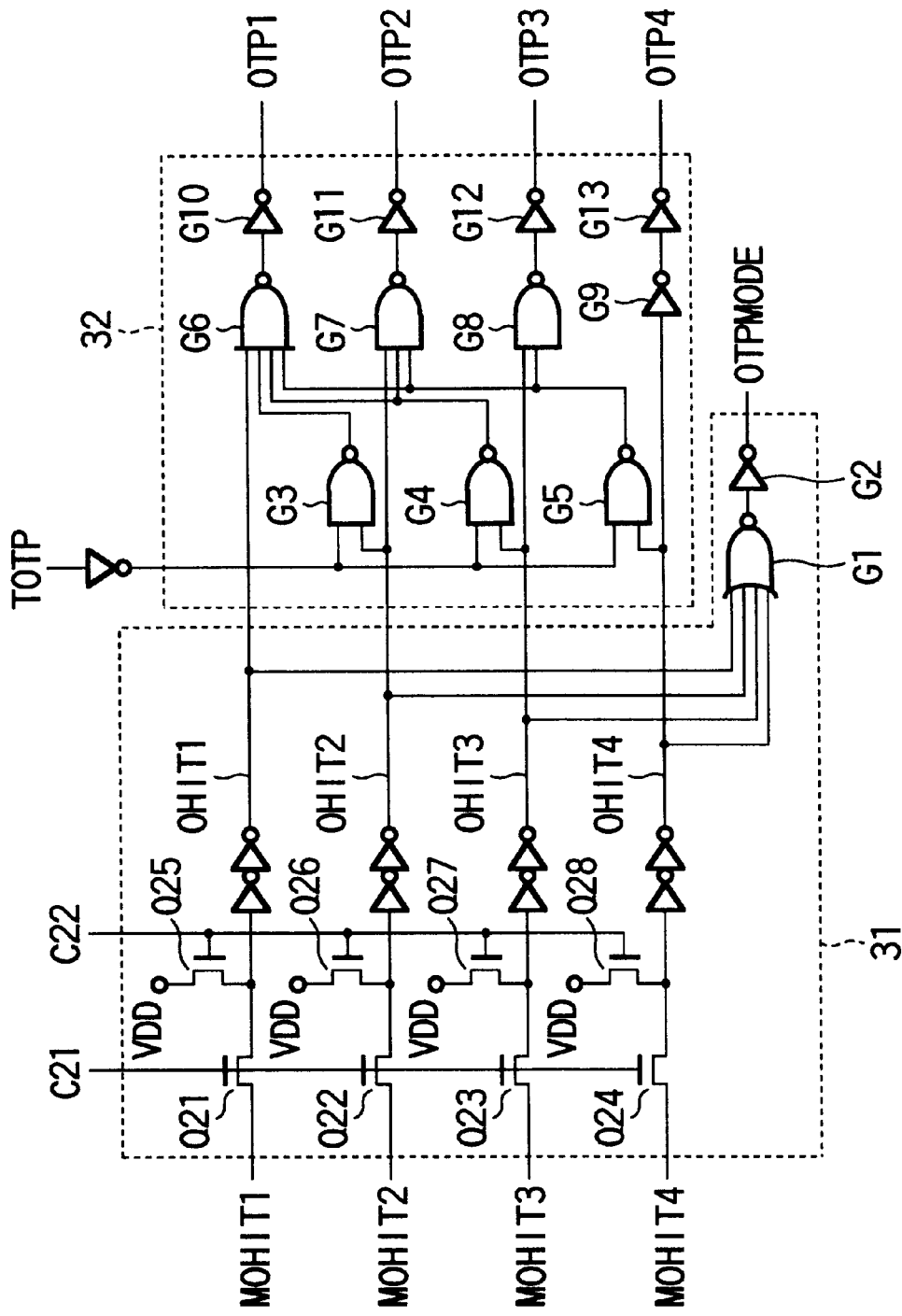
FIG. 10 is a circuit diagram showing an address detecting circuit and priority setting circuit shown in FIG. 1.

FIG. 10 shows an example of the circuit construction of the address detecting circuit 31 and priority setting circuit 32 used in the embodiment shown in FIG. 1.

In the address detecting circuit 31, the current paths of transistors Q21 to Q24 are respectively connected at one end to the common drain lines MOHIT1 to MOHIT4 of the address storing PROM cell array shown in FIG. 9. The gates of the transistors Q21 to Q24 are supplied with a control signal C21. The other ends of the current paths of the transistors Q21 to Q24 are respectively connected to the sources of transistors Q25 to Q28. The drains of the transistors Q25 to Q28 are applied with the power source potential VDD and the gates thereof are supplied with a control signal C22. Generally, the control signals C21, C22 are set at the intermediate potential.

Further, the other ends of the current paths of the transistors Q21 to Q24 are respectively connected to the input terminals of 2-stage inverters and output signals of the 2-stage inverters are obtained as the signals OHIT1 to OHIT4.

The signals OHIT1 to OHIT4 are supplied to first to fourth input terminals of a NOR gate G1. The output terminal of the NOR gate G1 is connected to the input terminal of an inverter G2. A signal OTPMODE is generated from the output terminal of the inverter G2. The signal OTPMODE indicates that the address signal coincides with an address stored in the address storing PROM cell array or not. Data stored in the main memory cell array or data stored in the data storing PROM cell array 5 is output from the semiconductor device according to the signal OTPMODE.

The priority setting circuit 32 includes NAND gates G3 to G8 and inverters G9 to G13. The inverters G10 to G13 include level shifters, for example, and output the high potential VPP at the time of writing data into the data storing PROM cell array 5.

As shown in FIG. 10, the first input terminals of the NAND gates G3 to G5 are respectively supplied with the signals OHIT2 to OHIT4 and the second input terminals thereof are supplied with a signal obtained by inverting a signal TOTP by use of an inverter.

The first input terminal of the NAND gate G6 is supplied with the signal OHIT1 and the second to fourth input terminals thereof are respectively connected to the output terminals of the NAND gates G3 to G5.

The first input terminal of the NAND gate G7 is supplied with the signal OHIT2 and the second and third input terminals thereof are respectively connected to the output terminals of the NAND gates G4, G5.

The first input terminal of the NAND gate G8 is supplied with the signal OHIT3 and the second input terminal thereof is connected to the output terminal of the NAND gate G5.

The input terminal of the inverter G9 is supplied with the signal OHIT4. The input terminals of the inverters G10 to G12 are respectively connected to the output terminals of the NAND gates G6 to G8, and the input terminal of the inverter G13 is connected to the output terminal of the inverter G9.

The signals OTP1 to OTP4 are output from the output terminals of the inverters G10 to G13. As described before, the signals OTP1 to OTP4 are supplied to the respective word lines of the banks DBK1 to DBK4 of the data storing PROM cell array 5.

The priority levels are set for the banks DBK1 to DBK4 by use of the priority setting circuit. In the above priority setting circuit, the bank having a larger number is given higher priority. For example, when the banks DBK1 and DBK2 are considered, the bank DBK2 has priority over the bank DBK1.

For example, a PROM writer is used to write data into the address storing PROM cell array 9 and data storing PROM cell array 5. The PROM writer supplies address signal bits A5 to A0, control signals C1, C2, C11 to C15, C21, C22, TOTP, high potential VPP and power source potential VDD, for example.

Next, the writing operation and readout operation in this embodiment are explained with reference to FIGS. 11, 12. For brevity, in FIGS. 11, 12, part of the circuit is omitted.

The replacement operation effected by the user when data stored in an address "010010", for example, of the main memory cell array is erroneous data is explained. In this embodiment, since data is replaced while treating two bits A0, A1 of the address signal as one unit, it is necessary to replace data items in the address "010000" to the address "010011" of the mask ROM. For example, data items in the address "010000" to the address "010011" are replaced by 1, 0, 1, 0. Assume now that data in another address is already written in the banks 1 of the address storing PROM cell array 9 and data storing PROM cell array 5.

The writing operation includes an address writing process, address verifying process, data writing process and data verifying process.

First, the address writing process is explained. Bits A5 to A2 of an address in which error data is written are written into the bank ABK2 of the address storing PROM cell array 9, for example.

That is, an address signal is input to the address pad from the exterior. The address signal of "A5 to A2" is "0100", and the bit A4 is set at the high level and the other bits A5, A3, A2 are set to the low level.

The pre-decoder 33 generates φ1 to φ4, R1 to R4 based on the bits A5 to A2 according to the logic shown in FIGS. 8A, 8B. Therefore, the signals φ1 and R2 are set to the high level and the signals φ2 to φ4, R1, R3, R4 are set to the low level. The high level signal is the high potential VPP.

Further, the high potential VPP is applied to the drains of one of the address storing banks ABK1 to ABK4. For example, the control signals C12, C15 are set to the high level and the control signals C11, C13, C14 are set to the low level so as to supply the high potential VPP only to the drains of the bank ABK2. At this time, the transistors Q21 to Q24 of the address detecting circuit 31 are set in the nonconductive state.

Figure 11:
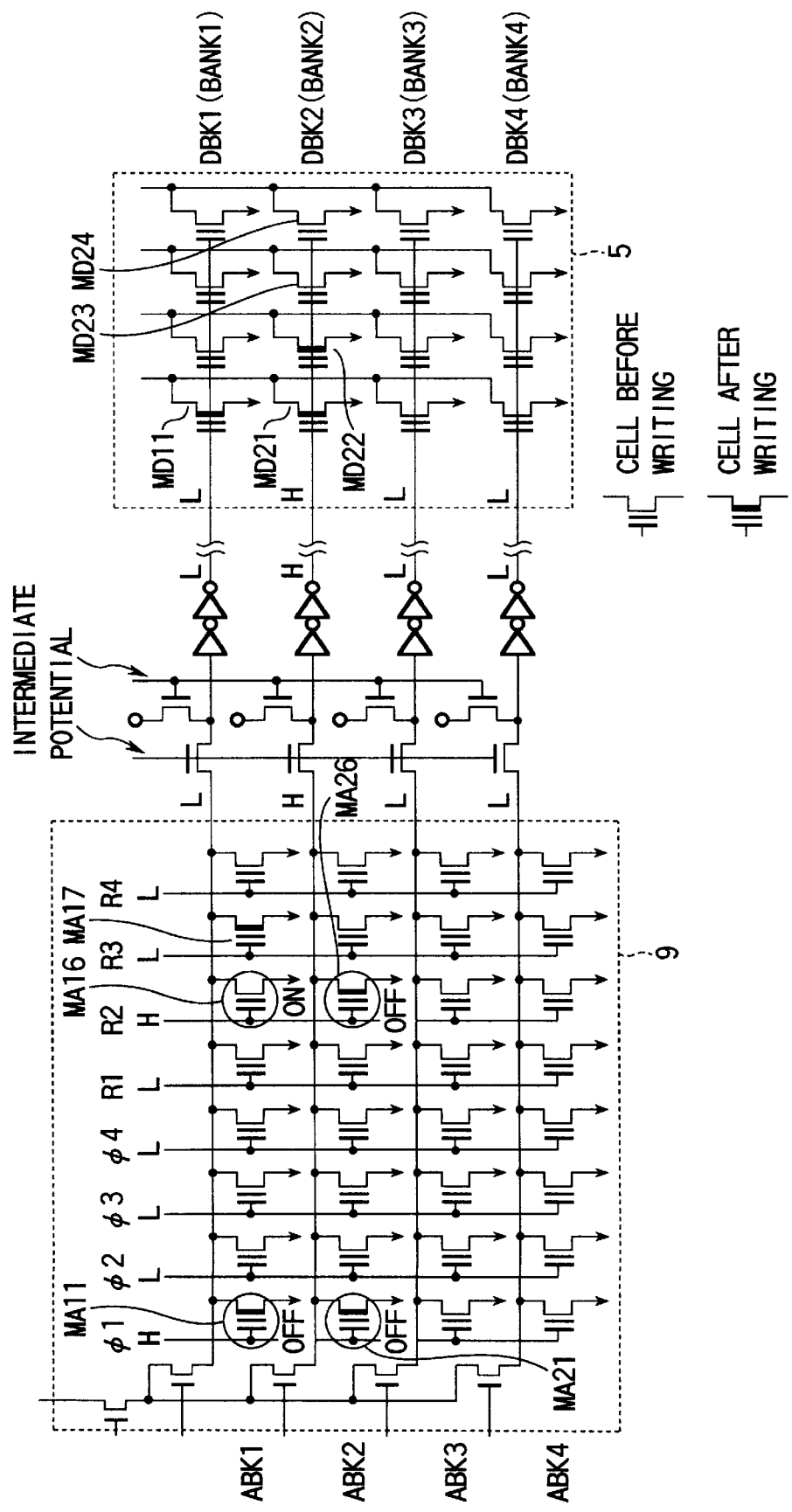
FIG. 11 is a diagram for illustrating the operation of the first embodiment of this invention.
Figure 12:
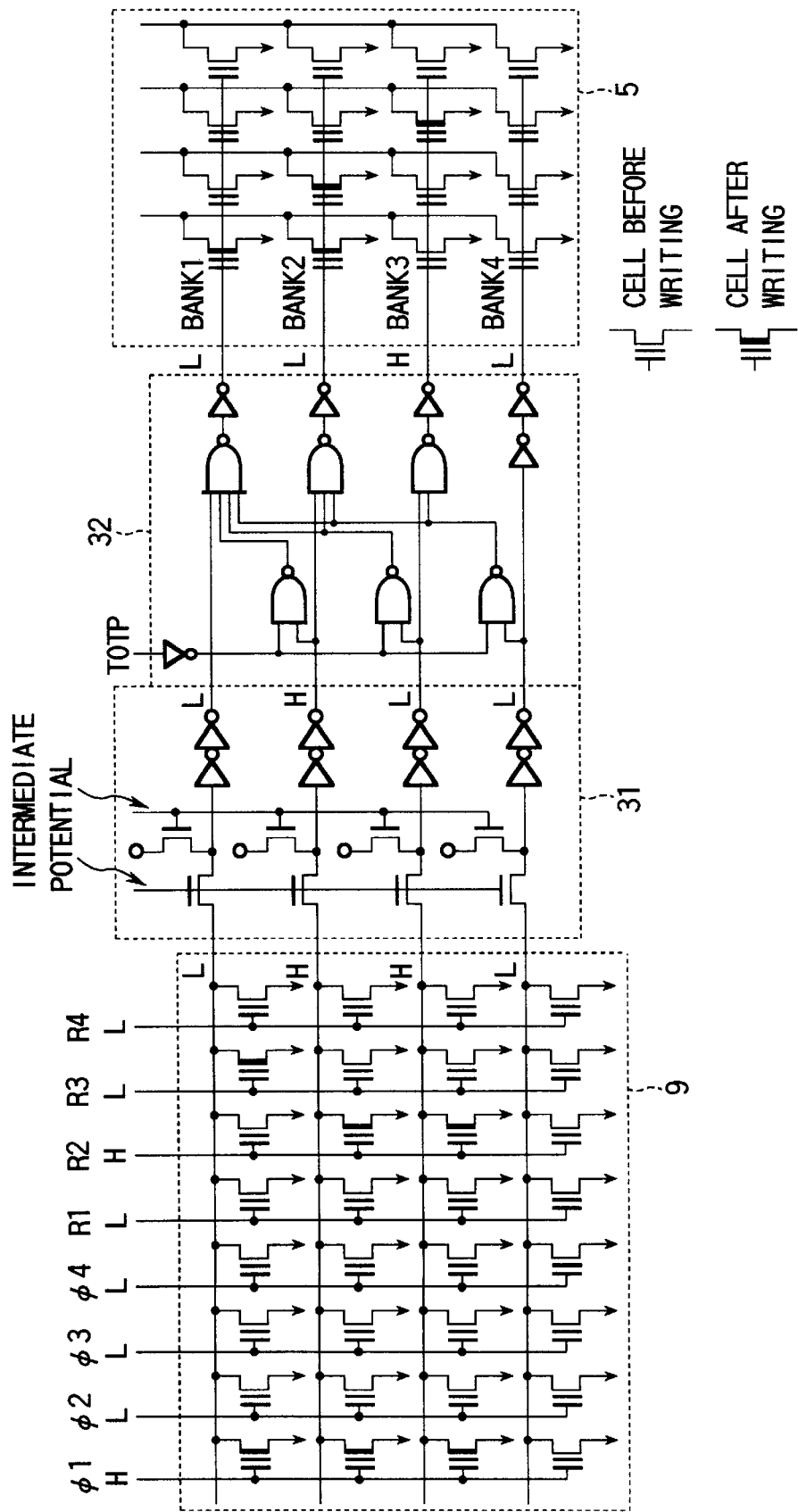
FIG. 12 is a diagram for illustrating the operation of the first embodiment of this invention.

As a result, electrons are injected into the floating gates of the cells MA21, MA26 among the PROM cells of the bank ABK2 as shown in FIG. 11.

The control signals C11 to C15 are determined by external signals supplied from a ROM writer, for example. Therefore, the bank into which data is written is determined by the user.

Next, the address verifying operation is explained. Whether an address has been written into the bank ABK2 or not is checked.

First, an address signal corresponding to the address written into the bank ABK2 is supplied from the exterior to the address pad. The pre-decoder 33 sets the signals φ1 and R2 to the high level, sets the signals φ2 to φ4, R1, R3, R4 to the low level and outputs the above signals.

At this time, the transistors Q1 to Q5 of the address storing PROM cell array 9 are made nonconductive. Further, an intermediate potential is applied to the gates of the transistors Q21 to Q28 of the address detecting circuit 31 to render the transistors conductive. In order to prevent data from being written into the address storing PROM cell array, a potential applied to the transistors Q25 to Q28 of the address detecting circuit is set lower than the high potential VPP.

In the address storing bank ABK2, the threshold voltages of the memory cells MA21, MA26 are high and the threshold voltages of the other memory cells are low. Therefore, each of the memory cells is set in the OFF state. As a result, the potential of the common drain line MOHIT2 of the bank ABK2 is set to the high level and the signal OHIT2 is set to the high level (H).

On the other hand, in the address storing bank ABK1, the threshold voltages of the memory cells MA11, MA17 are high and the threshold voltages of the other memory cells are low. Since a high level signal R2 is supplied to the control gate of the memory cell MA16, the memory cell MA16 is turned ON. As a result, the potential of the common drain line MOHIT1 of the bank ABK1 is set to the low level and the signal OHIT1 is set to the low level (L).

As in the case of bank ABK1, in the banks ABK3, ABK4, the signals OHIT3, OHIT4 are set to the low level (L).

The signal TOTP shown in FIG. 10 is previously set at the high level. Therefore, the signals OTP2 is set at the high level and the signals OTP1, OTP3, OTP4 are set at the low level in the priority setting circuit 32.

Thus, whether or not the address is correctly written into the bank ABK2, that is, whether or not the redundancy mode is set can be determined by checking whether the signal OTP2 is set at the high level or not.

Next, data is written into the bank DBK2 of the data storing PROM cell array 5.

At this time, the pre-decoder 33, address storing PROM cell array 9 and address detecting circuit 31 are operated in the same manner as in the case of address verifying operation described above.

First, the signal TOTP supplied to the priority setting circuit 32 is set to the low level.

Since the signal OHIT2 is set to the high level and the signals OHIT1, OHIT3, OHIT4 are set to the low level by the address detecting circuit 31, the signal OTP2 is set to the high level which is the high potential VPP and the signals OTP1, OTP3, OTP4 are set to the low level by the level shifters G10 to G13.

Further, address signal bits A0, A1 are adequately supplied from the exterior via the address pad shown in FIG. 7, and one of the column lines COL1 to COL4 is selected if it is necessary to write data. Then, the control signals C1 and C2 are respectively set to the high level and low level to supply the high potential VPP to the selected column line and permit the data writing operation.

As a result, as shown in FIG. 11, data corresponding to the addresses "010000" to "010011" is written into the bank DBK2 of the data storing PROM cell array 5. In this case, the memory cells MD21, MD22, MD23, MD24 shown in FIG. 11 respectively correspond to the addresses "010000", "010010", "010001", "010011".

Next, the data verifying operation is explained.

At this time, the pre-decoder 33, address storing PROM cell array 9 and address detecting circuit 31 are operated in the same manner as in the case of data writing operation described above.

In the priority setting circuit 32 shown in FIG. 10, the signal TOTP is set to the low level. Further, the level shifters G10 to G13 are caused to output an intermediate potential. As a result, the signal OTP2 is set to the intermediate potential and the signals OTP1, OTP3, OTP4 are set to the low level.

Further, the address signals A1, A0 shown in FIG. 7 are supplied so as to connect one of the column lines COL1 to COL4 to the sense amplifier 8.

As a result, data written into the bank DBK2 of the data storing PROM cell array 5 is read out to the sense amplifier.

Next, the operation for rewriting data which has been written in the bank is explained.

For example, as shown in FIG. 11, assume that data in the address "100000" to the address "100011" is written in the bank ABK1, data in the address "010000" to the address "010011" is written in the bank ABK2, and data stored in the bank ABK2 is rewritten.

First, as described above, the same data as that in the bank ABK2 is written into the bank ABK3 of the address storing PROM cell array 9.

Then, as described before, the address verifying operation is effected. The output signals OHIT2, OHIT3 of the address detecting circuit 31 are set to the high level. Since the signal TOTP is set at the high level, the output signals OTP2, OTP3 of the priority setting circuit 32 are set to the high level. As a result, it is determined that the bank 2 and the bank 3 are set into the OTP mode.

Next, as described before, corrected data is written into the bank DBK3 of the data storing PROM cell array 5. In this case, since the signal TOTP is set at the low level, the priority setting circuit 32 sets the priority levels of the banks. As a result, the signal OTP3 is set to the high level and the signal OTP2 is set to the low level. Thus, as shown in FIG. 12, data is written into the bank DBK3 of the data storing PROM cell array.

After this, the data verifying operation is effected in the same manner as in the above-described case.

Next, the readout operation in this embodiment is explained. For example, a case wherein data in the address "010010" is read out is considered.

The address signal is supplied to the pre-decoder 33 and column decoder 7 via the address bus.

The pre-decoder 33 sets the signals φ1, R2 to the high level, sets the other output signals to the low level and outputs the above signals.

The transistors Q1 to Q5 of the address storing PROM cell array 9 are set in the OFF state. Further, the transistors Q21 to Q28 of the address detecting circuit 31 are turned ON and the power source potential VDD is applied to the drains of the transistors Q24 to Q28.

Therefore, the output signals OHIT2, OHIT3 of the address detecting circuit 31 are set to the high level and the signals OHIT1, OHIT4 are set to the low level.

Thus, the signal OTPMODE is set to the high level. As a result, the operation of outputting data stored in the main memory cell array is interrupted and data stored in the data storing PROM cell array is output to the exterior.

Further, the signal TOTP is set to the high level. As a result, the output signal OTP3 of the priority setting circuit 32 is set to the high level and the other signals OTP1, OTP2, OTP4 are set to the low level.

Therefore, in the data storing PROM cell array 5, only the potential of the control gate of the bank DBK3 is set to the high level. Since the potential of the control gate of the bank DBK2 is set at the low level, data of the same address stored in the bank 2 is not read out.

Further, in the column decoder 7, the address signals A1 and A0 are respectively set at "1" and "0". Therefore, data held in the memory cell MD32 is read out to the sense amplifier 8.

Thus, in this embodiment, when data of the same address of the mask ROM is rewritten twice or more, new data is written into a new PROM cell and the operation for preventing data from being read out from a PROM cell which holds previous data is effected. As a result, it becomes possible to apparently erase and rewrite data and simulatively attain the same function as that of an EEPROM.

Further, since the PROM cell is a single-layer PROM, it can be manufactured in the same manufacturing process as that for the mask ROM. Therefore, the manufacturing cost will not substantially be raised.

Figure 13:
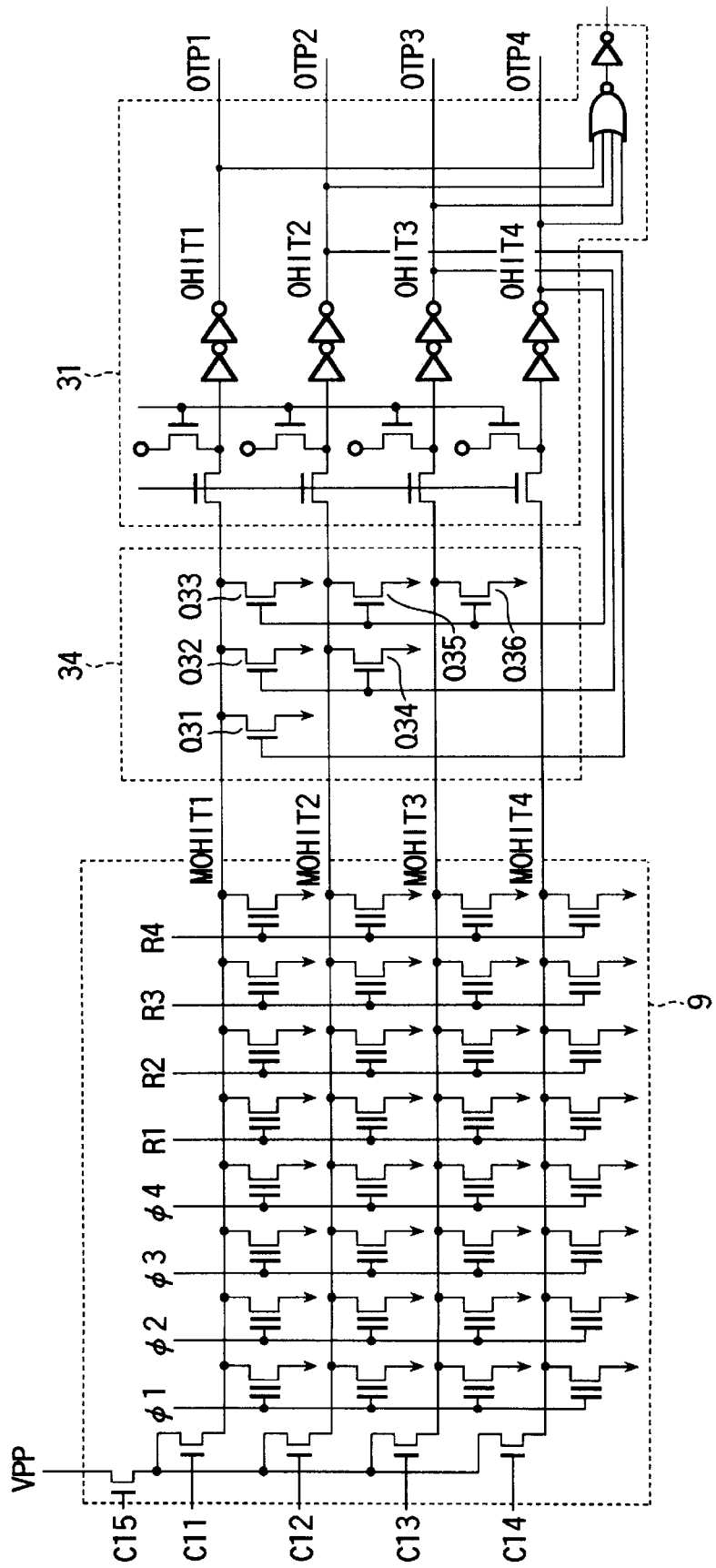
FIG. 13 is a circuit diagram showing a modification of the priority setting circuit, for illustrating the second embodiment of this invention.

FIG. 13 shows a modification of the priority setting circuit, for illustrating the second embodiment of this invention.

In the second embodiment, a priority setting circuit 34 includes transistors Q31 to Q36. The priority setting circuit is similar to that of the first embodiment except the above point.

In the priority setting circuit 34, the output signal OHIT2 of the address detecting circuit 31 is supplied to the gate of the transistor Q31. The output signal OHIT3 of the address detecting circuit 31 is supplied to the gates of the transistors Q32, Q34. The output signal OHIT4 of the address detecting circuit 31 is supplied to the gates of the transistors Q33, Q35, Q36. Further, the drains of the transistors Q31 to Q33 are connected to the common drain line MOHIT1 of the bank ABK1 of the address storing PROM cell array 9. The drains of the transistors Q34, Q35 are connected to the common drain line MOHIT2 of the bank ABK2 of the address storing PROM cell array 9. The drain of the transistor Q36 is connected to the common drain line MOHIT3 of the bank ABK3 of the address storing PROM cell array 9. Further, the sources of the transistors Q31 to Q36 are grounded.

The priority setting circuit 34 sets, to the low level, the potentials of the common drain lines of banks other than the bank having the highest priority among the banks which are determined to have an address which coincides with the input address signal by the address detecting circuit 31. As a result, only data of the bank having the highest priority is read out from the data storing PROM cell array.

In the second embodiment, the same effect as that of an EEPROM can be simulatively attained by using single-layer PROM cells which can be formed in the same manufacturing process as that for the mask ROM.

Further, the priority setting circuit in the second embodiment can be formed of elements of a smaller number than the number of elements of the priority setting circuit shown in FIG. 10. Therefore, if the number of banks increases, an increase in an area occupied by the priority setting circuit can be suppressed.

Figure 14:
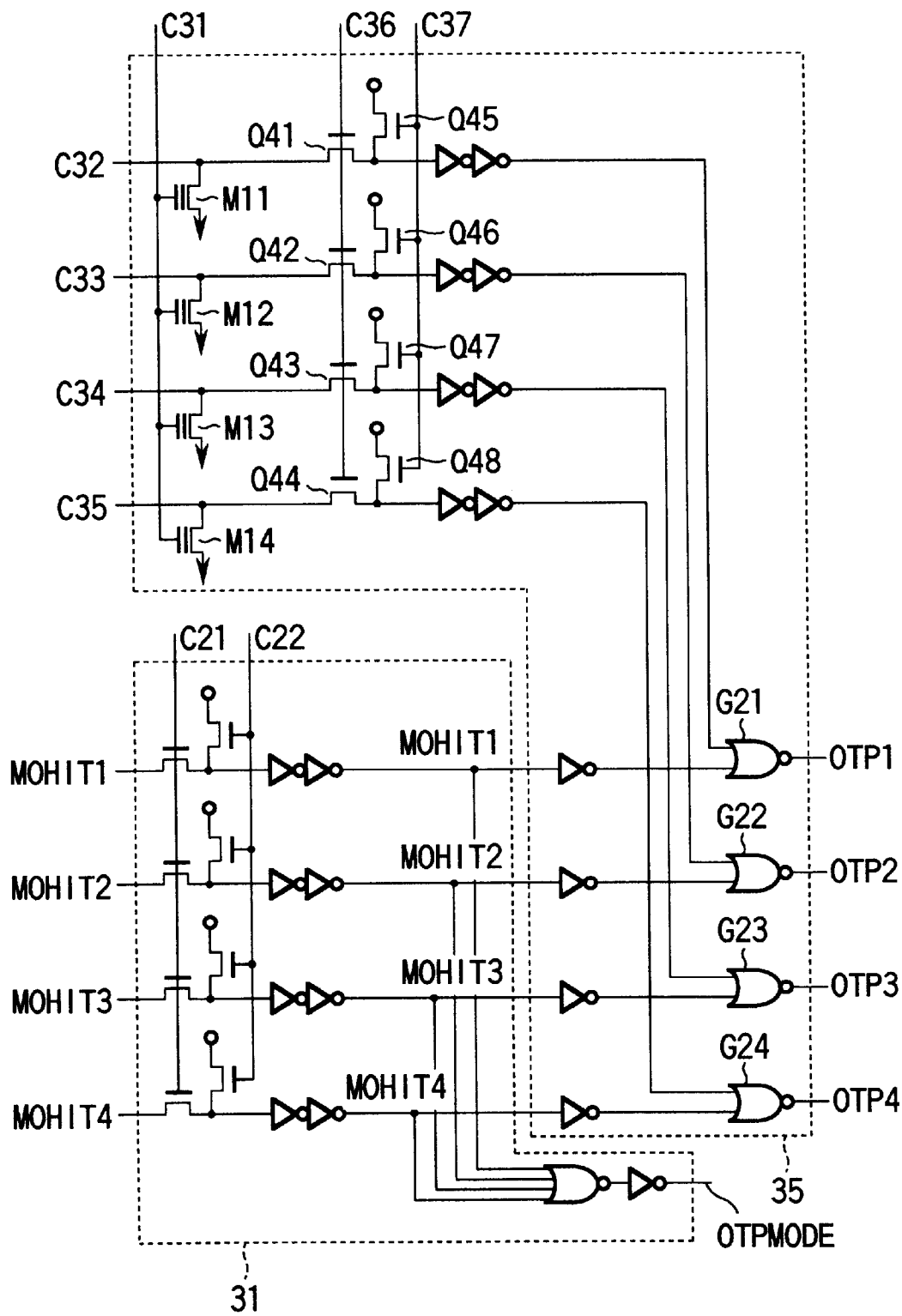
FIG. 14 is a circuit diagram showing a disenable circuit, for illustrating the third embodiment of this invention.

FIG. 14 shows a third embodiment of this invention. In the third embodiment, a disenable circuit 35 is used instead of the priority setting circuit used in the first and second embodiments. In other respects, the construction of the third embodiment is similar to that of the first embodiment.

The disenable circuit 35 has single-layer PROM cells M11 to M14 of a number equal to the number of banks of the PROM cell arrays 5, 9. The control gates of the PROM cells M11 to M14 are connected to a common line C31. The drains of the PROM cells M11 to M14 are respectively connected to output terminals C32 to C35 of a writing circuit of the same circuit construction as that of the transistors Q1 to Q5 shown in FIG. 9, for example.

Further, the drains of the PROM cells M11 to M14 are respectively connected to one-side ends of the current paths of transistors Q41 to Q44. The gates of the transistors Q41 to Q44 are supplied with a control signal C36. The other ends of the current paths of the transistors Q41 to Q44 are respectively connected to the sources of transistors Q45 to Q48. The drains of the transistors Q45 to Q48 are applied with a power source potential VDD and the gates thereof are supplied with a control signal C37. The control signals C36, C37 are normally set at the intermediate potential.

Further, the other ends of the current paths of the transistors Q41 to Q44 are respectively connected to the input terminals of 2-stage inverters, for example. Output signals of the 2-stage inverters are supplied to the first input terminals of NOR gates G21 to G24. The second input terminals of the NOR gates G21 to G24 are supplied with inverted signals of the signals OHIT1 to OHIT4. Output signals of the NOR gates G21 to G24 are used as the signals OTP1 OTP4 and supplied to word lines of the data storing PROM cell array 5.

Next, the operation of the third embodiment is explained.

First, data is written into the bank 1. That is, data is written into the bank ABK1 of the address storing PROM cell array 9 and the bank DBK1 of the data storing PROM cell array 5.

Then, if it is required to rewrite data stored in the bank DBK1, data is written into the PROM cell M11 of the disenable circuit 35 to enhance the threshold voltage thereof. Further, for example, an address and data to be newly written are stored in the banks 2.

At the data readout time, if an address equal to the address stored in the bank 1 and bank 2 is input, the output signals OHIT1, OHIT2 of the address detecting circuit 31 are both set to the high level.

Further, at the data readout time, the power source potential VDD is applied to the common control gate line C31 of the disenable circuit 35. At this time, the transistors Q41 to Q48 are set in the conductive state. Therefore, the memory cells M11 and M12 are respectively set in the OFF and ON states and the first input terminals of the NOR gates G21 and G22 are respectively set to the high and low levels.

Therefore, the output signal OTP1 of the NAND gate G21 is set to the low level, the output signal OTP2 of the NAND gate G22 is set to the high level, and the bank 1 is set into the non-selected state. As a result, only data written in the bank 2 is selected and read out.

In the bank 3, bank 4, data may be replaced by writing data in the same address as that of the bank 1, bank 2 again or by writing data in another address.

Like the first embodiment, in the third embodiment, the same effect as that of an EEPROM can be simulatively attained by using single-layer PROM cells which can be formed in the same manufacturing process as that for the mask ROM.

In a system in which the priority level is given for each of the banks as in the first and second embodiments, it is required for the user to remember the names of the banks used. In order to solve such a problem, it is necessary to use such means as to automatically define the order of banks into which data is written, set a bank which is used for first data writing as the bank 1 and set a bank which is used for second data writing as the bank 2.

Figure 15:
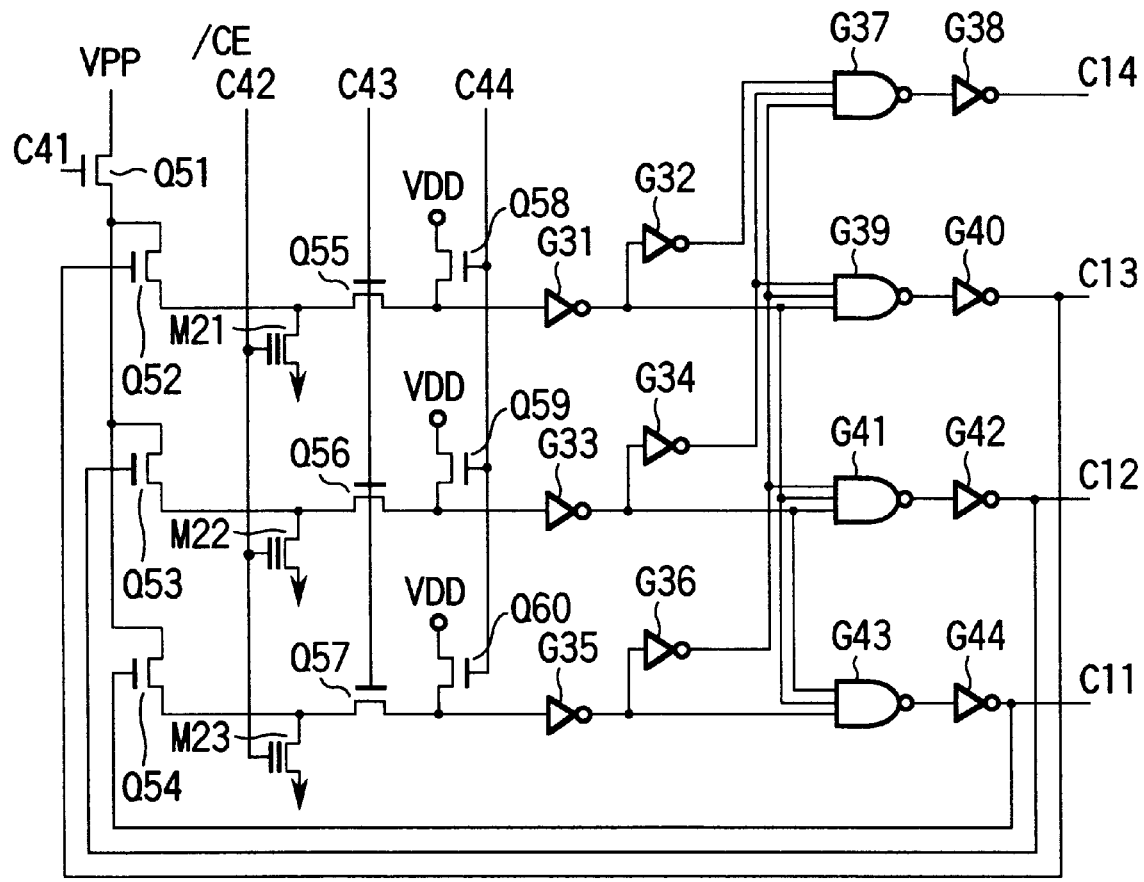
FIG. 15 is a circuit diagram showing an automatic bank specifying circuit, for illustrating the third embodiment of this invention.

FIG. 15 shows an example of the circuit construction of such an automatic bank specifying circuit. The circuit is added to the circuit used in the first and second embodiments.

As shown in FIG. 15, the high potential VPP is applied to the drain of a transistor Q51 and a control signal C41 is supplied to the gate thereof. The source of a transistor Q51 is connected to the drains of transistors Q52 to Q54. The sources of the transistors Q52 to Q54 are respectively connected to the drains of PROM cells M21 to M23.

The PROM cells M21 to M23 are each formed of a single-layer PROM. The control gates of the PROM cells M21 to M23 are connected to a common line C42.

The common line C42 is supplied with an inverted signal of a chip enable signal CE via a level shifter, for example. The sources of the PROM cells M21 to M23 are grounded.

The drains of the PROM cells M21 to M23 are respectively connected to one-side ends of the current paths of transistors Q55 to Q57. The gates of the transistors Q55 to Q57 are supplied with a control signal C43. The other ends of the current paths of the transistors Q55 to Q57 are respectively connected to the sources of transistors Q58 to Q60. The power source potential VDD is applied to all of the drains of the transistors Q58 to Q60 and the gates thereof are supplied with a control signal C44. The control signals C43, C44 are normally set at the intermediate potential.

Further, the other ends of the current paths of the transistors Q55 to Q57 are respectively connected to the input terminals of inverters G31, G33, G35. The output terminals of the inverters G31, G33, G35 are respectively connected to the input terminals of inverters G32, G34, G36.

In a NAND gate G37, the first to third input terminals are respectively connected to the output terminals of the inverters G32, G34, G36. The output terminal of the NAND gate G37 is connected to the input terminal of an inverter G38.

In a NAND gate G39, the first to third input terminals are respectively connected to the output terminals of the inverters G31, G34, G36. The output terminal of the NAND gate G39 is connected to the input terminal of an inverter G40.

In a NAND gate G41, the first to third input terminals are respectively connected to the output terminals of the inverters G31, G33, G36. The output terminal of the NAND gate G41 is connected to the input terminal of an inverter G42.

In a NAND gate G43, the first to third input terminals are respectively connected to the output terminals of the inverters G31, G33, G35. The output terminal of the NAND gate G43 is connected to the input terminal of an inverter G44.

The output terminals of the inverters G44, G42, G40, G38 are respectively connected to the gates of the transistors Q1 to Q4 constructing the writing circuit of the address storing PROM cell array 9 shown in FIG. 9, for example.

Further, the output terminals of the inverters G40, G42, G44 are respectively connected to the gates of the transistors Q52, Q53, Q54.

Next, the operation of the automatic bank specifying circuit is explained.

When no data is written in the bank 1 to bank 4, the threshold voltages of the PROM cells M21 to M23 of the automatic bank specifying circuit are kept at the low level. Therefore, only the signal C11 is set at the high level and the bank 1 of the address storing PROM cell array 9 is specified. At this time, the signals C12 to C14 are set at the low level.

After this, when data is written into the address storing PROM cell array 9 and the data storing PROM cell array 5, the signal C11 is set at the high level, and therefore, data is written into the bank 1.

When the operation for writing data into the bank 1 is terminated, the control signal C41 is set to the high level. Since only the signal C11 is set at the high level, the high potential VPP is applied to the drain of the PROM cell M23 via the transistor Q54. At the same time, the high potential VPP is applied to the control gate of the PROM cell M23.

As a result, electrons are injected into the floating gate of the PROM cell M23 to enhance the threshold voltage thereof. The operation of writing data into the PROM cell must be effected before the operation of writing data into a next bank is started.

If the threshold voltage of the PROM cell M23 is enhanced, the signal C12 is set to the high level and the signals C11, C13, C14 are set to the low level. Therefore, the automatic bank specifying circuit specifies the bank 2.

Likewise, after the writing operation for the bank 2, data is written into the PROM cell M22 and the signal C13 is set to the high level. The same operation is effected after the writing operation for the bank 3.

Thus, if the automatic bank specifying circuit is provided, data can be written into the bank having higher priority even if the user does not remember the banks used.

In the above embodiment, four banks are provided, but the number of banks is not limited to four.

Further, in the above embodiment, data of the mask ROM is replaced by treating the address signals A0, A1 as one unit, but this is not limitative. It is also possible to store all of the bits of the address in the address storing PROM cell array and replace data of the mask ROM for each bit.

Next, a fourth embodiment of this invention is explained. In the fourth embodiment, bugs of user data can be corrected by use of PROM cells and a defective cell caused in the manufacturing process can be replaced.

Figure 16:
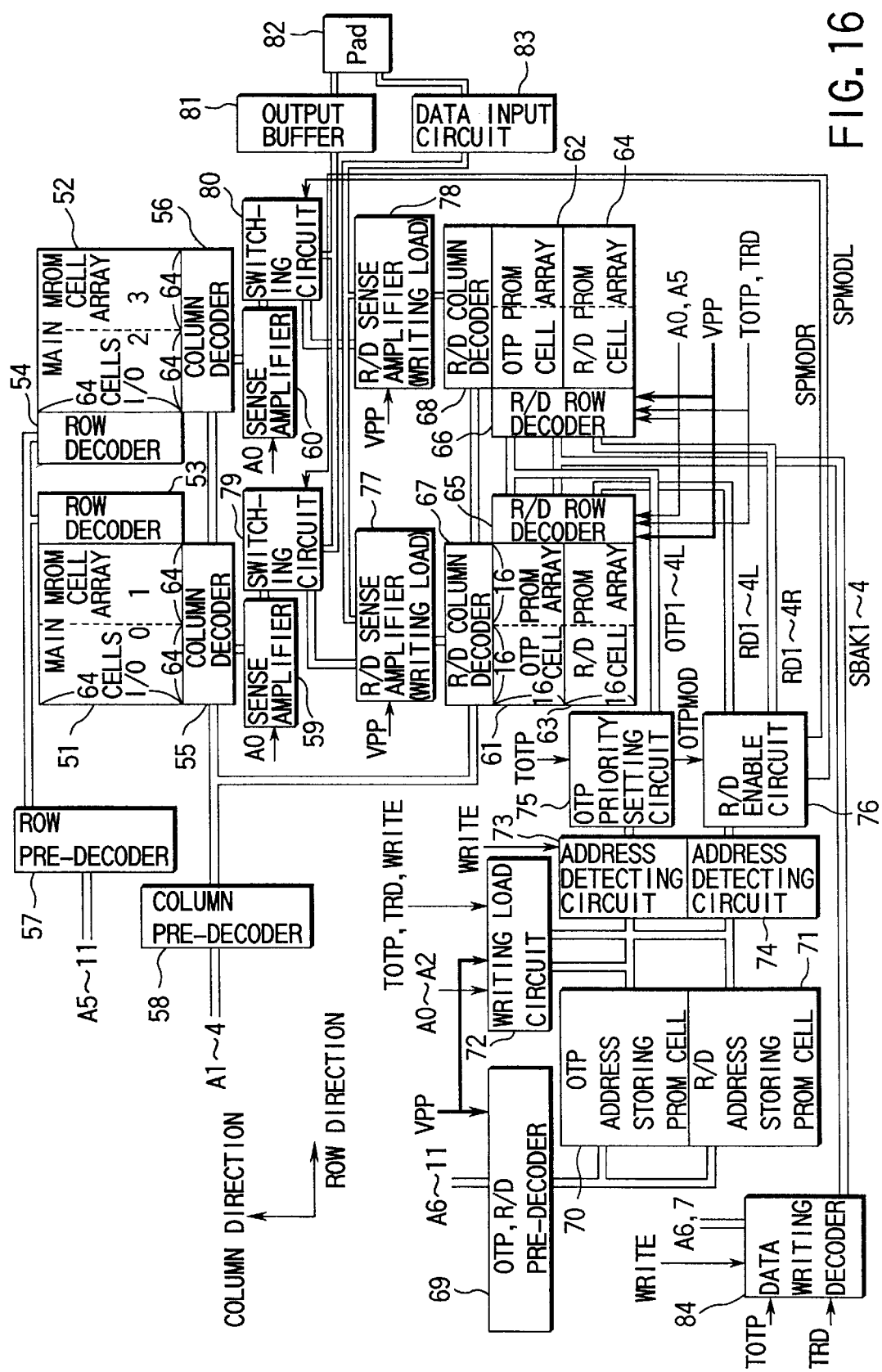
FIG. 16 is a construction diagram showing the whole portion of a fourth embodiment of this invention.

FIG. 16 shows the whole construction of a semiconductor memory device. In FIG. 16, row decoders 53, 54 and column decoders 55, 56 are connected to MROM (mask ROM) cell arrays 51, 52, respectively. The row decoders 53, 54 are connected to a row pre-decoder 57 and the column decoders 55, 56 are connected to a column pre-decoder 58. The row pre-decoder 57 is supplied with address signals A5 to A11 and the column pre-decoder 58 is supplied with address signals A1 to A4. Memory cells in the MROM cell arrays 51, 52 are selected by the row decoders 53, 54, column decoders 55, 56, row pre-decoder 57 and column pre-decoder 58. The column decoders 55, 56 are respectively connected to sense amplifiers 59, 60. Data read out from the selected memory cell is output via a corresponding one of the sense amplifiers 59 and 60. The sense amplifiers 59, 60 are supplied with an address signal A0 and chip enable signal CE (not shown).

The semiconductor memory device includes OTP PROM cell arrays 61, 62 used as a data storing PROM cell array in which data can be rewritten by the user and redundancy (R/D) PROM cell arrays 63, 64 used as a PROM cell array of redundancy system. The OTP PROM cell arrays 61, 62 are subjected to the rewriting process in the user mode and the R/D PROMs 63, 64 are subjected to the rewriting process in the defective cell rewriting mode.

In this embodiment, for clarifying the explanation, 64 cells selected by the address signals A0 to A5 are arranged in the row direction of the MROM cell arrays 51, 52, 64 cells selected by the address signals A6 to A11 are arranged in the column direction, each of the MROM cell arrays has a 2-I/O configuration, and in total, a 4-I/O configuration is made.

If a defective cell is present in the above MROM cell array, one word line (128 cells) of each MROM cell array is replaced by use of the R/D PROM. In the replacement unit, two I/O sections in the same array as that in which all of the cells selected by the address signals A0 to A5 are arranged are included. In a case where data is rewritten by the user, data is rewritten while each word line (256 cells) of the two MROM cell arrays is treated as one unit. The unit includes all of the cells selected by the address signals A0 to A5 and four I/O sections. That is, in the case of replacement of defective cells, memory cells are replaced for each array (two I/O sections), and in the rewriting operation by the user, memory cells are replaced for every four I/O sections. Further, in the case of replacement of defective cells, the number of word lines selected in one R/D PROM cell array is four, and in the case of data rewriting by the user, four word lines are selected in each OTP PROM cell array, and in total, eight word lines are selected.

The OTP PROM cell arrays 61, 62 and R/D PROMs 63, 64 are connected to R/D row decoders 65, 66 used as so-called spare row decoders and R/D column decoders 67, 68. The R/D column decoders 67, 68 are connected to the column pre-decoder 58. The memory cells in the OTP PROM cell arrays 61, 62 are selected by the R/D row decoders 65, 66 and R/D column decoders 67, 68. The R/D row decoders 65, 66 are supplied with a high potential VPP, address signals A0, A5 and signals TOTP, TRD.

An OTP, R/D pre-decoder 69 is supplied with the address signals A6 to A11 and high potential VPP. The OTP, R/D pre-decoder 69 is connected to an OTP address storing PROM cell 70 and R/D address storing PROM cell 71. The OTP, R/D pre-decoder 69 includes a level shift circuit which will be described later in the output section.

The OTP address storing PROM cell 70 stores row addresses of the OTP PROM cell arrays 61, 62 and the R/D address storing PROM cell 71 stores row addresses of the R/D PROM cell arrays 63, 64. The OTP address storing PROM cell 70 and R/D address storing PROM cell 71 are connected to a writing load circuit 72. The writing load circuit 72 is supplied with the address signals A0 to A2, high potential VPP, chip enable signal CE, and signals TOTP, TRD, WRITE which will be described later. The writing load circuit 72 supplies a high voltage to the selected memory cell at the time of address writing.

An address detecting circuit 73 is connected to the output terminal of the OTP address storing PROM cell 70 and an address detecting circuit 74 is connected to the output terminal of the R/D address storing PROM cell 71. The address detecting circuit 73 determines whether or not an address signal is output from the OTP address storing PROM cell 70 in the data readout mode and the address detecting circuit 74 determines whether or not an address signal is output from the R/D address storing PROM cell 71.

An OTP priority setting circuit 75 is connected to the output terminal of the address detecting circuit 73 and an R/D enable circuit 76 is connected to the output terminal of the address detecting circuit 74. The OTP priority setting circuit 75 selects an address which is last updated from the output signals of the address detecting circuit 73 and supplies the selected address to the R/D row decoders 65, 66 as signals OTP1 to OTP4. At this time, it generates a signal OTPMOD indicating the user mode and supplies the signal to the R/D enable circuit 76. The R/D enable circuit 76 supplies signals RD1L to RD4L for selecting the R/D PROM cell array 63 to the R/D decoder 65 and supplies signals RD1R to RD4R for selecting the R/D PROM cell array 64 to the R/D decoder 66 according to the output signal of the address detecting circuit 74. Further, in the case of user mode, it inhibits outputting of the signals RD1R to RD4R and signals RD1L to RD4L according to the signal OTPMOD supplied from the OTP priority setting circuit 75. As a result, data written by the user is preferentially read out at the data readout time.

The R/D column decoders 67, 68 are connected to R/D sense amplifiers 77, 78 each having a writing load circuit.

High potential VPP and chip enable signal(not shown) are supplied to the R/D sense amplifiers 77, 78, respectively. The output terminal of the R/D sense amplifier 77 is connected together with the output terminal of the sense amplifier 59 to the input terminal of a switching circuit 79, and the output terminal of the R/D sense amplifier 78 is connected together with the output terminal of the sense amplifier 60 to the input terminal of a switching circuit 80. The switching circuits 79, 80 select output signals of the sense amplifiers 59, 60 at the normal readout time, and select output signals of the R/D sense amplifiers 77, 78 according to signals SPMODR, SPMODL output from the R/D enable circuit 76 in the user mode and redundancy mode. The output terminals of the switching circuits 79, 80 are connected to a pad 82 via an output buffer 81. The output buffer 81 is supplied with an output enable signal and the chip enable signal CE. Therefore, data read out from the MROM cell arrays 51, 52 or OTP PROM cell arrays 61, 62 and R/D PROM cell arrays 63, 64 is output to the pad 82 via the output buffer 81 according to the output enable signal/OE and chip enable signal CE.

The pad 82 is connected to the R/D sense-amplifiers 77, 78 via a data input circuit 83. Data supplied to the pad 82 is supplied to the R/D sense amplifiers 77, 78 via the data input circuit 83.

A data writing decoder 84 is connected to the R/D decoders 65, 66. The data writing decoder 84 is supplied with the signals WRITE, TOTP, TRD and address signals A6, A7. The data writing decoder 84 generates signals SBAK1 to SBAK4 based on the above signals at the data writing time and supplies the signals to the R/D decoders 65, 66. Therefore, the OTP PROM cell arrays 61, 62 and R/D PROM cell arrays 63, 64 are selected by the data writing decoder 84 and R/D decoders 65, 66 without using the OTP address storing PROM cell 70 and R/D address storing PROM cell 71 at the data writing time.

Figure 18:
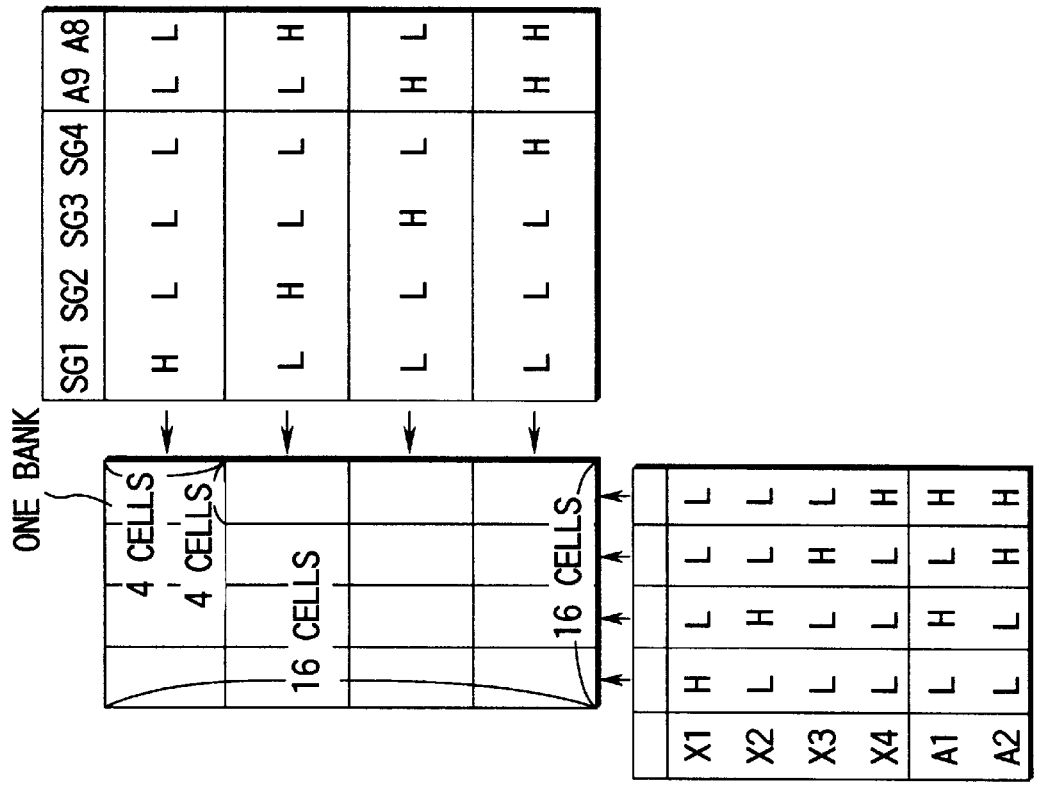
FIG. 18 is a diagram showing the construction of one block shown in FIG. 17.
Figure 17:
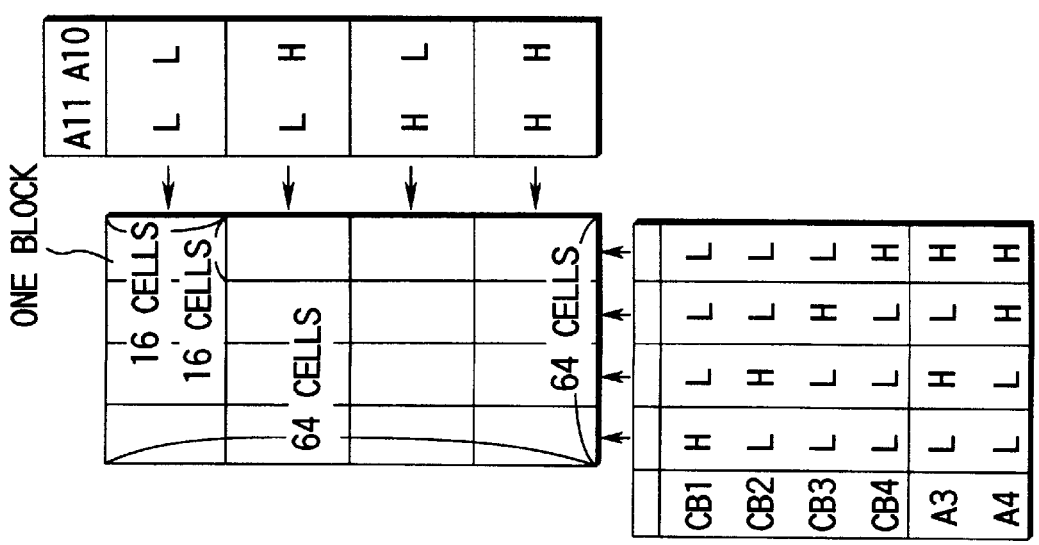
FIG. 17 is a diagram showing the construction of an MROM shown in FIG. 16.

FIG. 17 shows one I/O section of the MROMs 51, 52 shown in FIG. 16, and FIG. 18 shows the construction of one block in FIG. 17. As shown in FIG. 17, one I/O section is constructed by 16 blocks, and as shown in FIG. 18, one block is constructed by 16 banks. As shown in FIGS. 17, 18, the banks and blocks in the row direction are selected by use of the address signals A1 to A4 and the banks and blocks in the column direction are selected by use of the address signals A8 to A11.

Figures 19A, 19B:
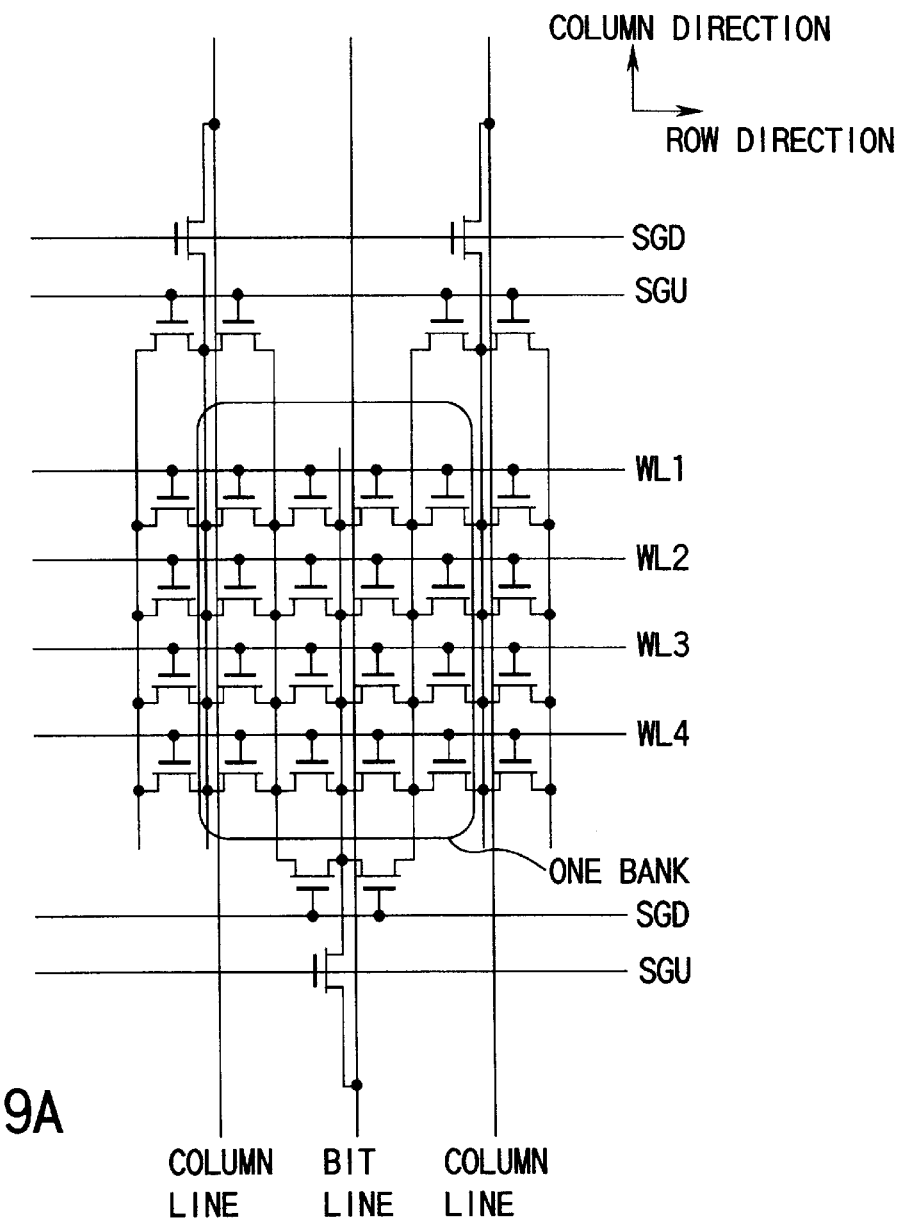
FIG. 19A is a diagram showing the circuit construction of one bank shown in FIG. 18.
FIG. 19B is a diagram showing the logic of word lines shown in FIG. 19A.

FIG. 19A shows the circuit construction of one bank shown in FIG. 18, and FIG. 19B shows the logic of selection of the word lines. In the circuit shown in FIG. 19A, one bank is constructed by four cells arranged in the row direction and four cells arranged in the column direction. The column decoder 55 (56) selects two column lines adjacent to one bit line and the bit line is connected to the sense amplifier 59 (60). One of the two column lines is applied with a ground potential VSS and the other column line is applied with an intermediate potential equal to a potential supplied to the sense amplifier. In this embodiment, the sense amplifier 59 (60) uses the address signal A0 to select the intermediate potential and the ground potential of the column line.

One of the four cells arranged in the row direction in the bank shown in the drawing is selected by setting one of the output signals SGU and SGD of the row decoder 53 (54) to the high level "H" and setting the other output signal to the low level "L". In this embodiment, the address signal A5 is used to effect the above selecting operation. One word line is selected in the column direction by use of the address signals A6, A7. If the address signal is supplied as described above, one of the cells in the MROM is selected.

Figure 20:
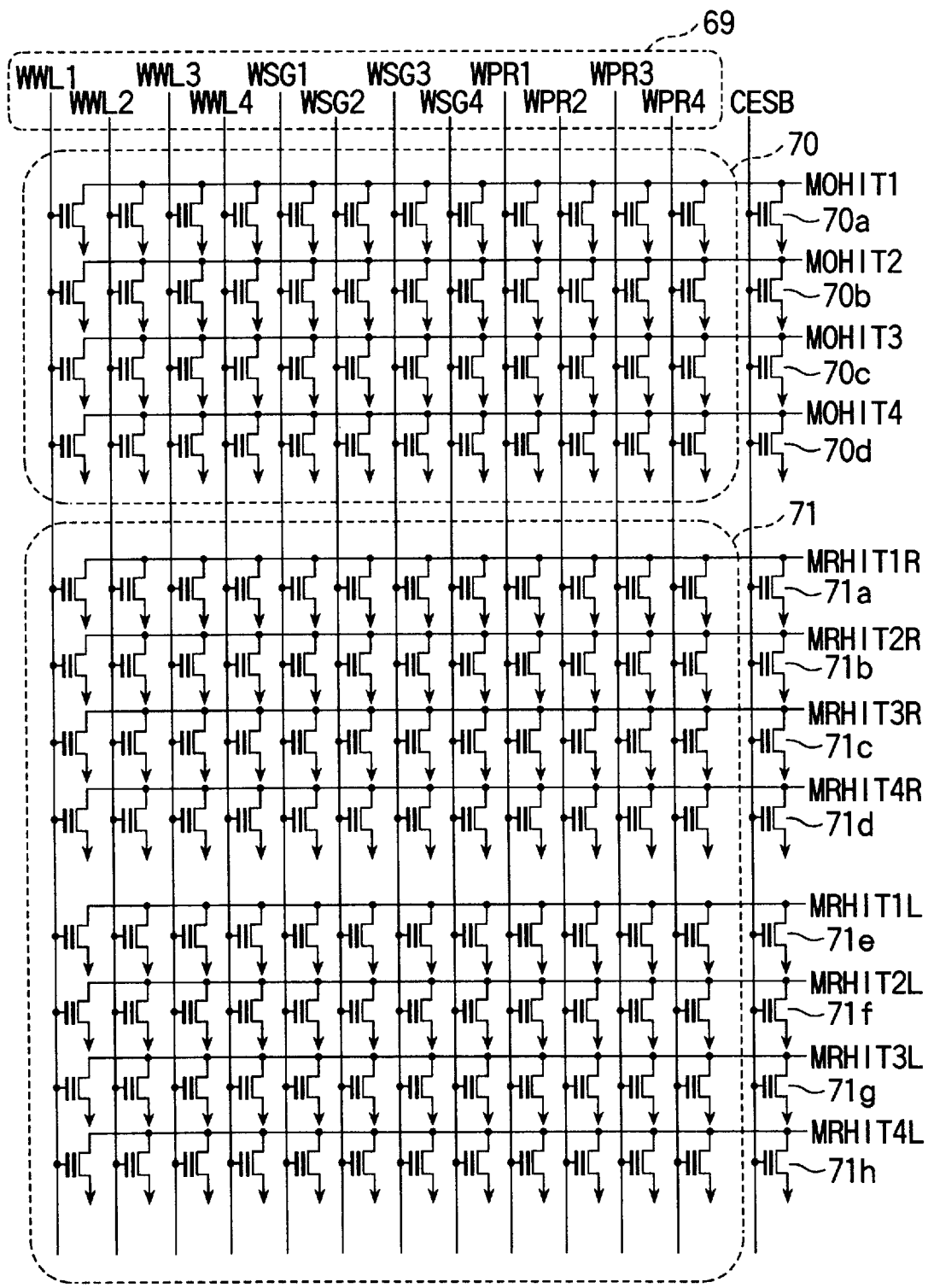
FIG. 20 is a circuit diagram showing an OTP address storing PROM cell and R/D address storing PROM cell shown in FIG. 16.

FIG. 20 shows the construction of the OTP address storing PROM cell 70 and R/D address storing PROM cell 71. Since the MROMs 51, 52 use the address signals A0 to A5 as one unit, the OTP, R/D pre-decoder 69, OTP address storing PROM cell 70 and R/D address storing PROM cell 71 are only required to store the address signals A6 to A11.

The OTP address storing PROM cell 70 is constructed by PROM cells of 12 rows×4 columns and the R/D address storing PROM cell 71 is constructed by PROM cells of 12 rows×8 columns. That is, in the OTP PROM cell arrays 61, 62, since the four I/O sections of the MROMs 51, 52 are replaced by use of the same address as described before, four columns equal in number to lines to be compensated for are arranged. Further, in the R/D PROM cell arrays 63, 64, since the two I/O sections of the MROMs 51, 52 are replaced by use of the same address, eight columns are arranged.

Pre-decode lines WWL1 to WWL4, WSG1 to WSG4 and WPR1 to WPR4 for transmitting output signals of the OTP, R/D pre-decoder 69 are connected to the word lines arranged in the OTP address storing PROM cell 70 and R/D address storing PROM cell 71. In the OTP address storing PROM cell 70, the drain of each PROM cell is commonly connected to the drain lines MOHIT1 to MOHIT4, and in the R/D address storing PROM cell 71, the drain of each PROM cell is commonly connected to the drain lines MRHIT1R to MRHIT4R and MRHIT1L to MRHIT4L.

The OTP, R/D pre-decoder 69 selects the pre-decode lines WWL1 to WWL4, WSG1 to WSG4, WPR1 to WPR4 according to the table shown in FIG. 21.

Figure 22:
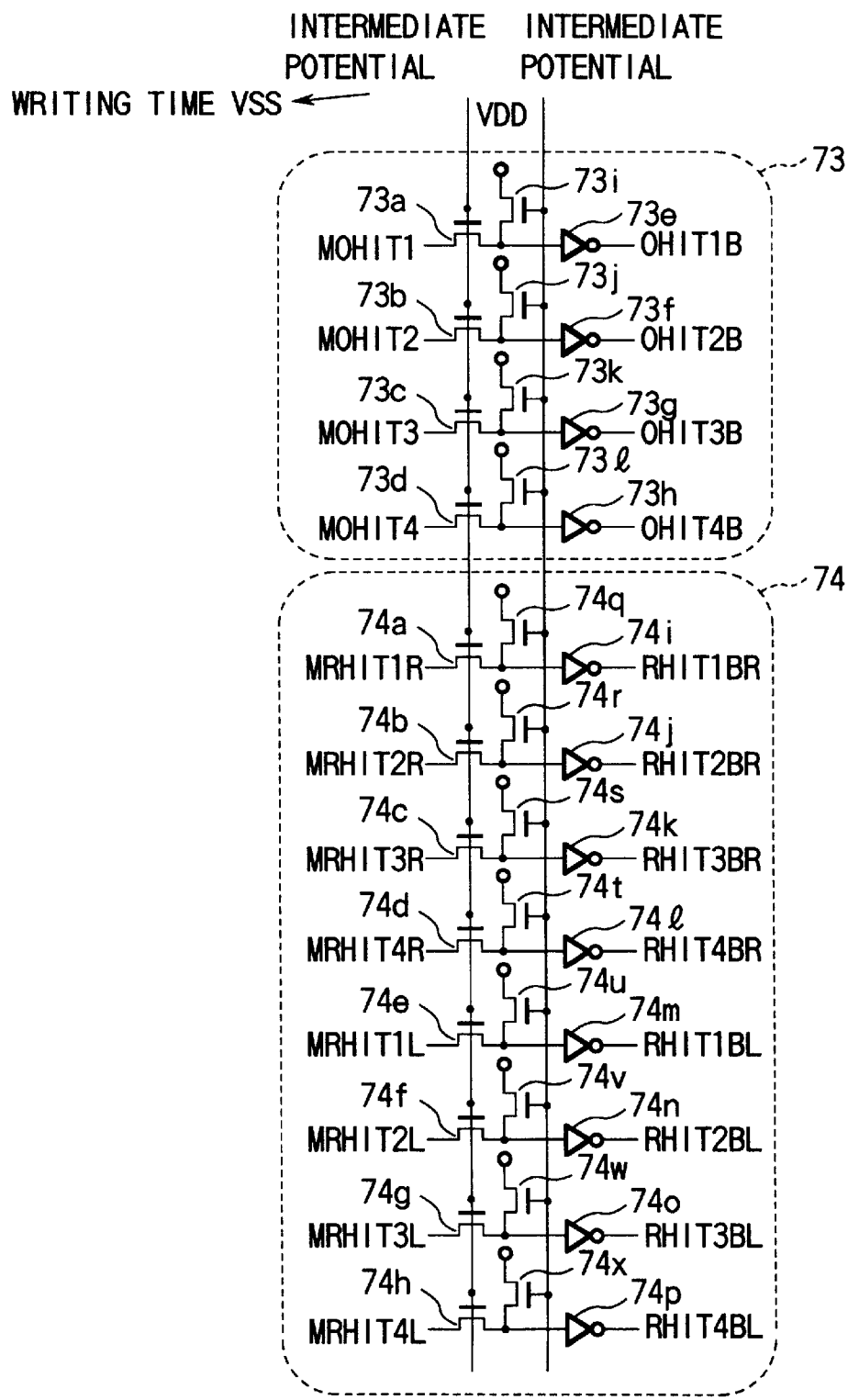
FIG. 22 is a circuit diagram showing an address detecting circuit shown in FIG. 16.

FIG. 22 shows address detecting circuits 73, 74. The drain lines MOHIT1 to MOHIT4, MRHIT1R to MRHIT4R and MRHIT1L to MRHIT4L are connected to the input terminals of inverters 73e to 73h and 74i to 74p via transistors 73a to 73d and 74a to 74h. The gates of the transistors 73a to 73d and 74a to 74h are supplied with the intermediate potential at the data readout time and supplied with the ground potential VSS at the data writing time. Transistors 73i to 73l and 74q to 74x are connected between the input terminals of the inverters 73e to 73h and 74i to 74p and a terminal applied with the power source potential VDD. The gates of the transistors 73i to 73l and 74q to 74x are applied with the intermediate potential. Signals OHIT1B to OHIT4B, RHIT1BR to RHIT4BR, RHIT1BL to RHIT4BL are output from the output terminals of the inverters 73e to 73h and 74i to 74p.

Figure 23:
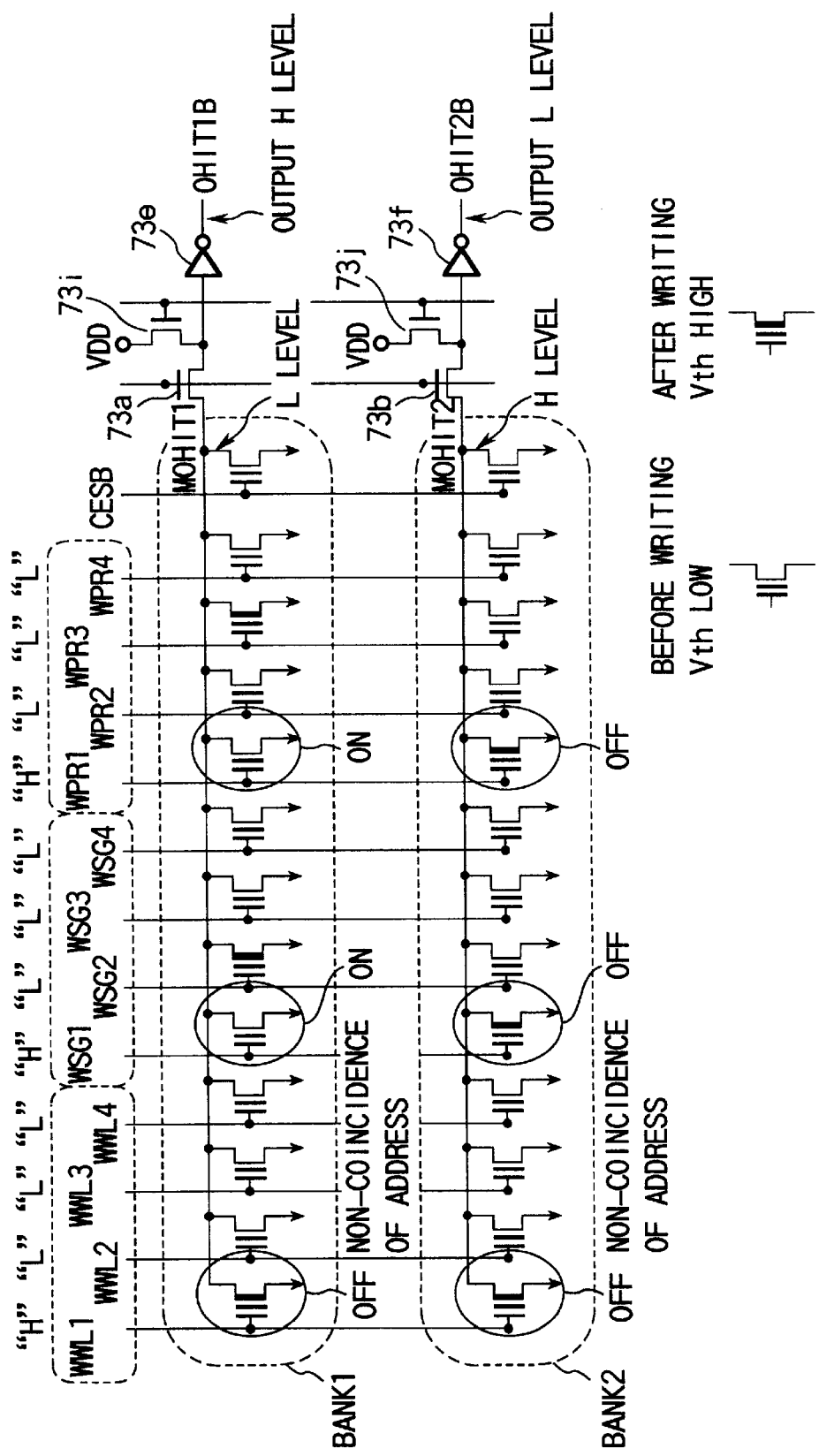
FIG. 23 is a circuit diagram for illustrating the operation of the circuits shown in FIGS. 20 to 22.

FIG. 23 shows the main portion of FIG. 22, for illustrating the operation of the address detecting circuits 73, 74. The bank 1 indicates the address non-coincidence state. That is, the threshold voltage of the PROM cell selected by the pre-decode line WWL1 is set to the high level and the threshold voltages of the PROM cells selected by the pre-decode lines WSG1, WPR1 are set to the low level. Therefore, the PROM cells selected by the pre-decode lines WSG1, WPR1 are turned ON and the potential of the drain line MOHIT1 is set to the low level. As a result, the output signal OHIT1B of the inverter 73e is set to the high level.

On the other hand, the bank 2 indicates the address coincidence state. That is, all of the threshold voltages of the PROM cells selected by the pre-decode lines WWL1, WSG1, WPR1 are set to the high level. Therefore, all of the PROM cells selected by the pre-decode lines WWL1, WSG1, WPR1 are turned OFF and the potential of the drain line MOHIT1 is set to the high level. As a result, the output signal OHIT2B of the inverter 73f is set to the low level and the OTP PROM cell arrays 61, 62 are into the selected state.

Figure 24:
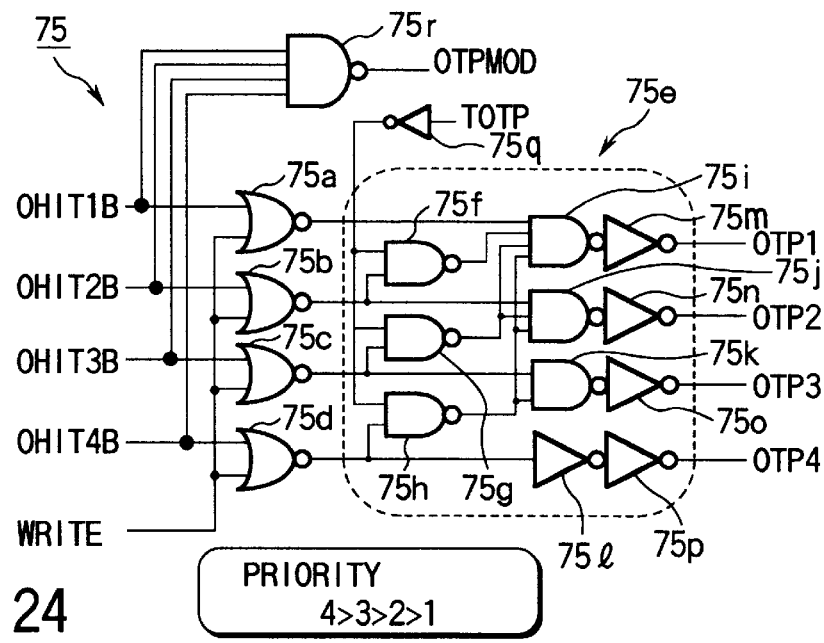
FIG. 24 is a circuit diagram showing an OTP priority setting circuit shown in FIG. 16.

FIG. 24 shows the OTP priority setting circuit 75. The output signals OHIT1B to OHIT4B of the address detecting circuit 73 are respectively supplied to one-side input terminals of NOR gates 75a to 75d. The other input terminals of the NOR gates 75a to 75d are supplied with a signal WRITE. The output terminals of the NOR gates 75b, 75c, 75d are respectively connected to one-side input terminals of NAND gates 75f to 75h which construct the priority setting circuit 75e. The other input terminals of the NAND gates 75f to 75h are supplied with a signal TOTP via an inverter 75q. The output terminal of the NOR gate 75a and the output terminals of the NAND gates 75f to 75h are connected to respective input terminals of a NAND gate 75i. The output terminal of the NOR gate 75b and the output terminals of the NAND gates 75g, 75h are connected to respective input terminals of a NAND gate 75j. The output terminal of the NOR gate 75c and the output terminal of the NAND gate 75h are connected to respective input terminals of a NAND gate 75k. The output terminal of the NOR gate 75d is connected to the input terminal of an inverter 75l. The output terminals of the NAND gates 75i, 75j, 75k and inverter 75l are respectively connected to the input terminals of inverters 75m to 75p and signals OTP1 to OTP4 are output from the respective inverters 75m to 75p.

Further, the signals OHIT1B to OHIT4B are supplied to a NAND gate 75r. The NAND gate 75r outputs a signal OTPMOD of high level when at least one of the signals OHIT1B to OHIT4B is set into the selected state (low level).

The signals OTP1 to OTP4 are given higher priorities as the appended numbers thereof are larger. That is, the relation between the priorities of the signals is OTP1<OTP2<OTP3<OTP4. Therefore, in a case where data is written into a cell selected by the signal OTP1 and then the data is rewritten in the OTP PROM cell arrays 61, 62, data is written into a cell selected by the signal OTP2. When written data is read out, the output signals OTP1, OTP2 of the address detecting circuit 73 are both set into the selected state (low level) if an address corresponding to a write address is input. However, only the signal OTP2 is preferentially set into the selected state by the OTP priority setting circuit 75 and the signal OTP1 is set into the non-selected state. Therefore, data is read out from a cell selected by the signal OTP2.

In the cells selected by the signals OTP3, OTP4, data may be replaced by writing the same data as data written in the cells selected by the signals OTP1, OTP2 or data in another address may be written into the selected cells.

Thus, the operation of an EEPROM can be simulatively attained by using PROM cells which can be formed in the same manufacturing process as that for the mask ROM.

Figure 25:
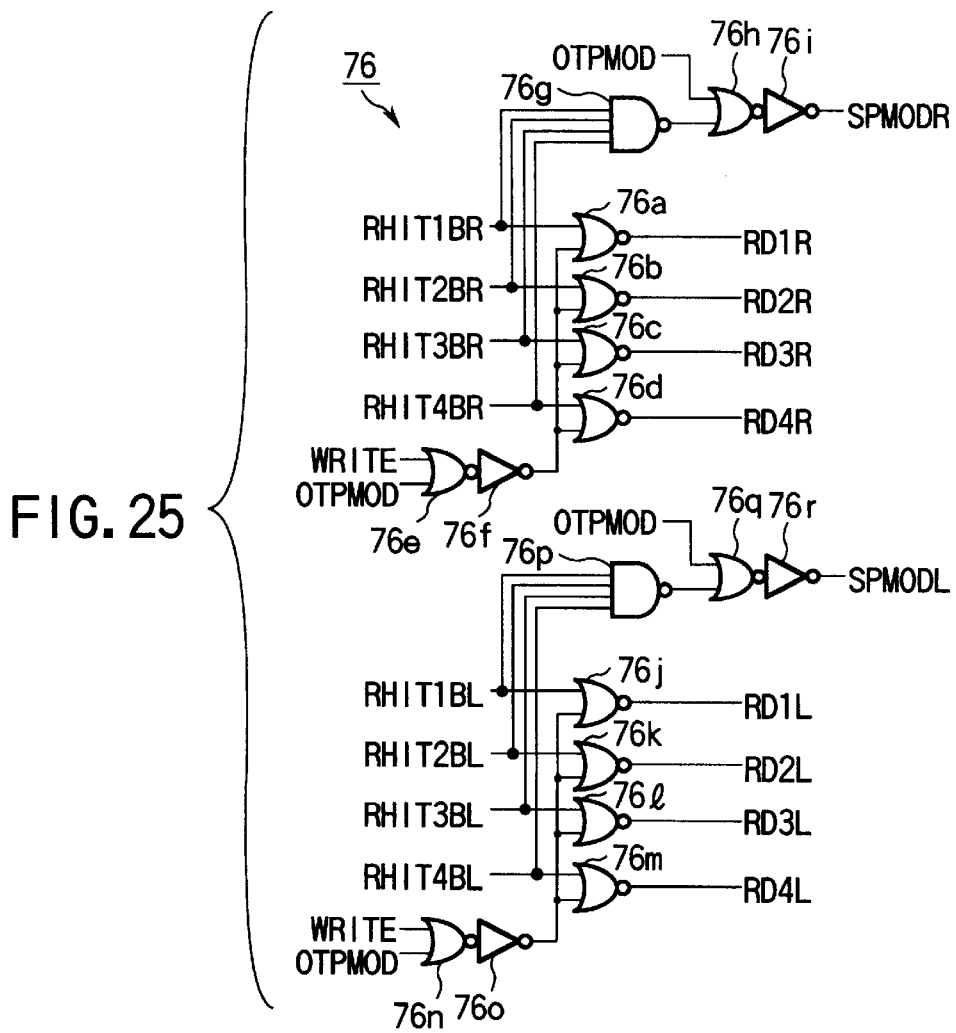
FIG. 25 is a circuit diagram showing an R/D enable circuit shown in FIG. 16.

FIG. 25 shows the R/D enable circuit. The signals RHIT1BR to RHIT4BR output from the address detecting circuit 74 are supplied to one-side input terminals of NOR gates 76a to 76d. The signal OTPMOD output from the OTP priority setting circuit 75 and the signal WRITE are supplied to a NOR gate 76e. An output signal of the NOR gate 76e is supplied to the other input terminals of the NOR gates 76a to 76d via an inverter 76f. Signals RD1R to RD4R are output from the output terminals of the NOR gates 76a to 76d. The signals RD1R to RD4R are supplied to the R/D row decoder 66.

Further, the signals RHIT1BR to RHIT4BR are supplied to a NAND gate 76g. An output signal of the NAND gate 76g is supplied together with the signal OTPMOD to a NOR gate 76h. An output signal of the NOR gate 76h is supplied to an inverter 76i and a signal SPMODR for controlling the switching circuit 80 is output from the output terminal of the inverter 76i.

Further, the signals RHIT1BL to RHIT4BL output from the address detecting circuit 74 are supplied to one-side input terminals of NOR gates 76j to 76m. The signal OTPMOD output from the OTP priority setting circuit 75 and the signal WRITE are supplied to a NOR gate 76n. An output signal of the NOR gate 76n is supplied to the other input terminals of the NOR gates 76j to 76m via an inverter 76o. Signals RD1L to RD4L are output from the output terminals of the NOR gates 76j to 76m. The signals RD1L to RD4L are supplied to the R/D row decoder 65.

Further, the signals RHIT1BL to RHIT4BL are supplied to a NAND gate 76p. An output signal of the NAND gate 76p is supplied together with the signal OTPMOD to a NOR gate 76q. An output signal of the NOR gate 76q is supplied to an inverter 76r and a signal SPMODL for controlling the switching circuit 79 is output from the output terminal of the inverter 76r.

The R/D enable circuit 76 of the above construction generates signals RD1R to RD4R, RD1L to RD4L according to the signals RD1R to RD4R, RHIT1BL to RHIT4BL in the defective cell replacing mode. The R/D row decoders 65, 66 read out data stored in the R/D PROM cell array according to the signals RD1R to RD4R, RD1L to RD4L. Thus, correct data corresponding to the defective cell can be read out from the R/D PROM cell array.

If the user mode is detected by the OTP priority setting circuit 75, the R/D enable circuit 76 is set into the disable state by the signal OTPMOD output from the OTP priority setting circuit 75 and the signals RD1R to RD4R, RD1L to RD4L are not output. Therefore, data in the OTP PROM cell arrays 61, 62 which is rewritten by the user is preferentially output.

Further, if one of the signals RHIT1BR to RHIT4BR and RHIT1BL to RHIT4BL output from the address detecting circuit 74 is selected, one or both of the signals SPMODR and SPMODL are set into the selected state (high level). When the user mode is detected, both of the signals SPMODR and SPMODL are set into the selected state according to the signal OTPMOD output from the OTP priority setting circuit 75. Therefore, in the defective cell replacing mode, one or both of the switching circuits 79 and 80 shown in FIG. 16 are selected and data of the defective cell is replaced by data read out from the R/D PROM cell array. Further, when the user mode is set, both of the switching circuits 79 and 80 are selected and cell data is replaced by data read out from the OTP PROM cell array.

Figure 26:
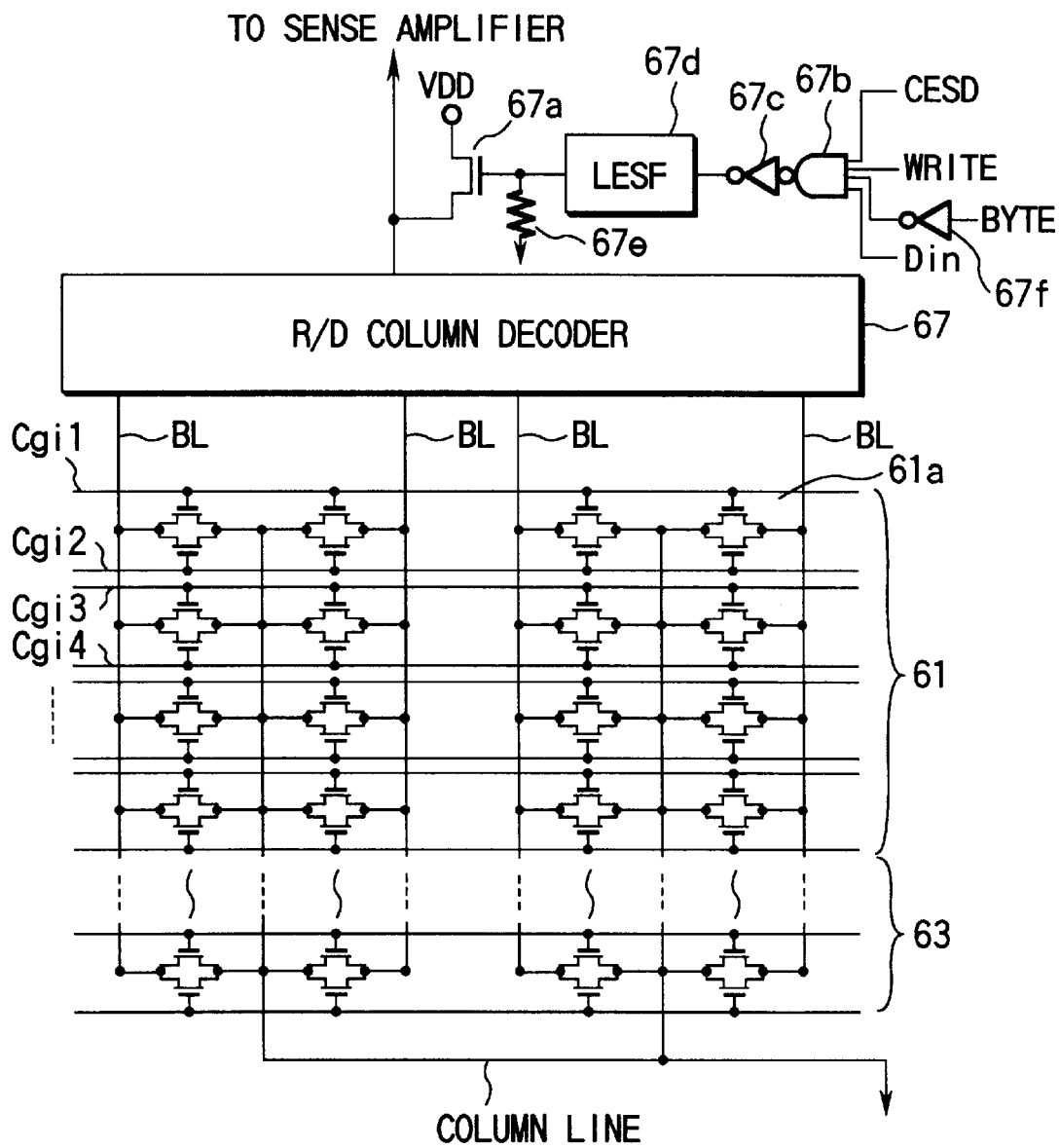
FIG. 26 is a circuit diagram showing an OTP PROM cell array and R/D PROM cell array shown in FIG. 16.

FIG. 26 shows the constructions of the OTP PROM cell array 61 and R/D PROM cell array 63. The constructions of the OTP PROM cell array 62 and R/D PROM cell array 64 are the same as those of the OTP PROM cell array 61 and R/D PROM cell array 63, and therefore, the constructions thereof are omitted.

In the OTP PROM cell array 61 and R/D PROM cell array 63, a plurality of PROM cells 61a are arranged in a matrix form. The control gates of those of the PROM cells 61a which are arranged on the same row are commonly connected to a corresponding one of control gate lines Cgi1, Cgi2, . . . The drains of those of the PROM cell array 61a which are arranged on the same column are commonly connected to a corresponding one of the bit lines BL and the sources thereof are connected to the column line. The bit lines BL are connected to an R/D column decoder 67. A transistor 67a is connected between the output terminal of the R/D column decoder 67 and the power source terminal VDD. The gate of the transistor 67a is grounded via a resistor 67e and connected to the output terminal of a level shift circuit (LESF) 67d. Signals CESD, WRITE, a signal obtained by inverting a signal BYTE by an inverter 67f, and a signal Din are supplied to a NAND gate 67b. An output signal of the NAND gate 67b is supplied to the input terminal of the level shift circuit 67d via an inverter 67c.

Figure 27:
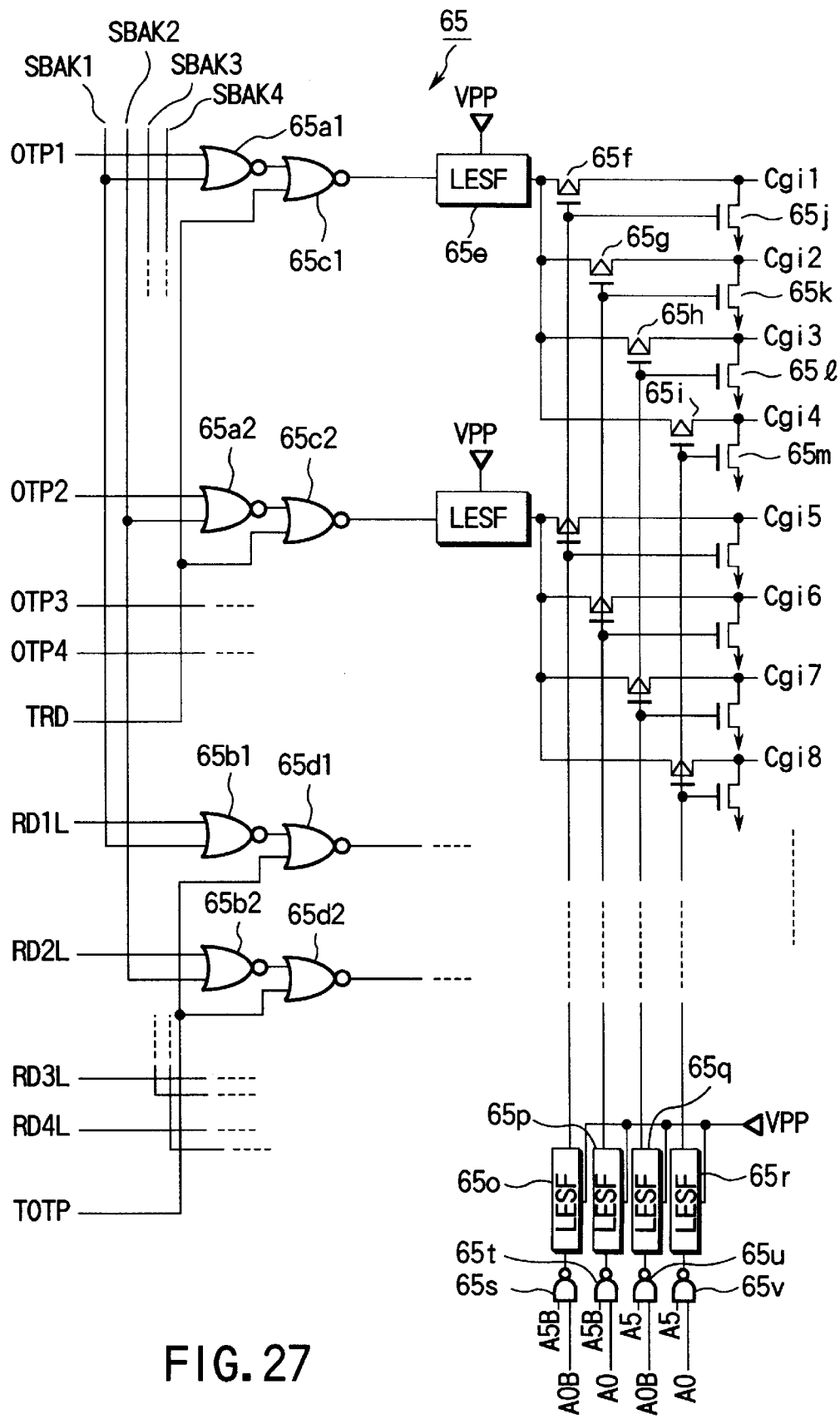
FIG. 27 is a circuit construction diagram showing an R/D row decoder shown in FIG. 16.

FIG. 27 shows the construction of the R/D row decoder 65. The signals OTP1 to OTP4 and signals RD1L to RD4L are selectively supplied together with signals SBAK1 to SBAK4 to NOR gates 65a1, 65a2, . . . , 65b1, 65b2, . . . Output signals of the NOR gates 65a1, 65a2, . . . are supplied together with the signal TRD to NOR gates 65c1, 65c2, . . . , and output signals of the NOR gates 65b1, 65b2, . . . are supplied together with the signal TOTP to NOR gates 65d1, 65d2, . . . The NOR gates 65c1, 65c2, . . . , 65d1, 65d2, . . . , and the like have substantially the same construction and the NOR gate 65c1 is explained here as an example.

An output signal of the NOR gate 65c1 is supplied to a level shift circuit 65e for converting a VDD level signal to the high potential VPP. The output terminal of the level shift circuit 65e is connected to the sources of P-channel MOS transistors 65f to 65i. The drains of the transistors 65f to 65i are respectively connected to the control gate lines Cgi1 to Cgi4 and grounded via transistors 65j to 65m. The gates of the transistors 65f to 65i, 65j to 65m are connected to the output terminals of respective level shift circuits 65o to 65r. The input terminals of the level shift circuits 65o to 65r are connected to the output terminals of NAND gates 65s to 65v. The input terminals of the NAND gates 65s to 65v are selectively supplied with the address signals A0, A5 and inverted signals A0B, A5B thereof.

With the above construction, if the defective cell replacing mode or user mode is set at the time of data readout, one of the signals OTP1 to OTP4 and signals RD1L to RD4L (signals RD1R to RD4R) is set into the selected state (high level). The signal is supplied to the R/D row decoder 65 to select one control gate line in the OTP PROM cell array 61 or R/D PROM cell array 63.

The bit line is selected by the address signals A1 to A4. However, the number of cells in the row direction shown in FIG. 16 is 128 in the MROM cell array and 32 in each of the OTP PROM cell array and the R/D PROM cell array. Therefore, they are divided in the column direction by use of the address signals A0, A5.

A cell is selected by the above operation, and data is read out from the selected cell and sensed by the R/D sense amplifier 77. At this time, since the signal SPMODL is set at the high level, an output signal of the R/D sense amplifier 77 is selected by the switching circuit 79.

Figure 28:
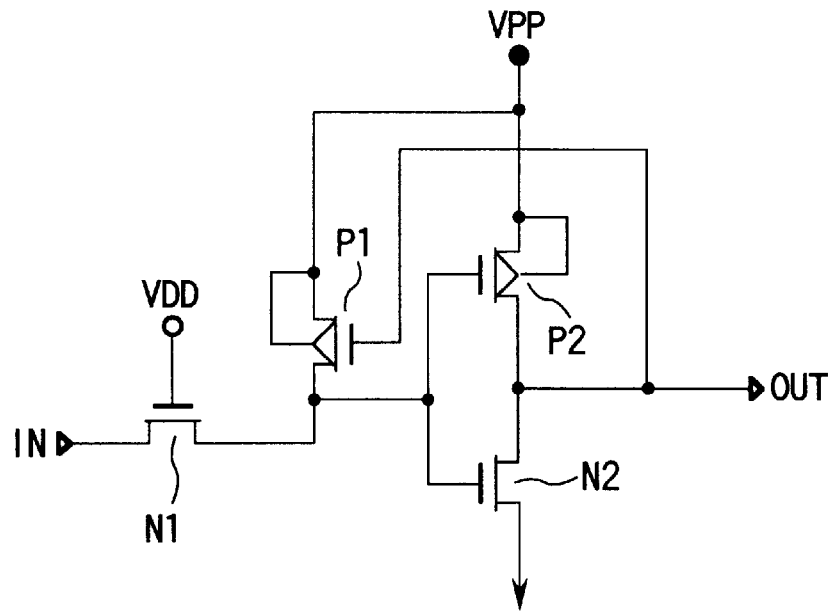
FIG. 28 is a circuit construction diagram showing a level shift circuit shown in FIG. 27.

FIG. 28 shows one example of the level shift circuit shown in FIG. 27. The level shift circuit includes P-channel transistors P1, P2 and N-channel transistors N1, N2 to convert a signal of VDD level supplied to an input terminal IN to a signal of VPP level and output the signal to an output terminal OUT.

Next, a case wherein data is written into the OTP PROM cell array or R/D PROM cell array is explained.

Figure 29:
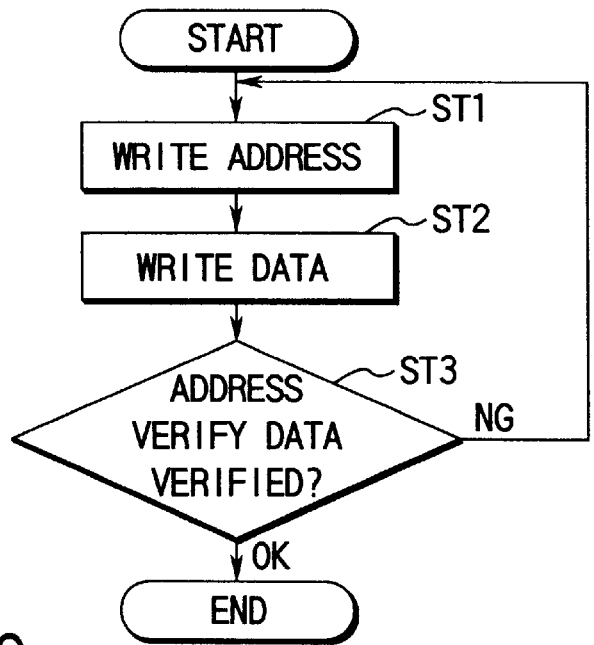
FIG. 29 is a flowchart for illustrating the write operation of the OTP PROM cell array and R/D PROM cell array.

FIG. 29 shows the operation effected when data is written into the OTP PROM cell array or R/D PROM cell array. When data is rewritten, an address of a cell to be subjected to the rewriting process is first written into the OTP address storing PROM cell 70 or R/D address storing PROM cell 71 (ST1). Then, data is written into the OTP PROM cell array or R/D PROM cell array according to the written address (ST2). After this, the written address and data are verified (ST3). The number of times by which the high potential VPP is applied can be reduced by effecting the writing operation in the order described above. Since it takes a long time to generate the high potential VPP, the data writing time can be reduced by reducing the number of times by which the high potential VPP is generated.

FIG. 30 shows the relation between various pins and various operation modes. That is, the semiconductor memory device has address pins A0 to A11, /BYTE (/BYTE used in this specification indicates an inverted signal of BYTE) pin, data pins D0 to D3, power source pin VPP, TEST pin and the R/D writing, and the operation modes of R/D address verify, R/D data writing, R/D data verify, OTP address writing, OTP address verify, OTP data writing, and OTP data verify are set by use of the above pins.

In the case of FIG. 30, the potential of the /BYTE pin at the readout time is set to the high or low level, a 4-bit output is output at the time of high level, and a 2-bit output is output at the time of low level. In the case of writing and verify modes, since a 4-bit operation is always effected, a 4-bit mode is automatically set when a signal TOTP or TRD which will be described later is detected, and a signal supplied to the /BYTE pin is not used. Therefore, in this embodiment, the address writing and verify operations are permitted by setting the potential of the /BYTE pin to the high level and the data writing and verify operations are permitted by setting the potential of the /BYTE pin to the low level. In this case, HH, VPP indicate the high voltage.

Figure 31:
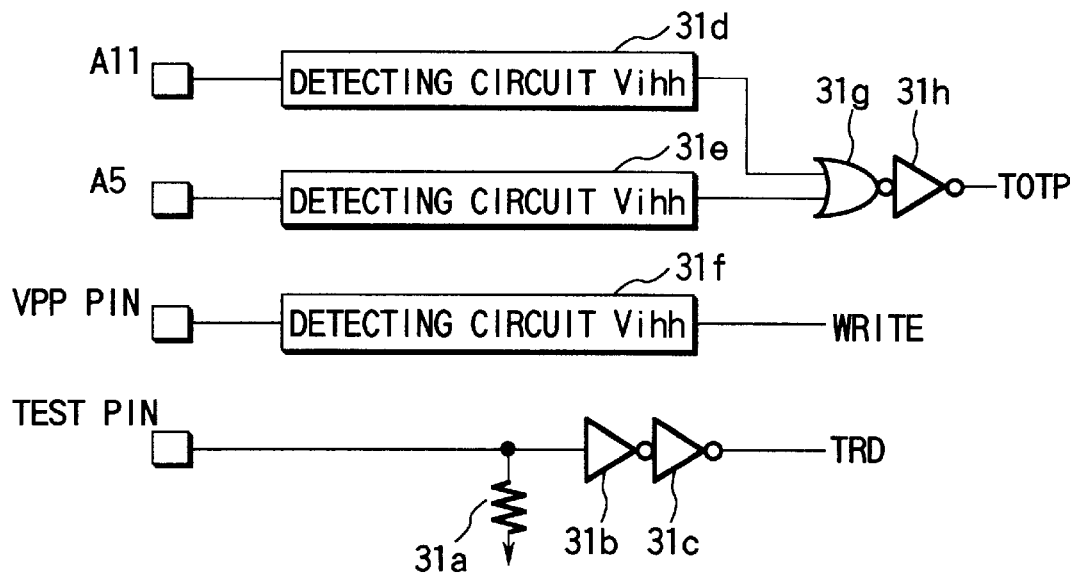
FIG. 31 is a circuit diagram showing a write mode detecting circuit.

FIG. 31 shows a write mode detecting circuit. The address pins A11, A5 and VPP pin are connected to high voltage (Vihh) detecting circuits 31d to 31f. The output terminals of the high voltage detecting circuits 31d, 31e are connected to a NOR gate 31g and the output terminal of the NOR gate 31g is connected to an inverter 31h. When the user rewrites data, a high voltage is applied to the address pin A11 or A5. Then, an output terminal of one of the high voltage detecting circuits 31d and 31e is set to the high level potential and the signal TOTP is output via the NOR gate 31g and inverter 31h.

The TEST pin is normally grounded via a resistor 31a. When the defective cell is compensated for, a voltage of high level (VDD) is applied to the TEST pin. Then, the signal TRD is output via inverters 31b, 31c.

The high voltage VPP is applied to the VPP pin at the write time. Then, a signal WRITE of high level is output from the output terminal of the high voltage detecting circuit 31f.

Figure 32:
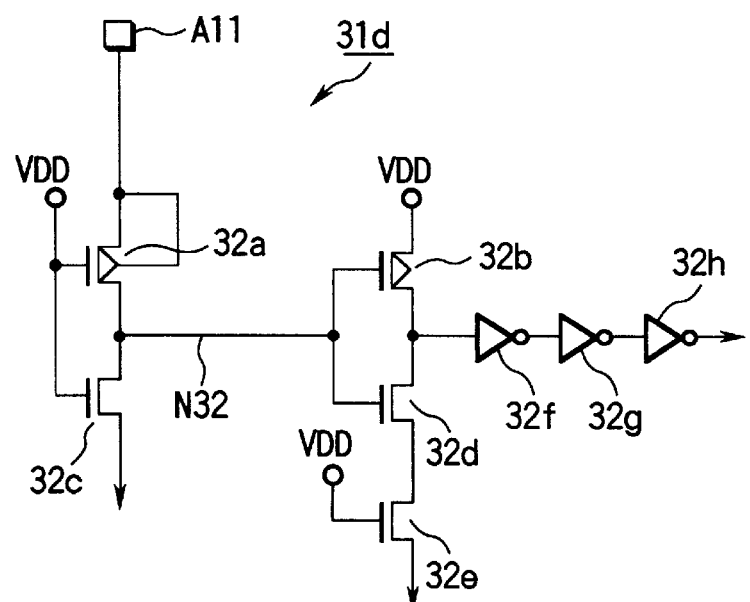
FIG. 32 is a circuit diagram showing a high voltage detecting circuit shown in FIG. 31.

FIG. 32 shows the high voltage detecting circuit 31d. The other high voltage detecting circuits 31e, 31f have substantially the same construction. The circuit includes P-channel MOS transistors 32a, 32b and N-channel MOS transistors 32c, 32d, 32e which construct an inverter, and inverters 32f, 32g, 32h. The source and back gate of the transistor 32a are connected to the address pin A11. The power source voltage VDD is applied to the gates of the transistors 32a, 32c, the source of the transistor 32b, and the gate of the transistor 32e.

With the above construction, when the potential of the address pin A11 is set at the low level, the potential of a connection node N32 of the transistors 32a and 32c is set at the low level. In this state, if VPP which is higher than the power source voltage VDD is applied to the address pad A11, the potential of the node N32 is set to the high level, thereby causing a signal of high level (VDD) to be output from the output terminal of the inverter 32h.

Figure 33:
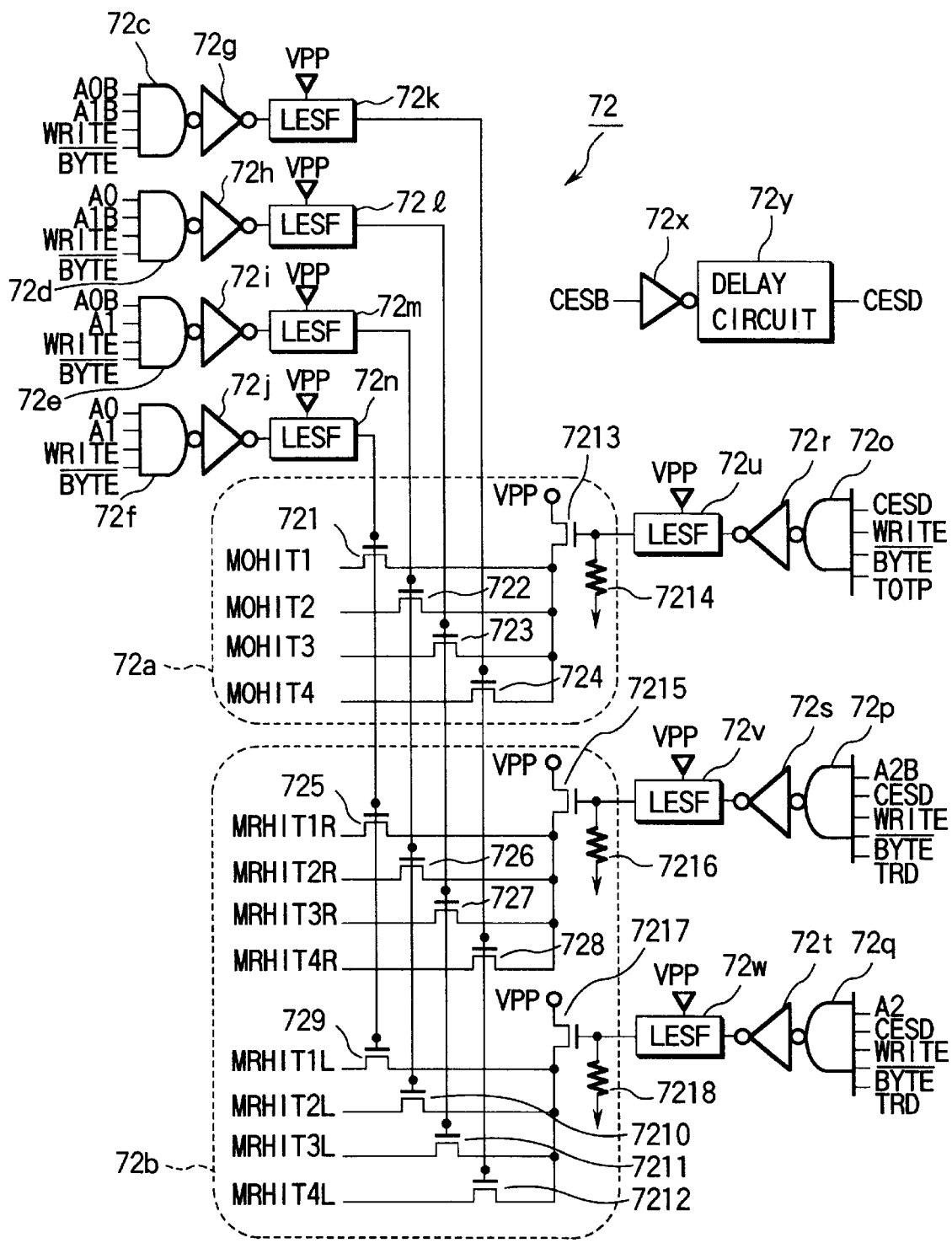
FIG. 33 is a circuit diagram showing a writing load circuit shown in FIG. 16.

FIG. 33 shows the writing load circuit 72. The circuit 72 includes an OTP address writing load circuit 72a and an R/D address writing load circuit 72b. The address signals A0, A1, inverted signals A0B, A1B thereof, signal WRITE, and signal BYTE are selectively supplied to NAND gates 72c to 72f. The output terminals of the NAND gates 72c to 72f connected to the input terminals of level shift circuits 72k to 72n via inverters 72g to 72j, respectively. Each of the level shift circuits 72k to 72n converts a signal of VDD level to a signal of VPP level and is substantially the same as the circuit shown in FIG. 28.

The output terminals of the level shift circuits 72k to 72n are connected to the gates of transistors 721, 722, 723, 724 constructing the OTP address writing load circuit 72a and the gates of transistors 725, 726, 727, 728, 729, 7210, 7211, 7212. The current paths of the transistors 721 to 724 are connected at one end to the drain lines MOHIT1 to MOHIT4 of the OTP address storing PROM cell 70, respectively, and the other ends of the current paths thereof are connected to the high potential VPP via a transistor 7213. The gate of the transistor 7213 is grounded via a resistor 7214.

The current paths of the transistors 725 to 728 are connected at one end to the drain lines MRHIT1R to MRHIT4R of the R/D address storing PROM cell 71, respectively, and the other ends of the current paths thereof are connected to the high potential VPP via a transistor 7215. The gate of the transistor 7215 is grounded via a resistor 7216.

The current paths of the transistors 729, 7210 to 7212 are connected at one end to the drain lines MRHIT1L to MRHIT4L of the R/D address storing PROM cell 71, respectively, and the other ends of the current paths thereof are connected to the high potential VPP via a transistor 7217. The gate of the transistor 7217 is grounded via a resistor 7218.

The signal CESB is supplied to a delay circuit 72y via an inverter 72x. The delay circuit 72y delays the rise of an inverted signal of the signal CESB by a preset period of time and outputs a signal CESD. The signal CESD, signal WRITE, signal BYTE, address signal bit A2, inverted signal A2B thereof, signal TOTP, and signal TRD are selectively supplied to NAND gates 72o, 72p, 72q. The output terminals of the NAND gates 72o. 72p, 72q are respectively connected to inverters 72r, 72s, 72t. The output terminals of the inverters 72r, 72s, 72t are connected to the input terminals of level shift circuits 72u, 72v, 72w. The level shift circuits 72u to 72w have substantially the same construction as the level shift circuits 72k to 72n. The output terminals of the level shift circuits 72u to 72w are respectively connected to the gates of the transistors 7213, 7215, 7217.

Figure 34:
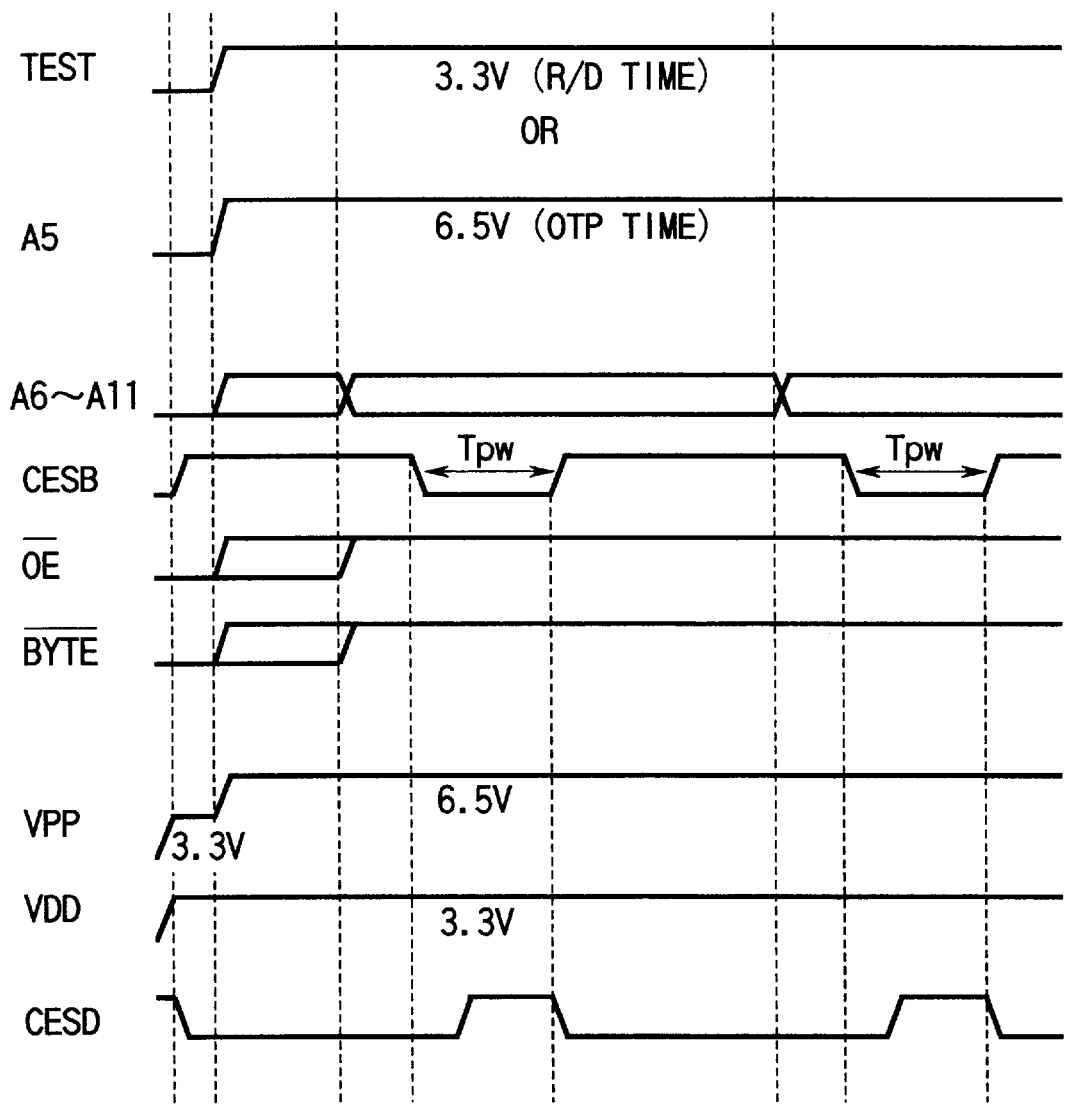
FIG. 34 is a timing chart for illustrating the address writing operation.

With the above construction, the operation for writing an address into the OTP address storing PROM cell 70 and R/D address storing PROM cell 71 is explained. FIG. 34 shows various signals at the address writing time.

In this case, the signal CESB shown in FIG. 26 is set in the active state when it is set at the low level and is set in the standby state when it is set at the high level at the readout time and is set in the write and verify state when it is set at the low level in the test mode. The output enable signal /OE shown in FIG. 16 is set in the data output state when it is set at the low level.

In the MROMs 51, 52, since the address signals A0 to A5 are treated as one unit as described before, the address storing cell and OTP, R/D pre-decoder 69 are only required to decode the address signals A6 to A11. Therefore, as shown in FIG. 30, four word lines are specified in the case of user mode (OTP) and eight word lines are specified in the case of defective cell replacing mode (R/D) by use of the address pins A0 to A5 which are not used. The defective cell replacing mode and the user mode are distinguished from each other according to the potential of the TEST pin and the potential of the address pin A11.

As described before, the OTP, R/D pre-decoder 69 has a level shift circuit. Therefore, the OTP, R/D pre-decoder 69 outputs a high voltage to the pre-decoder line according to an input address signal. At this time, the writing load circuit 72 shown in FIG. 33 selects one of the drain lines MOHIT1 to MOHIT4, MRHIT1R to MRHIT4R, and MRHIT1L to MRHIT4L of the OTP address storing PROM cell 70 or R/D address storing PROM cell 71 according to the address signals A0 to A2 and signals TOTP, TRD, WRITE, CESD, and applies a high voltage to the selected drain line. Therefore, data is written into only a cell whose drain and gate are both applied with the high voltage and the threshold voltage of the cell is raised.

The drain lines are connected to the address detecting circuits 73, 74, but since the potentials of the gates of the transistors 73a to 73d, 74a to 74h shown in FIG. 22 are set at the ground potential VSS, the high voltage will not be applied to the address detecting circuits 73, 74.

Figure 35:
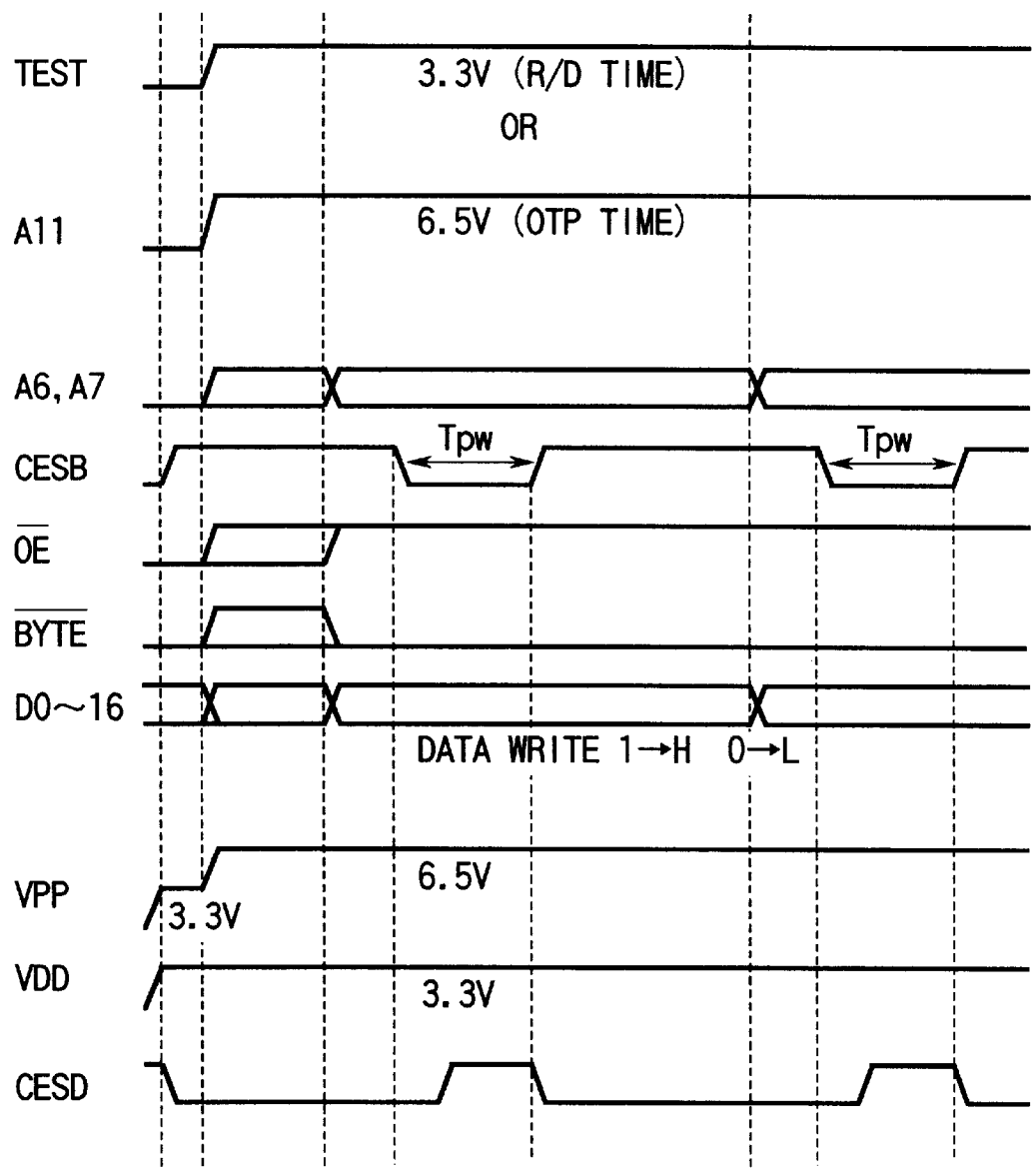
FIG. 35 is a timing chart for illustrating the data writing operation.

Next, the data writing operation is explained. FIG. 35 shows signals at various portions at the data writing time. The data writing operation is started by setting the signal CESB to the low level. Since the address signal bits A0 to A5 are treated as one unit, data can be decoded only by use of the address signal in either the user mode or the defective cell replacing mode if a corresponding word line is detected. Therefore, as shown in FIG. 30, four word lines are specified by use of the address pins A6 and A7 which are not used in each mode. In the case of defective cell replacing mode, each of the two R/D PROM cell arrays 63, 64 has four word lines in each of the right and left sections. However, at the data writing time, since data is simultaneously written into the right and left sections, it is sufficient if four word lines can be selected. If only one of the right and left sections is used, data "0" is written into the PROM cell array on the section which is not used.

In this embodiment, if the address signals A6, A7 are input to the data writing decoder 84, the signals SBAK1 to SBAK4 are output from the data writing decoder 84 and supplied to the R/D row decoders 65, 66. The R/D decoders 65, 66 select the word lines of the OTP PROM cell arrays 61, 62 or the R/D PROM cell arrays 63, 64 according to the received signals. The bit lines of the OTP PROM cell arrays 61, 62 or the R/D PROM cell arrays 63, 64 are selected by the R/D column decoders 67, 68 according to the address signals A0 to A5. The drain of a PROM cell thus selected is supplied with data supplied from the pad 82 shown in FIG. 16 via the data input circuit 83, R/D sense amplifier writing loads 77, 78, and R/D column decoders 67, 68 and data is written into the selected PROM cell.

As described above, since the word lines of the OTP PROM cell arrays 61, 62 or the R/D PROM cell arrays 63, 64 are directly selected by use of the data writing decoder 84, it is not necessary to operate the address detecting circuits 73, 74. Therefore, all of the outputs of the OTP, R/D pre-decoder 69 can be set to the low level and data can be written even if the high voltage is applied to the VPP pin.

Figure 36:
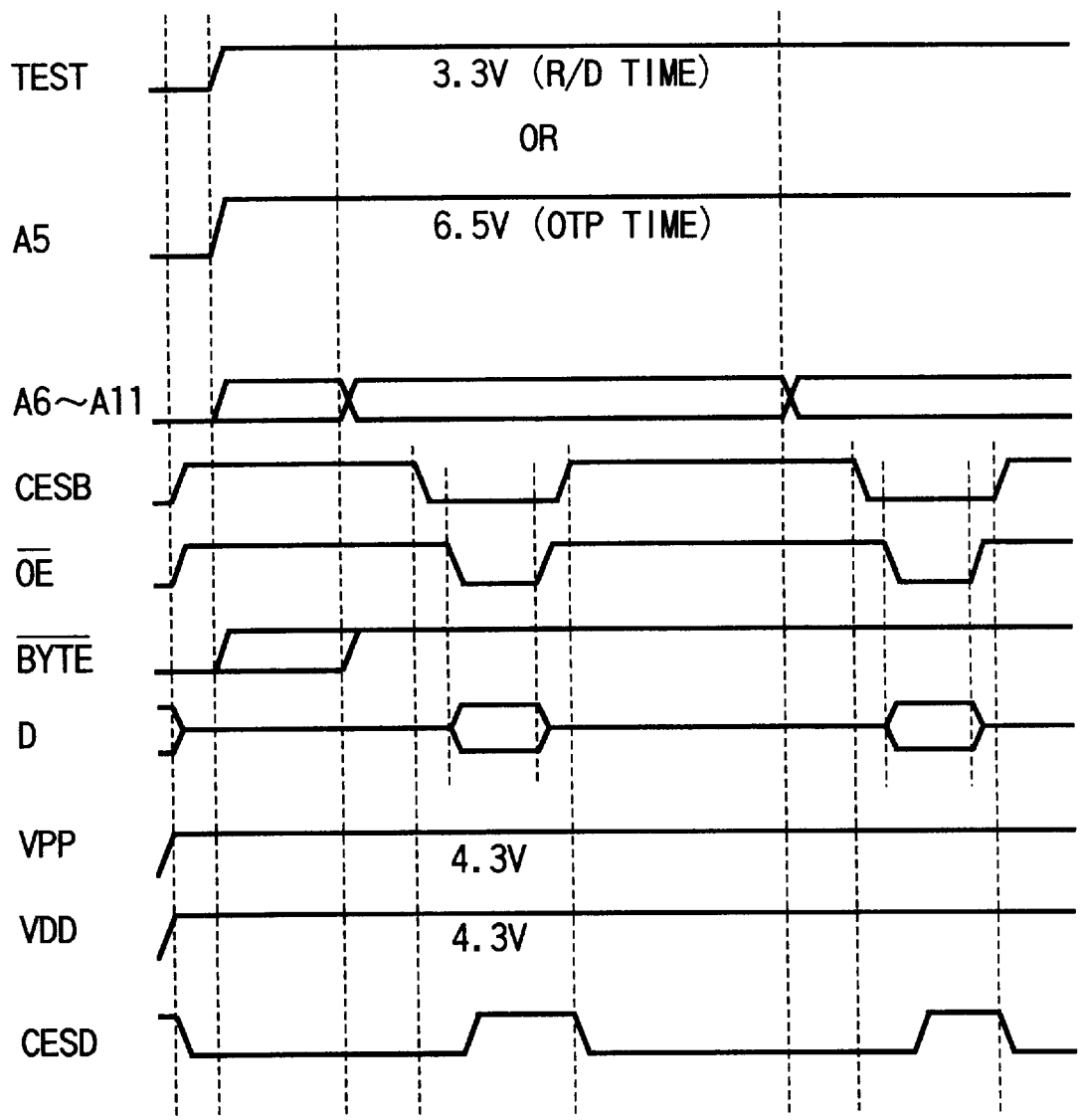
FIG. 36 is a timing chart for illustrating the address verifying operation.

Next, the address verify operation is explained. FIG. 36 shows signals at various portions at the address verify time.

If an address is correctly written in the OTP address storing PROM cell 70 or in the R/D address storing PROM cell 71 and when the address is input from the exterior, signals OTP1 to OTP4 are output from the OTP priority setting circuit 75 and signals SPMODR, SPMODL are output from the R/D enable circuit 76. At the address verify time, whether the address is correctly written or not is checked by extracting the signals OTP1 to OTP4 and signals SPMODR, SPMODL to the exterior. For this purpose, a circuit (not shown) for outputting the signals OTP1 to OTP4 to the exterior is connected to the output terminal of the OTP priority setting circuit 75 and a circuit (not shown) for outputting the signals SPMODR, SPMODL to the exterior is connected to the output terminal of the R/D enable circuit 76.

With the above construction, at the address verify time, the address detecting circuits 73, 74 are operated in the same manner as in the normal readout operation, and as shown in FIG. 30, only the address signal bits A6 to A11 are input. If the address is correctly written, a signal D corresponding to the signals OTP1 to OTP4 and signals SPMODR, SPMODL is output according to an output enable signal /OE. The high potential VPP at the verify time is set to 4.3V.

Figure 37:
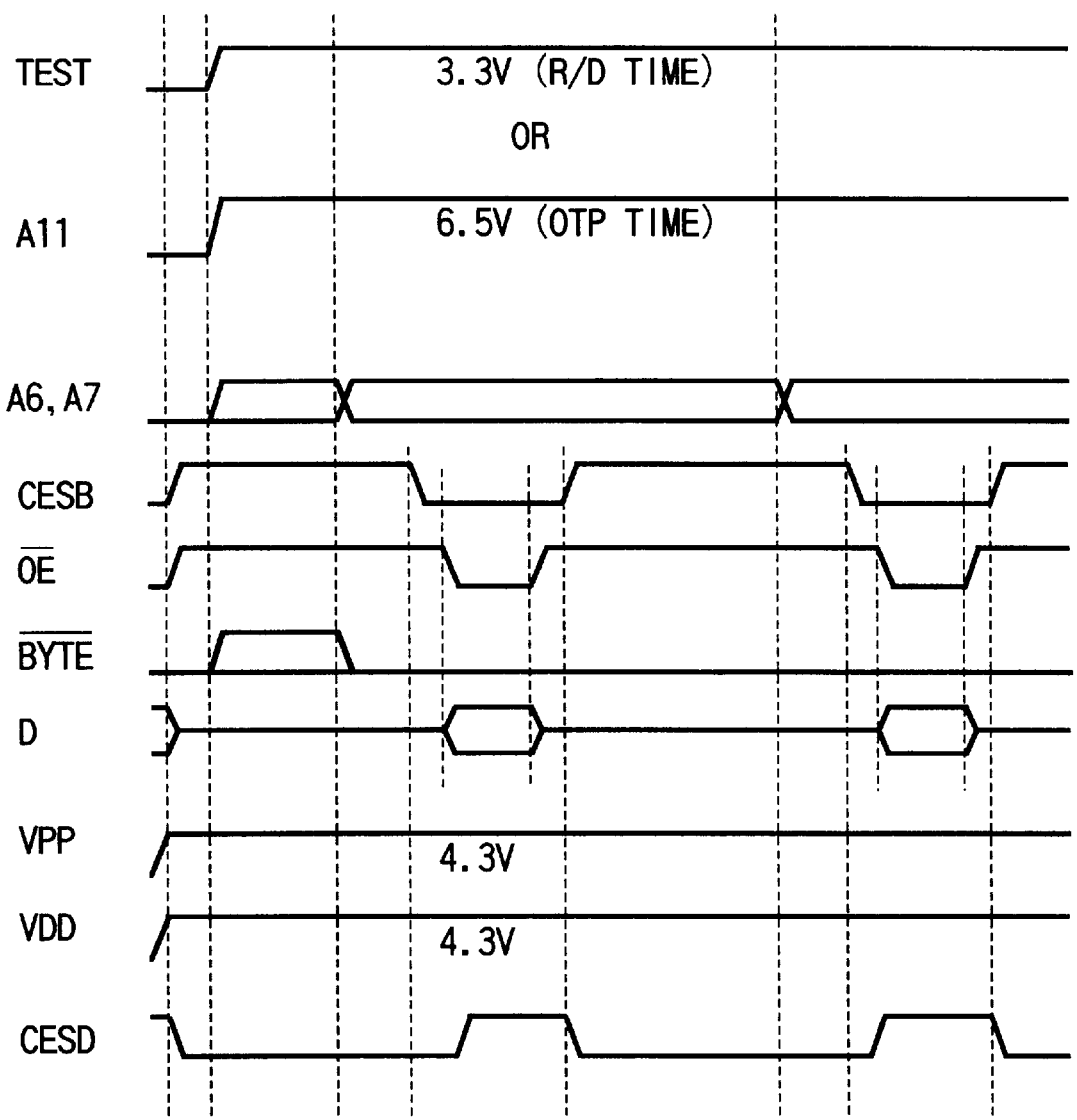
FIG. 37 is a timing chart for illustrating the data verifying operation.

Next, the data verify operation is explained. FIG. 37 shows signals at various portions at the data verify time.

The data verify operation may be effected in the same manner as in the normal data readout operation, but if a sequence shown in FIG. 29 is used, there occurs a possibility that the address is erroneously written. Therefore, like the data writing operation described before, an address signal is supplied to the data writing decoder 84 from the exterior so as to select the word line of the OTP PROM cell arrays 61, 62 or the R/D PROM cell arrays 63, 64 via the data writing decoder 84, R/D row decoders 65, 66. The bit line selection is effected by use of the R/D column decoder. Data thus read out is supplied to the switching circuits 79, 80 via the R/D sense amplifier 77, 78. At this time, the signals SPMODR, SPMODL are forcedly set to the high level and an output signal of the R/D sense amplifier 77, 78 is selected. An output signal of the switching circuit is output via the output buffer 81 and pad 82.

According to the fourth embodiment described above, since a defective cell occurring in the manufacturing process can be compensated for and the user can rewrite data, bugs of the user program can be corrected. Therefore, the manufacturing yield of the semiconductor memory device can be enhanced.

When data is written into the OTP PROM cell array or R/D PROM cell array and if an address for selecting a cell in the OTP PROM cell array or R/D PROM cell array is input, the internal circuit must detect the address in the OTP, R/D pre-decoder in the same manner as the readout operation. The OTP, R/D pre-decoder uses the high voltage for writing the address. Therefore, when the OTP, R/D pre-decoder is operated at the data writing time, the high voltage system in the OTP, R/D pre-decoder section must be separated from the high voltage system of the data section and the circuit construction becomes complicated. However, in the fourth embodiment, the data writing decoder is provided to permit a cell group of the OTP PROM cell array or the R/D PROM cell array to be selected without operating the OTP, R/D pre-decoder at the data writing time. Therefore, the circuit construction can be made simple.

If data is written into the OTP PROM cell array or the R/D PROM cell array, the address verify operation is effected after the address is written, and then, data is written. In this case, it is required to set Vpp to 6.5V at the address writing time, lower Vpp to 4.3V at the verify time, and raise Vpp to 6.5V again at the data writing time. Since it takes a long time to raise Vpp, it will take a long time to effect the data writing operation in the case of the above sequence. On the other hand, in the fourth embodiment, data is written after the address is written, and then, the address verify operation and the data verify operation are effected. Thus, since it is not necessary to lower or raise Vpp between the address writing process and the data writing process, the data writing time can be reduced.

Next, a fifth embodiment of this invention is explained. The fifth embodiment is obtained by adding means for compensating for defective cells present in the column direction to the fourth embodiment. The defective cells present in the column direction are compensated for in the block unit.

Figure 38:
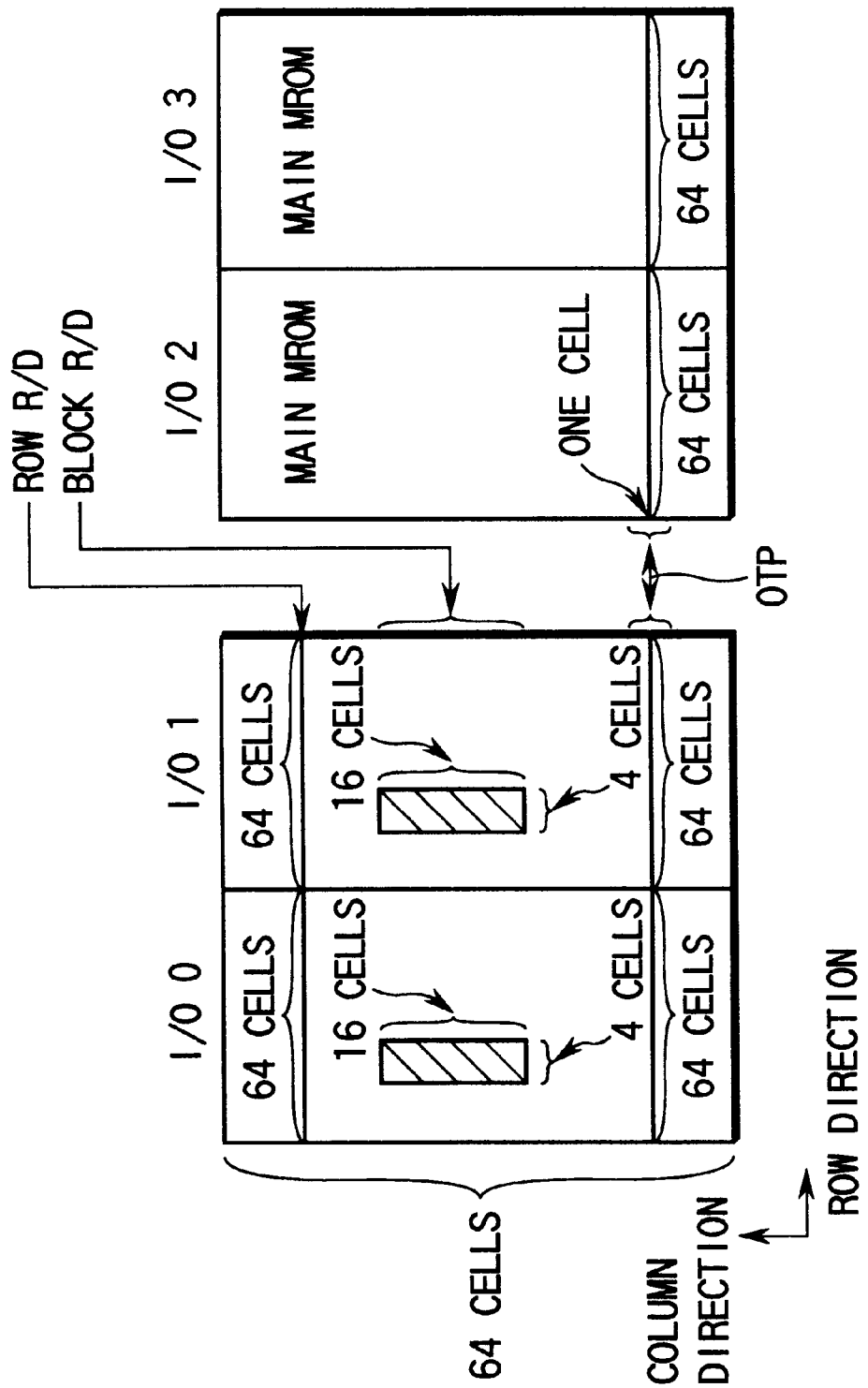
FIG. 38 is a diagram for illustrating the concept of a fifth embodiment of this invention.

FIG. 38 shows the replacement unit of cells in the row R/D, block R/D and OTP. Compensation for the defective cell or cells in the row direction covers one cell in the column direction, 64 cells in the row direction and 2 I/O sections, and compensation for the defective cell or cells in the block unit covers 16 cells in the column direction, 4 cells in the row direction and 2 I/O sections. That is, four cells in the row direction indicate the bank shown in FIG. 19 and one block is constructed by four banks continuously arranged in the column direction. Four cells in the row direction are selected by the address signals A0 and A5, for example, and 16 cells in the column direction are selected by the address signals A6 to A9. The OTP covers one cell in the column direction, 64 cells in the row direction and 4 I/O sections.

Figure 39:
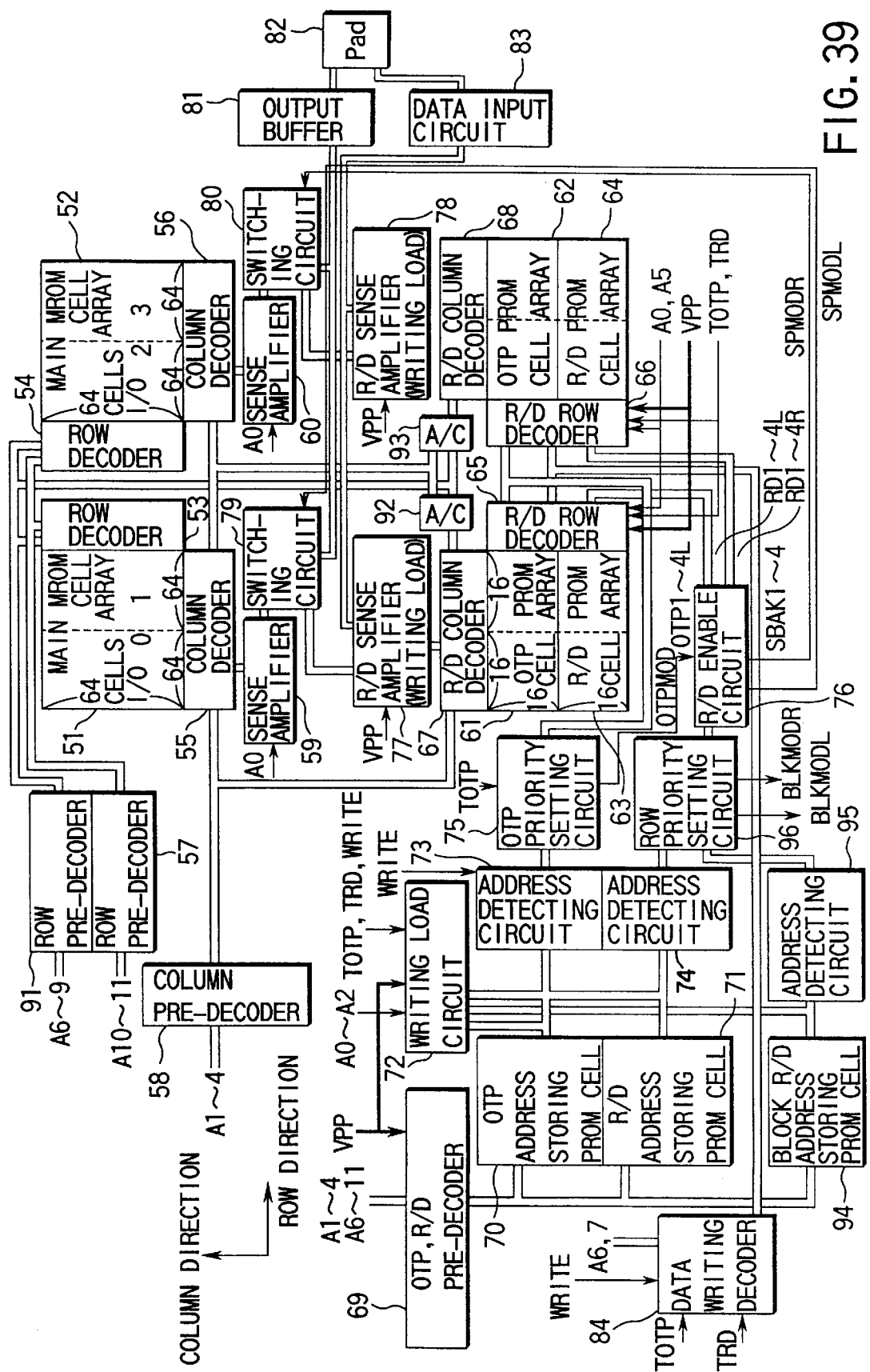
FIG. 39 is a construction diagram showing the fifth embodiment of this invention.
Figure 40:
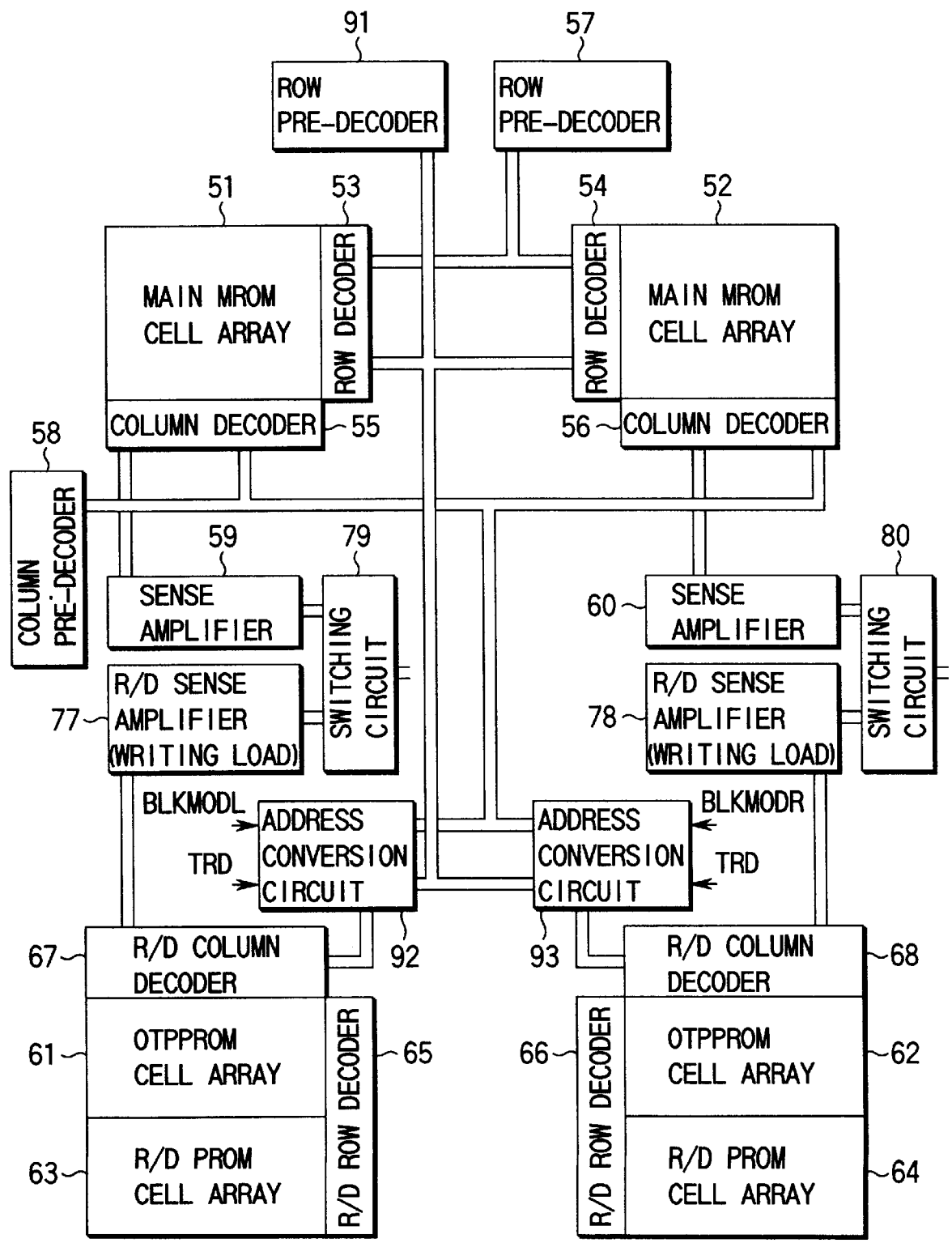
FIG. 40 is a construction diagram showing an enlarged main portion in FIG. 39.

FIG. 39 shows the construction of the fifth embodiment obtained by modifying the construction of FIG. 16, and FIG. 40 shows the main portion in FIG. 39. In FIGS. 39 and 40, portions which are the same as those of FIG. 16 are denoted by the same reference numerals and only different portions are explained.

In this embodiment, a row pre-decoder 91 is further provided. The row pre-decoder 91 decodes the address signals A0 to A6 and the row pre-decoder 57 decodes the address signals A10 and A11. A signal output from the row pre-decoder 91 is supplied to the row decoders 53, 54 and address conversion circuits (A/C) 92, 93. The address conversion circuits 92, 93 are supplied with an output signal from the column pre-decoder 58 and signals BLKMODL, BLKMODR, TRD which will be described later. The address conversion circuit 92 is connected to the R/D column decoder 67 and the address conversion circuit 93 is connected to the R/D column decoder 68. The address conversion circuits 92 and 93 respectively supply a decode signal of the column pre-decoder 58 which is the same as that of the main MROM to the R/D column decoders 67 and 68 in the case of row R/D and OTP. In the case of block R/D, the signals BLKMODL, BLKMODR are set to the high level. Then, the address conversion circuits 92 and 93 respectively supply signals WSG1 to WSG4 and signals WWL1 to WWL4 output from the row pre-decoder 91 to the R/D column decoders 67 and 68.

The OPT, R/D pre-decoder 69 is supplied with the address signal bits A1 to A4. A decode signal of the OPT, R/D pre-decoder 69 is supplied to a block R/D address storing PROM cell 94. The block R/D address storing PROM cell 94 stores a block R/D address. The block R/D address storing PROM cell 94 is connected to the writing load circuit 72 and address detecting circuit 95. An output signal of the address detecting circuit 95 is supplied together with an output signal of the address detecting circuit 74 to a row priority setting circuit 96. The row priority setting circuit 96 sets the block R/D into the non-selected state and selects the row R/D when the R/D address storing PROM cell 71 (row R/D) and the block R/D address storing PROM cell 94 (block R/D) are both hit, and the output terminal thereof is connected to the R/D enable circuit 76.

Figure 41:
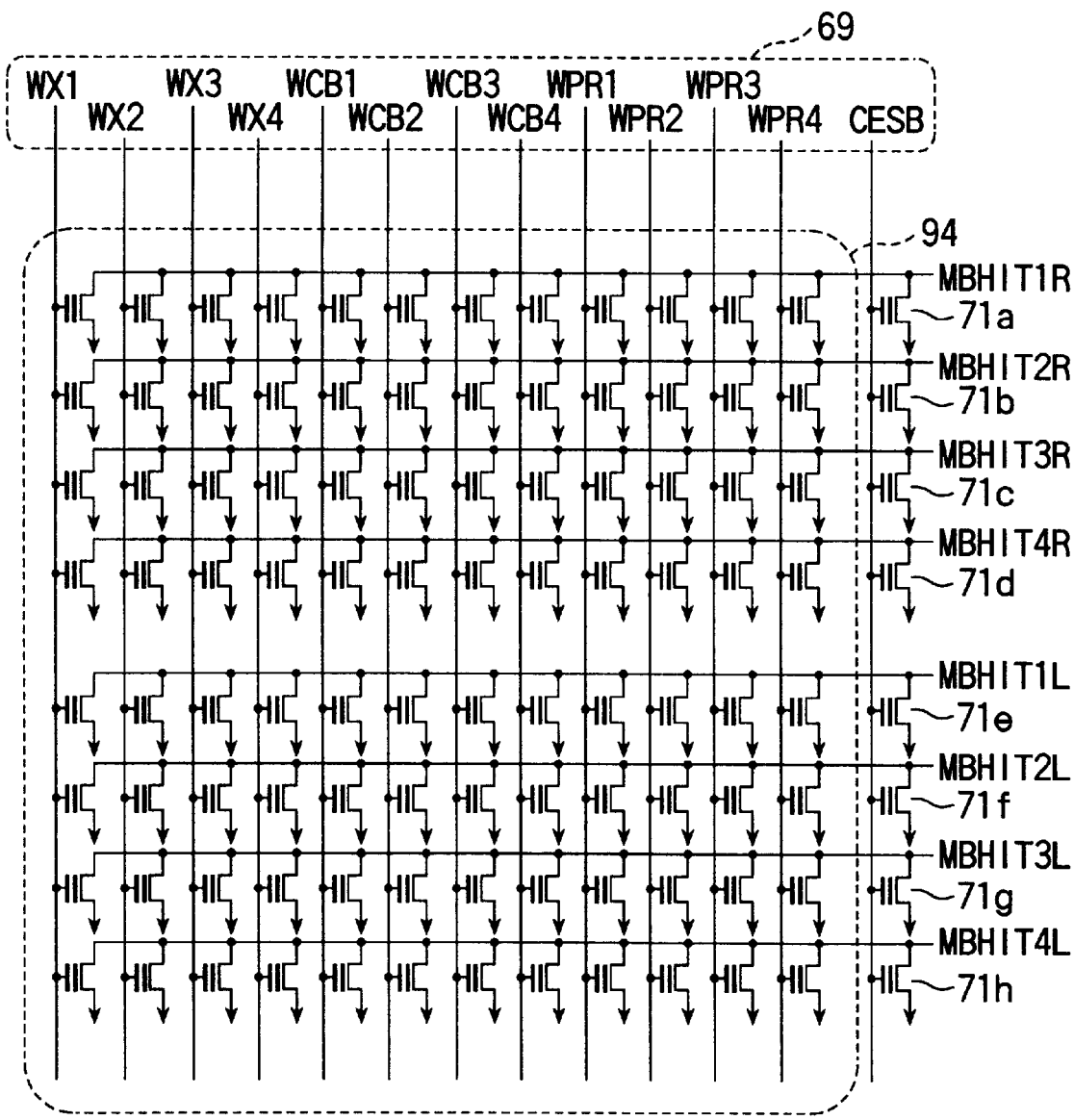
FIG. 41 is a circuit diagram showing a block R/D address storing PROM cell of FIG. 39.

FIG. 41 shows the construction of the block R/D address storing PROM cell 94. The block R/D address storing PROM cell 94 has substantially the same construction as that of the (row) R/D address storing PROM cell 71, for example, and portions which are the same as those of the PROM cell 71 are denoted by the same reference numerals. The block R/D address storing PROM cell 94 is supplied with signals WX1 to WX4, WCB1 to WCB4 output from the OTP, R/D pre-decoder 69 according to the address signals A1 to A4 and signals WPR1 to WPR4 output from the OPT, R/D predecoder 69. When the address is hit, the block R/D address storing PROM cell 94 outputs signals MBHIT1R to MBHIT4R, MBHIT1L to MBHIT4L.

Figure 42:
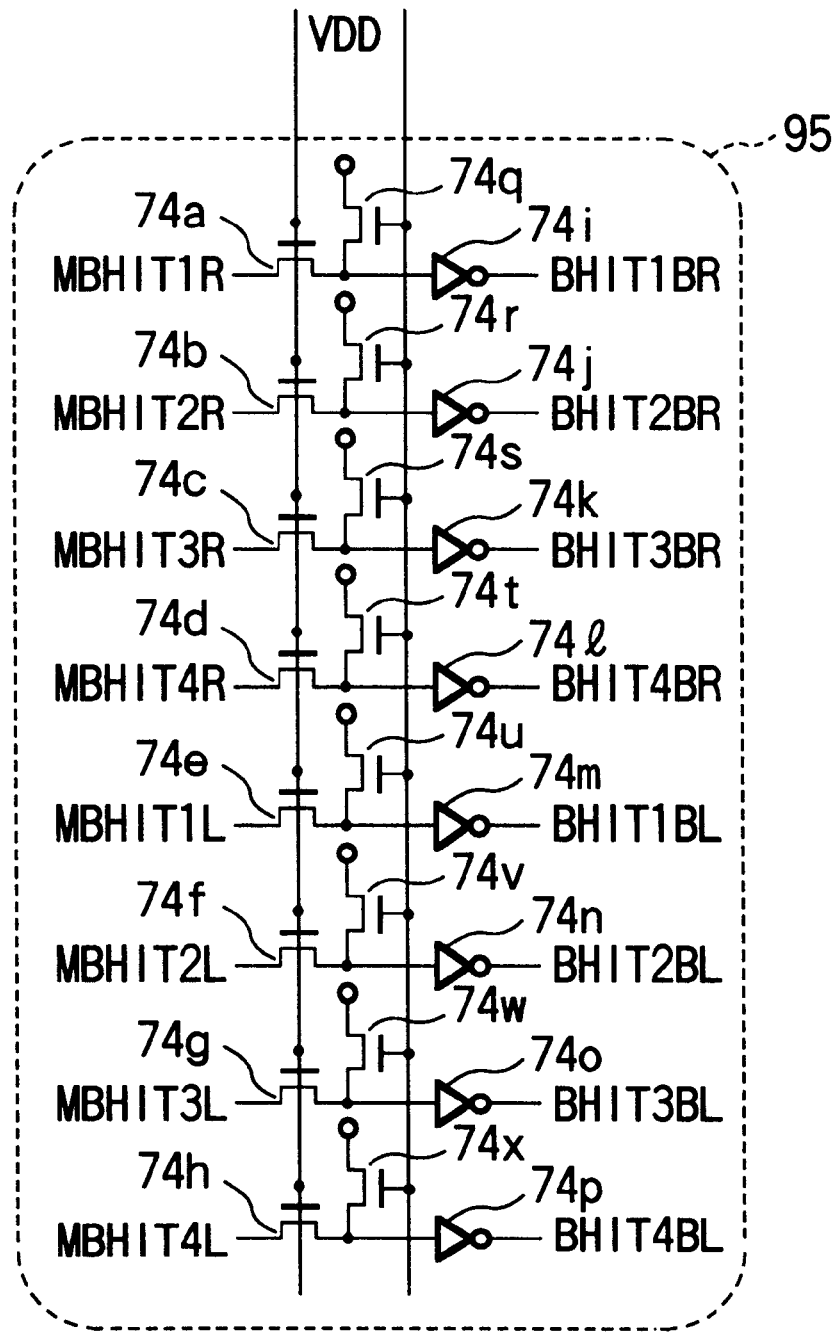
FIG. 42 is a circuit diagram showing an address detecting circuit of FIG. 39.

FIG. 42 shows the address detecting circuit 95. The construction of the address detecting circuit 95 is the same as that of the address detecting circuit 74 and only input and output signals thereof are different. That is, the input signals thereof are the signals MBHIT1R to MBHIT4R, MBHIT1L to MBHIT4L output from the block R/D address storing PROM cell 94 and the output signals thereof are the signals BHIT1BR to BHIT4BR, BHIT1BL to BHIT4BL.

Figure 43:
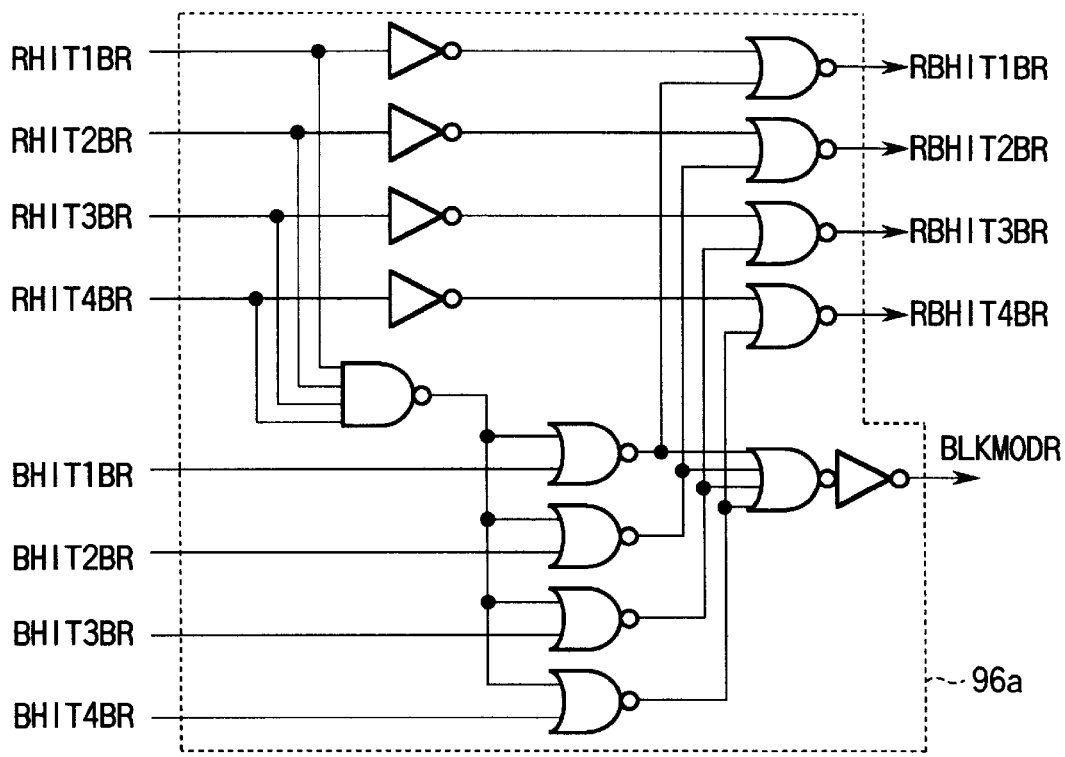
FIG. 43 is a circuit diagram showing part of a row priority setting circuit of FIG. 39.
Figure 44:
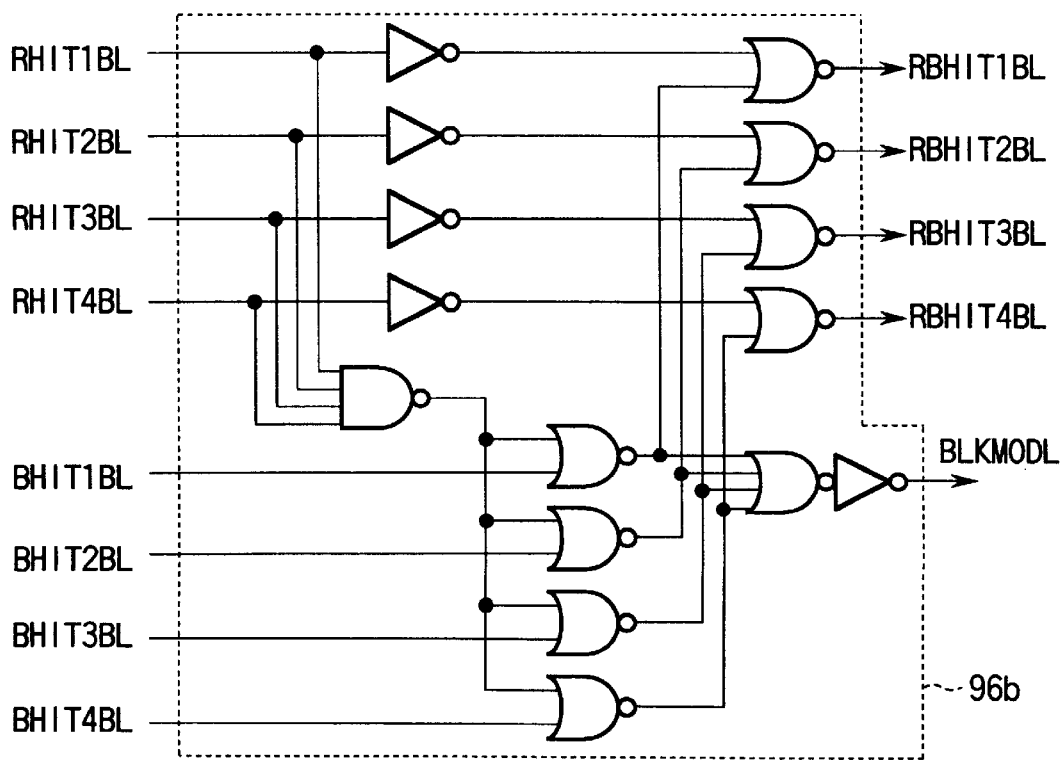
FIG. 44 is a circuit diagram showing the remaining part of the row priority setting circuit of FIG. 39.

FIGS. 43, 44 show the construction of the row priority setting circuit 96. As shown in FIG. 43, the output signals RHIT1BR to RHIT4BR of the address detecting circuit 74 and the output signals BHIT1BR to BHIT4BR of the address detecting circuit 95 are supplied to a logic circuit 96a. When the output signals RHIT1BR to RHIT4BR and the output signals BHIT1BR to BHIT4BR are both hit, the logic circuit 96a preferentially treats the output signals RHIT1BR to RHIT4BR and outputs the above signals as the signals RBHIT1BR to RBHIT4BR. When only the signals BHIT1BR to BHIT4BR are hit, the output signals BHIT1BR to BHIT4BR are output as the signals RBHIT1BR to RBHIT4BR. Further, when the signals BHIT1BR to BHIT4BR are hit, the signal BLKMODR is set to the high level.

As shown in FIG. 44, the output signals RHIT1BL to RHIT4BL of the address detecting circuit 74 and the output signals BHIT1BL to BHIT4BL of the address detecting circuit 95 are supplied to a logic circuit 96b. When the output signals RHIT1BL to RHIT4BL and the output signals BHIT1BL to BHIT4BL are both hit, the logic circuit 96b preferentially treats the output signals RHIT1BL to RHIT4BL and outputs the above signals as the signals RBHIT1BL to RBHIT4BL. When only the signals BHIT1BL to BHIT4BL are hit, the output signals BHIT1BL to BHIT4BL are output as the signals RBHIT1BL to RBHIT4BL. Further, when the signals BHIT1BL to BHIT4BL are hit, the signal BLKMODL is set to the low level.

Figure 45:
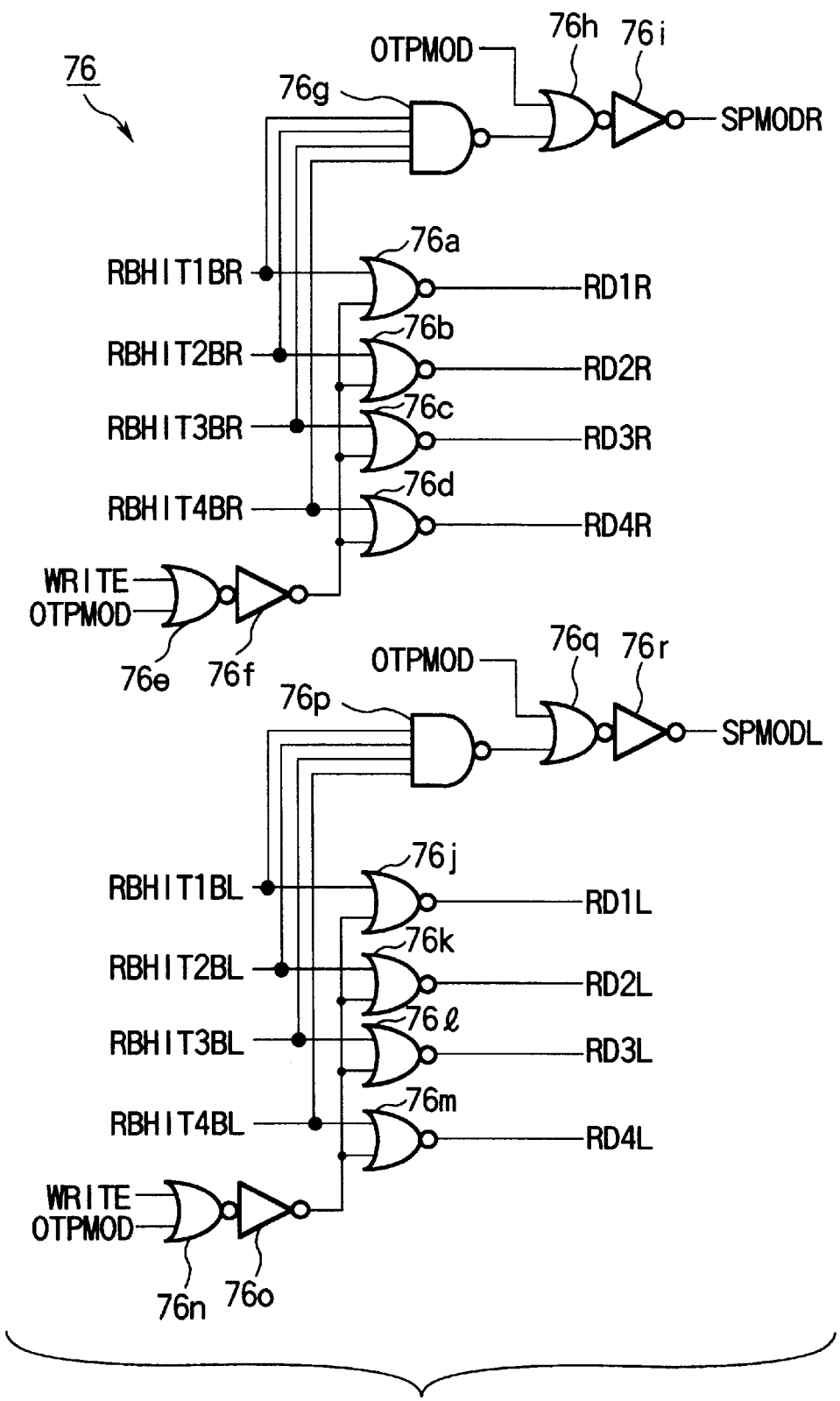
FIG. 45 is a circuit diagram showing an R/D enable circuit of FIG. 39.

FIG. 45 shows the construction of the R/D enable circuit 76. The R/D enable circuit 76 is similar to that of FIG. 25 except that only the reference symbols of the input signals thereof are changed to signals RBHIT1BL to RBHIT4BL.

Figure 46:
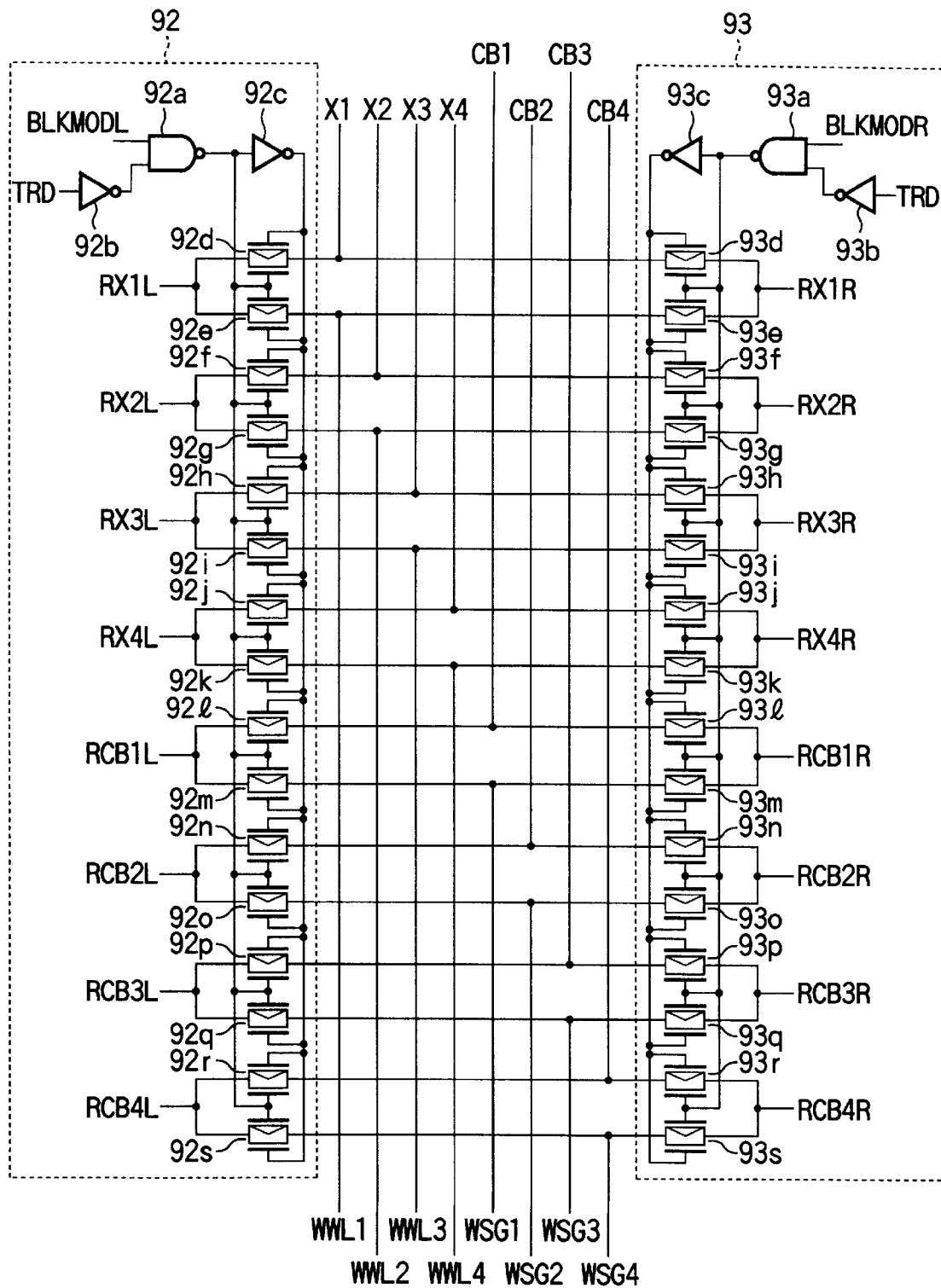
FIG. 46 is a circuit diagram showing an address conversion circuit of FIGS. 39 and 40.

FIG. 46 shows the constructions of the address conversion circuits 92, 93. The address conversion circuit 92 includes a NAND circuit 92a, inverter circuits 92b, 92c, and a plurality of transfer gates 92d to 92s. The signal BLKMODL output from the row priority setting circuit 96 is supplied to one input terminal of the NAND gate 92a and the signal TRD is supplied to the other input terminal of the NAND gate 92a via the inverter circuit 92b. The output terminal of the NAND gate 92a is connected to the input terminal of an inverter circuit 92c. Every two of transfer gates 92d to 92s make a pair and the respective pairs of the transfer gates select signals x1 to x4, CB1 to CB4 output from the column pre-decoder 58 or signals WWL1 to WWL4, WSG1 to WSG4 output from the row predecoder 91 according to the input and output signals of the inverter 92c. The respective pairs of the transfer gates supply the selected signals as signals RX1L to RX4L and RCB1L to RCB4L to the R/D column decoder 67.

The address conversion circuit 93 has the same construction as the address conversion circuit 92 and includes a NAND circuit 93a, inverter circuits 93b, 93c, and a plurality of transfer gates 93d to 93s. The signal BLKMODR output from the row priority setting circuit 96 is supplied to one input terminal of the NAND gate 93a and the signal TRD is supplied to the other input terminal of the NAND gate 93a via the inverter circuit 93b. The output terminal of the NAND gate 93a is connected to the input terminal of an inverter circuit 93c. Every two of transfer gates 93d to 93s make a pair and the respective pairs of the transfer gates select the signals x1 to x4, CB1 to CB4 output from the column pre-decoder 58 or the signals WWL1 to WWL4, WSG1 to WSG4 output from the row predecoder 91 according to the input and output signals of the inverter 93c. The respective pairs of the transfer gates supply the selected signals as signals RX1R to RX4R and RCB1R to RCB4R to the R/D column decoder 68.

The operation of the above construction is explained.

Data Readout

If an address is supplied from the exterior, decode signals shown in FIG. 47 are output from the OTP, R/D pre-decoder 69 of FIG. 39 and the signals are supplied to the OTP address storing PROM cell 70, R/D address storing PROM cell 71 and block R/D address storing PROM cell 94. The block R/D address storing PROM cell 94 is supplied with signals WX1 to WX4, WCB1 to WCB4 determined by the address signals A1 to A4 and signals WPR1 to WPR4 separated for every 16 cells among the 64 cells in the column direction. In the block R/D address storing PROM cell 94, if the above signals coincide with an address stored in the PROM cell, one of the output signals MBHIT1R to MBHIT4R, MBHIT1L to MBHIT4L is set to the high level. The signal supplied to the address detecting circuit. Thus, one of the output signals BHIT1BR to BHIT4BR, BHIT1BL to BHIT4BL from the address detecting circuit 95 is set to the low level. The signal is supplied to the row priority setting circuit 96. The row priority setting circuit 96 sets the block R/D into the non-selected state and selects the row R/D when both of the row R/D and block R/D are hit. That is, it outputs an output signal of the address detecting circuit 74. When the block R/D is hit, the signals BLKMODR, BLKMODL output from the row priority setting circuit 96 are set to the high level. The R/D enable circuit 76 generates a signal for selecting one of the rows of the R/D PROM cell arrays 63, 64 according to a signal supplied from the row priority setting circuit 96. The generated signal is supplied to the R/D row decoders 65, 66. At this time, since the signals BLKMODR, BLKMODL are set at the high level, the address conversion circuits 92, 93 select the signals WWL1 to WWL4, WSG1 to WSG4 of the row pre-decoder 91 and supply the selected signals to the R/D column decoders 67, 68.

By the above operation, one cell for each I/O section is selected in the R/D PROM cell arrays 63, 64. In this case, if there are four or less defective rows or blocks in the I/O0 and the I/O1 of the MROM51, they can be saved by the R/D PROM cell array 63. Similarly, if there are four or less defective rows or blocks in the I/O2 and the I/O3 of the MROM52, they can be saved by the R/D PROM cell array 64.

Address Writing, Address Verify

The operation of writing an address into the block R/D address storing PROM cell 94 and the operation of verifying the written address are substantially the same as those of writing an address into the R/D address storing PROM cell 71 and verifying the written address. However, as shown in FIG. 41, since signals WX1 to WX4, WCB1 to WCB4 determined by the address signals A1 to A4 are required for the block R/D address storing PROM cell 94, it is necessary to supply an address as shown in FIG. 48 from the exterior. Further, the R/D address write and the block R/D address write can be discriminated by setting the address pin A5 at high or low level. Similarly, the R/D address verify and the block R/D address verify can be discriminated by setting the address pin A5 at high or low level.

Data Writing, Data Verify

The data writing and data verify operations may be selected by use of address signals A0, A5 to A9 which are not written in the address writing operation but it is necessary to newly create signals SBAK1 to SBAK4 for selecting four word lines. That is, the signals SBAK1 to SBAK4 are used for selecting word lines according to the address signals A6, A7. Therefore, in order to prevent the construction from becoming complicated, the data writing and verify operation is effected in the same manner as in the case of the row R/D. As shown in FIG. 48, an address is designated by the address signals A0 to A5 and the address conversion circuits 92, 93 select the signals x1 to x4, CB1 to CB4 selected according to the address signals A1 to A4 in the same manner as in the case of the row R/D. That is, in the address conversion circuits 92, 93 shown in FIG. 46, the signals BLKMODL, BLKMODR are both set at the low level, and the signal TRD is set to the high level if a high level signal is supplied to the TEST pin shown in FIG. 31. Thus, the transfer gates select the signals x1 to x4, CB1 to CB4.

Moreover, when, for example the block R/D is used in the I/O0 and the I/O1 of the MROM51 and the row R/D is used in the I/O2 and the I/O3 of the MROM52, data can be simultaneously written into the I/O0–I/O3 by selecting one of the signals SBAK1–SBAK4.

According to the fifth embodiment, defective cells present in the column direction of the main MROM can be compensated for by the block R/D. Further, the column address is changed in the case of the OTP, row R/D and the block R/D by the address conversion circuits 92, 93. Therefore, defective cells in the column direction can be compensated for without increasing the capacities of the R/D PROM cell arrays 63, 64.

The row priority setting circuit 96 preferentially treats the row R/D when both of the row R/D and the block R/D are hit. Therefore, multiple selection can be prevented.

The row priority setting circuit 96 preferentially treats the row R/D, but the row priority setting circuit 96 can be designed to preferentially treat the block R/D.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
   a mask ROM cell array;
   a first PROM cell array for storing at least part of an address corresponding to error data in said mask ROM cell array;
   a second PROM cell array for storing at least one data group (bank) corresponding to the address stored in said first PROM cell array, said data group being correct data for the error data present in said mask ROM cell array; and
   a data readout circuit for determining whether or not an address input from the exterior coincides with the address stored in said first PROM cell array and reading out at least data group corresponding to the coincident address from said second PROM cell array when the coincidence between the addresses is detected.

2. A semiconductor memory device according to claim 1, wherein said readout circuit selects a data group of the highest priority from at least one corresponding data group and reads out the data group when at least two addresses which coincide are stored in said first PROM cell array.

3. A semiconductor memory device according to claim 1, wherein said first and second PROM cell arrays are each constructed by a PROM having one polysilicon layer.

4. A semiconductor memory device according to claim 1, wherein data is written from the exterior into said first and second PROM cell arrays.

5. A semiconductor memory device according to claim 1, wherein said data readout circuit previously assigns priority levels to the data groups and writes a correction data into a data group which is not yet used and which is given priority higher than data stored in the data group when the data stored in the data group is rewritten.

6. A semiconductor memory device according to claim 1, wherein said readout circuit includes a plurality of disenable circuits corresponding to the data groups (banks), and data stored in the data group is rewritten, second correction data is written into a data group which is not yet used and the data group in which data before rewriting has been stored is set into a non-selected state by a corresponding one of said disenable circuits.

7. A semiconductor memory device according to claim 1, further comprising an automatic bank specifying circuit for selecting the data group which is not yet used.

8. A semiconductor memory device comprising:
   a mask ROM cell array;
   first readout means for reading out data stored in said mask ROM cell array;
   a first PROM cell array for storing part of an address corresponding to error data in said mask ROM cell array;
   a second PROM cell array for storing part of an address corresponding to the defective cell in said mask ROM cell array;
   a third PROM cell array for storing at least one data group corresponding to part of the address stored in said first PROM cell array;
   a fourth PROM cell array for storing at least one data group corresponding to part of the address stored in said second PROM cell array;
   first address detecting means for determining whether or not an address input from the exterior coincides with the address stored in said first PROM cell array;
   second address detecting means for determining whether or not an address input from the exterior coincides with the address stored in said second PROM cell array;

first signal generating means for outputting a signal used for selecting said fourth PROM cell array when said second address detecting means detects the address coincidence;

second signal generating means for outputting a signal used for selecting said third PROM cell array and setting said first signal generating means into a non-active state when said first address detecting means detects the address coincidence; and second readout means for reading out at least one corresponding data group from said third ROM cell array.

9. A semiconductor memory device according to claim 8, wherein said first to fourth PROM cell arrays are each constructed by a PROM having one polysilicon layer.

10. A semiconductor memory device according to claim 8, further comprising data writing means for receiving an address for specifying said third and fourth PROM cell arrays at the data writing time and outputting a signal for selecting said third and fourth cell arrays according to the received address.

11. A semiconductor memory device according to claim 8, further comprising switching means connected to said first and second readout means, for fetching data from one of said first and second readout means.

12. A semiconductor memory device according to claim 11, wherein said first signal generating means includes a circuit for generating a signal for causing said switching means to fetch data from said second readout means when a signal for selecting said fourth PROM cell array is output.

13. A semiconductor memory device comprising:

a mask ROM cell array;

first readout means for reading out data stored in said mask ROM cell array;

a first PROM cell array for storing part of an address in a row direction of a defective cell contained in said mask ROM cell array;

a second PROM cell array for storing part of an address in a column direction of the defective cell contained in said mask ROM cell array;

a third PROM cell array for storing at least one data group corresponding to part of the address stored in said first and second PROM cell arrays;

first address detecting means for determining whether or not an address input from the exterior coincides with the address stored in said first PROM cell array;

second address detecting means for determining whether or not an address input from the exterior coincides with the address stored in said second PROM cell array;

first selecting means for selecting an output signal of said first address detecting means when said first address detecting means detects the address coincidence and said second detecting means detects the address coincidence;

row selecting means for selecting a row of said third PROM cell array according to an output signal of said first selecting means;

column selecting means for selecting a column of said third PROM cell array;

second selecting means for supplying a column address to said column selecting means when said first selecting means selects an output signal of said first address detecting means and supplying a row address to said column selecting means when said first selecting means selects an output signal of said second address detecting means; and second readout means for reading out at least one corresponding data group from said third ROM cell array.

14. A semiconductor memory device according to claim 13, wherein said first to third PROM cell arrays are each constructed by a PROM having one polysilicon layer.

15. A semiconductor memory device according to claim 13, further comprising data writing means for receiving an address for specifying said third PROM cell array at the data writing time and outputting a signal for selecting said third cell array according to the received address.

16. A semiconductor memory device according to claim 13, further comprising switching means connected to said first and second readout means, for fetching data from one of said first and second readout means.

17. A semiconductor memory device according to claim 16, wherein said row selecting means includes a circuit for generating a signal for causing said switching means to fetch data from said second readout means when a signal for selecting said third PROM cell array is output.

18. A semiconductor memory device comprising:

a mask ROM cell array;

first readout means for reading out data stored in said mask ROM cell array;

a first PROM cell array for storing part of an address of error data contained in said mask ROM cell array;

a second PROM cell array for storing part of an address in a row direction of a defective cell contained in said mask ROM cell array;

a third PROM cell array for storing part of an address in a column direction of the defective cell contained in said mask ROM cell array;

a fourth PROM cell array for storing at least one data group corresponding to part of the address stored in said first PROM cell array;

a fifth PROM cell array for storing at least one data group corresponding to part of the address stored in said second and third PROM cell arrays;

first address detecting means for determining whether or not an address input from the exterior coincides with the address stored in said first PROM cell array;

second address detecting means for determining whether or not an address input from the exterior coincides with the address stored in said second PROM cell array;

third address detecting means for determining whether or not an address input from the exterior coincides with the address stored in said third PROM cell array;

first selecting means for selecting an output signal of said second address detecting means when said second address detecting means detects the address coincidence and said third detecting means detects the address coincidence, said first selecting means generating a specifying signal indicating that said third address detecting means detects the address coincidence;

first row selecting means for selecting a row of said fifth PROM cell array according to an output signal of said first selecting means;

second row selecting means for setting said first row selecting means into a non-active state and selecting a row of said fourth PROM cell array when said first address detecting means detects the address coincidence;

column selecting means for selecting a column of said fourth and fifth PROM cell arrays;

second selecting means for supplying a column address to said column selecting means when the specifying signal is not output from said first selecting means and supplying a row address to said column selecting means when the specifying signal is output from said first selecting means; and second readout means for reading out at least one corresponding data group from a selected one of said fourth and fifth ROM cell arrays.

19. A semiconductor memory device according to claim 18, wherein said first to fifth PROM cell arrays are each constructed by a PROM having one polysilicon layer.

20. A semiconductor memory device according to claim 18, further comprising data writing means for receiving an address for specifying said fourth and fifth PROM cell arrays at the data writing time and outputting a signal for selecting one of said fourth and fifth cell arrays according to the received address.

21. A semiconductor memory device comprising:

a mask ROM cell array;

a first data readout circuit for reading data from said mask ROM cell array in accordance with an address;

a first PROM cell array for storing at least part of an address corresponding to error data in said mask ROM cell array;

a second PROM cell array for storing at least one data group corresponding to part of the address stored in said first PROM cell array, said data group being correct data for the error data present in said mask ROM cell array; and a data readout circuit for determining whether or not an address input from the exterior coincides with the address stored in said first PROM cell array and reading out a newest data group corresponding to the coincident address from said second PROM cell array when a coincidence between the addresses is detected.

22. A semiconductor memory device comprising:

a mask ROM cell array;

a first PROM cell array for storing at least part of an address corresponding to error data in said mask ROM cell array;

a second PROM cell array for storing at least one data group (bank) corresponding to the address stored in said first PROM cell array, said data group being correct data for the error data present in said mask ROM cell; and a data readout circuit for determining whether or not an address input from the exterior coincides with the address stored in said first PROM cell array and reading out at least one data group corresponding to the coincident address from said second PROM cell array when the coincidence between the addresses is detected;

wherein at least one corresponding data group is selected and read out when at least two addresses which coincide are stored in said first PROM cell array.

23. A semiconductor memory device comprising:

a mask ROM cell array;

a first PROM cell array for storing at least part of an address corresponding to error data in said mask ROM cell array;

a second PROM cell array for storing at least one data group corresponding to the address stored in said first PROM cell array, said data group being correct data for the error data present in said mask ROM cell array; and a data readout circuit for determining whether or not an address input from the exterior coincides with the address stored in said first PROM cell array and reading out at least one data corresponding to the coincident address from said second PROM cell array when the coincidence between the addresses is detected.

* * * * *